United States Patent
Ranta

(10) Patent No.: US 10,382,031 B2
(45) Date of Patent: *Aug. 13, 2019

(54) METHOD AND APPARATUS FOR USE IN DIGITALLY TUNING A CAPACITOR IN AN INTEGRATED CIRCUIT DEVICE

(71) Applicant: pSemi Corporation, San Diego, CA (US)

(72) Inventor: Tero Tapio Ranta, San Diego, CA (US)

(73) Assignee: pSemi Corporation, San Diego, CA (US)

(*) Notice: Subject to any disclaimer, the term of this patent is extended or adjusted under 35 U.S.C. 154(b) by 328 days.

This patent is subject to a terminal disclaimer.

(21) Appl. No.: 15/279,302

(22) Filed: Sep. 28, 2016

(65) Prior Publication Data
US 2017/0040973 A1    Feb. 9, 2017

Related U.S. Application Data

(60) Continuation of application No. 14/638,917, filed on Mar. 4, 2015, now Pat. No. 9,667,227, which is a
(Continued)

(51) Int. Cl.
*H03K 17/16* (2006.01)
*H03M 1/10* (2006.01)
(Continued)

(52) U.S. Cl.
CPC .......... *H03K 17/162* (2013.01); *H01F 21/12* (2013.01); *H01G 4/002* (2013.01); *H01G 7/00* (2013.01);
(Continued)

(58) Field of Classification Search
CPC ........ H03H 11/28; H03H 7/0153; H03H 7/38; H01G 7/00; H01L 27/0629;
(Continued)

(56) References Cited

U.S. PATENT DOCUMENTS 4,306,203 A * 12/1981 Sasaki .................. H03H 19/002
327/42
5,012,123 A   4/1991 Ayasli et al.
(Continued)

FOREIGN PATENT DOCUMENTS

EP        2140494        6/2017
EP        2760136        5/2018
(Continued)

OTHER PUBLICATIONS

Puentes, Daniel Calrissian, Office Action received from the USPTO dated Nov. 22, 2017 for U.S. Appl. No. 15/442,491, 19 pgs.
(Continued)

*Primary Examiner* — Benny T Lee
*Assistant Examiner* — Hafizur Rahman
(74) *Attorney, Agent, or Firm* — Jaquez Land Greenhaus LLP; Alessandro Steinfl, Esq.

(57) ABSTRACT

A method and apparatus for use in a digitally tuning a capacitor in an integrated circuit device is described. A Digitally Tuned Capacitor DTC is described which facilitates digitally controlling capacitance applied between a first and second terminal. In some embodiments, the first terminal comprises an RF+ terminal and the second terminal comprises an RF− terminal. In accordance with some embodiments, the DTCs comprise a plurality of sub-circuits ordered in significance from least significant bit (LSB) to most significant bit (MSB) sub-circuits, wherein the plurality of significant bit sub-circuits are coupled together in parallel, and wherein each sub-circuit has a first node coupled to the first RF terminal, and a second node coupled to the second RF terminal. The DTCs further include an input means for receiving a digital control word, wherein the digital control word comprises bits that are similarly ordered in significance from an LSB to an MSB.

125 Claims, 34 Drawing Sheets

Related U.S. Application Data division of application No. 12/735,954, filed as application No. PCT/US2009/001358 on Mar. 2, 2009, now Pat. No. 9,024,700.

(60) Provisional application No. 61/067,634, filed on Feb. 28, 2008.

(51) Int. Cl.

| | |
|---|---|
| *H03K 17/687* | (2006.01) |
| *H01G 7/00* | (2006.01) |
| *H03H 7/38* | (2006.01) |
| *H01F 21/12* | (2006.01) |
| *H03H 7/01* | (2006.01) |
| *H03H 11/28* | (2006.01) |
| *H01L 23/522* | (2006.01) |
| *H01L 27/06* | (2006.01) |
| *H01L 27/12* | (2006.01) |
| *H01L 49/02* | (2006.01) |
| *H03J 3/20* | (2006.01) |
| *H01G 4/002* | (2006.01) |
| *H03K 17/10* | (2006.01) |
| *H03M 1/80* | (2006.01) |

(52) U.S. Cl.
CPC ...... *H01L 23/5223* (2013.01); *H01L 27/0629* (2013.01); *H01L 27/1203* (2013.01); *H01L 28/60* (2013.01); *H03H 7/0153* (2013.01); *H03H 7/38* (2013.01); *H03H 11/28* (2013.01); *H03J 3/20* (2013.01); *H03K 17/102* (2013.01); *H03K 17/687* (2013.01); *H03M 1/1061* (2013.01); *H03J 2200/10* (2013.01); *H03M 1/804* (2013.01)

(58) Field of Classification Search
CPC ..... H01L 27/1203; H03J 3/20; H03J 2200/10; H03K 17/162; H03K 17/687; H03M 1/1061; H03M 1/804
USPC .......................................................... 333/173
See application file for complete search history.

(56) References Cited

U.S. PATENT DOCUMENTS

| | | | |
|---|---|---|---|
| 5,170,129 A | | 12/1992 | Nobue |
| 5,332,997 A * | | 7/1994 | Dingwall ............. G09G 3/2011 341/136 |
| 5,880,921 A * | | 3/1999 | Tham ................ H01H 59/0009 333/262 |
| 6,356,135 B1 * | | 3/2002 | Rastegar .................. H03B 5/08 327/337 |
| 6,611,164 B2 * | | 8/2003 | Uno ......................... G06G 7/14 327/355 |
| 6,870,404 B1 | | 3/2005 | Maangat |
| 6,927,722 B2 * | | 8/2005 | Hong ...................... G06G 7/184 333/173 |
| 7,190,933 B2 | | 3/2007 | De Ruijter et al. |
| 7,310,215 B2 | | 12/2007 | Pasternak |
| 7,463,085 B2 * | | 12/2008 | Kim ...................... H03H 7/0153 327/552 |
| 7,764,140 B2 * | | 7/2010 | Nagarkatti ................ H03F 1/56 156/345.28 |
| 7,847,642 B2 | | 12/2010 | Pretl |
| 7,960,772 B2 | | 6/2011 | Englekirk |
| 9,496,849 B2 | | 11/2016 | Ranta et al. |
| 9,595,956 B2 | | 3/2017 | Englekirk |
| 9,667,227 B2 | | 5/2017 | Ranta |
| 9,806,694 B2 | | 10/2017 | Reedy et al. |
| 9,866,212 B2 | | 1/2018 | Englekirk |
| 10,050,616 B2 | | 8/2018 | Ranta et al. |
| 10,158,345 B2 | | 12/2018 | Reedy et al. |
| 2006/0077082 A1 | | 4/2006 | Shanks et al. |
| 2009/0039970 A1 * | | 2/2009 | Shen ........................ H03B 5/36 331/158 |
| 2009/0134949 A1 * | | 5/2009 | He ........................... H03H 7/40 333/17.3 |
| 2010/0219997 A1 * | | 9/2010 | Le Guillou ........... H03M 3/386 341/143 |
| 2011/0227666 A1 | | 9/2011 | Manssen et al. |
| 2015/0310995 A1 | | 10/2015 | Ranta |
| 2017/0026035 A1 | | 1/2017 | Englekirk |
| 2018/0159530 A1 | | 6/2018 | Englekirk |
| 2019/0007042 A1 | | 1/2019 | Ranta et al. |
| 2019/0123735 A1 | | 4/2019 | Reedy et al. |

FOREIGN PATENT DOCUMENTS

| | | | |
|---|---|---|---|
| EP | 3346611 | 7/2018 | |
| GB | 2425401 | 10/2006 | |
| WO | WO 2007008044 A1 * | 1/2007 | .......... H03M 1/1245 |

OTHER PUBLICATIONS

Ranta, et al., Response filed in the USPTO dated Jan. 23, 2018 for U.S. Appl. No. 15/442,491, 8 pgs.
Puentes, Daniel Calrissian, Final Office Action received from the USPTO dated Feb. 8, 2018 for U.S. Appl. No. 15/442,491, 22 pgs.
Itoh, et al., English translation of Office Action received from the JPO dated Aug. 28, 2018 for appln. No. 2017-102495, 2 pgs.
Brosa, Anna-Maria, Communication under Rule 71(3) EPC received from the EPO dated Oct. 2, 2017 for appln. No. 14165804.7, 94 pgs.
Peregrine Semiconductor, Corrporation, Response filed in the EPO dated Jul. 28, 2017 for appln. No. EP14165804, 15 pgs.
Englekirk, Robert Mark, Response filed in the USPTO dated Aug. 7, 2017 for U.S. Appl. No. 15/061,909, 11 pgs.
Patel, Reema, Notice of Allowance received from the USPTO dated Sep. 20, 2017 for U.S. Appl. No. 15/061,909, 17 pgs.
Reedy, et al., Response filed in the USPTO dated Jun. 15, 2017 for U.S. Appl. No. 14/883,512, 15 pgs.
Patel, Reema, Office Action received from the USPTO dated Jul. 3, 2017 for U.S. Appl. No. 15/061,909, 39 pgs.
Willoughby, Terrence Ronique, Notice of Allowance received from the USPTO dated Jul. 26, 2017 for U.S. Appl. No. 14/883,512, 5 pgs.
Willoughby, Terrence Ronique, Final Office Action received from the USPTO dated May 19, 2017 for U.S. Appl. No. 14/883,512, 38 pgs.
Brosa, Anna-Maria, Communication pursuant to Article 94(3) EPC received from the EPO dated Mar. 20, 2017 for appln. No. 14165804.7, 6 pgs.
Englekirk, Robert Mark, Response filed in the USPTO dated Mar. 24, 2017 for U.S. Appl. No. 15/061,909, 3 pgs.
Puentes, Daniel Calrissian, Notice of Allowance received from the USPTO dated May 3, 2017 for U.S. Appl. No. 14/814,404, 29 pgs.
Dang, Hung, Office Action received from the USPTO dated Oct. 14, 2016 for U.S. Appl. No. 14/638,917, 19 pgs.
Dang, Hung, Notice of Allowance received from the USPTO dated Feb. 13, 2017 for U.S. Appl. No. 14/638,917, 13 pgs.
Ranta, Tero Tapia, Preliminary Amendment filed in the USPTO dated Jul. 8, 2015 for U.S. Appl. No. 14/638,917, 8 pgs.
Ranta, Tero Tapia, Response filed in the USPTO dated Jan. 16, 2017 for U.S. Appl. No. 14/638,917, 12 pgs.
Reedy, et al., Response filed in the USPTO dated Sep. 29, 2016 for U.S. Appl. No. 14/883,512, 16 pgs.
Patel, Reema, Notice of Allowance received from the USPTO dated Nov. 2, 2016 for U.S. Appl. No. 14/883,122, 14 pgs.
Ranta, et al., Response filed in the USPTO dated Nov. 7, 2016 for U.S. Appl. No. 14/814,404, 8 pgs.
Meulemans, et al., Communication under Rule 71(3) EPC received from the EPO dated Dec. 13, 2016 for appln. No. 07794407.2, 33 pgs.
Meulemans, et al., Communication under Rule 71(3) EPC received from the EPO dated Dec. 13, 2016 for appln. No. 09174085.2, 30 pgs.

(56) References Cited

OTHER PUBLICATIONS

Puentes, Daniel Clarissian, Office Action received from the USPTO dated Feb. 1, 2017 for U.S. Appl. No. 14/814,404, 13 pgs.
Ranta, et al., Response filed in the USPTO dated Feb. 24, 2017 for U.S. Appl. No. 14/814,404, 4 pgs.
Tadashige, Itoh, et al, Office Action and English translation received from the JPO dated Feb. 7, 2017 for appln. No. 2015-225020, 10 pgs.
Patel, Reema, Office Action received from the USPTO dated Mar. 14, 2017 for U.S. Appl. No. 15/061,909, 7 pgs.
Brosa, Anna-Maria, Extended Search Report received from the EPO dated Apr. 26, 2018 for appln. No. 18157696.8, 14 pgs.
Kelly, et al., "The State-of-the-Art of Silicon-on-Sapphire CMOS RF Switches", CSIC 2005 Digest, pp. 200-203 (4 pgs).
Puentes, Daniel Calrissian, Notice of Allowance received from the USPTO dated May 23, 2018 for U.S. Appl. No. 15/442,491, 9 pgs.
Willoughby, Terrence Ronique, Notice of Allowance received from the USPTO dated Jul. 20, 2018 for U.S. Appl. No. 15/688,658, 11 pgs.
Patel, Reema, Office Action received from the USPTO dated Dec. 14, 2018 for U.S. Appl. No. 15/829,773, 5 pgs.
Puentes, Daniel Calrissian, Office Action received from the USPTO dated Dec. 18, 2018 for U.S. Appl. No. 16/025,922, 20 pgs.
Puentes, Daniel Calrissian, Final Office Action received from the USPTO dated Apr. 10, 2019 for appln. No. 16/025,922, 14 pgs.
Puentes, Daniel Calrissian, Applicant-Initiated Interview Summary received from the USPTO dated Apr. 29, 2019 for appln. No. 16/025,922, 3 pgs.
Puentes, Daniel Calrissian, Advisory Action and Applicant-Initiated Interview Summary received from the USPTO dated Jun. 24, 2019 for appln. No. 16/025,922, 6 pgs.
Patel, Reema, Office Action received from the USPTO dated May 1, 2019 for appln. No. 15/829,773, 40 pgs.

\* cited by examiner

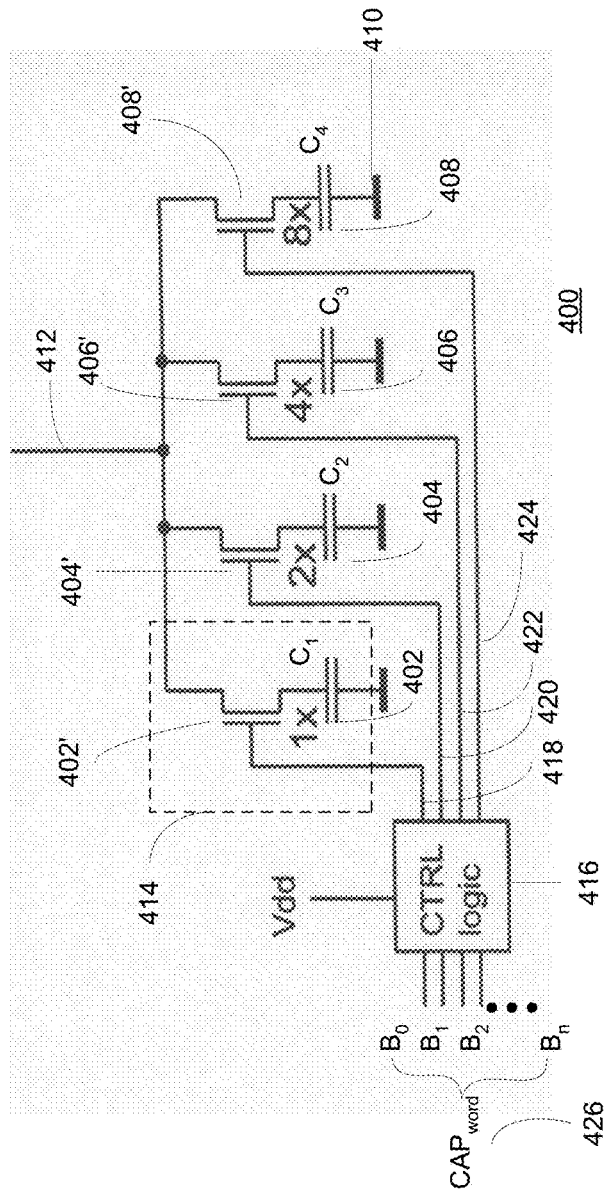
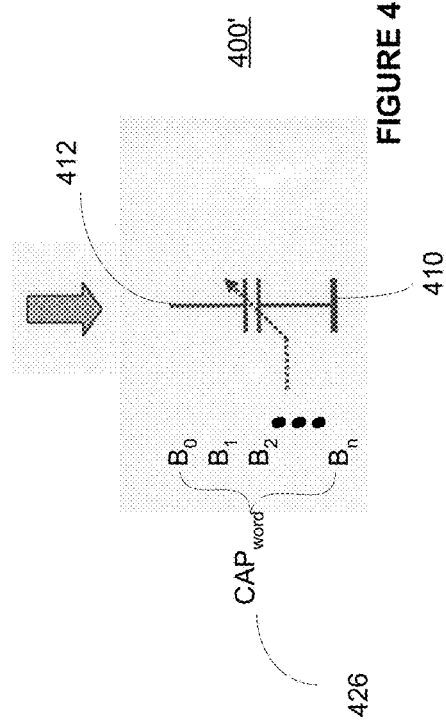
FIGURE 4A
FIGURE 4B

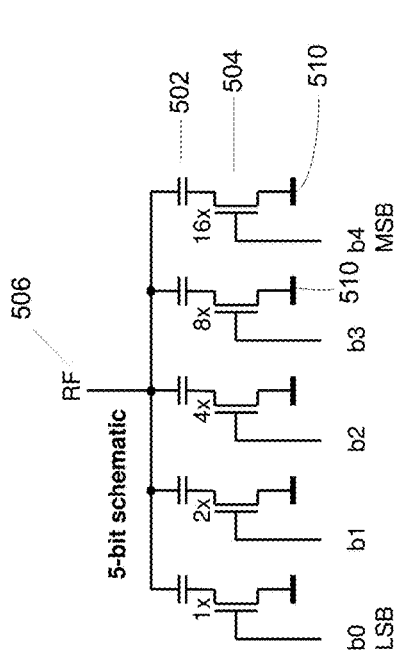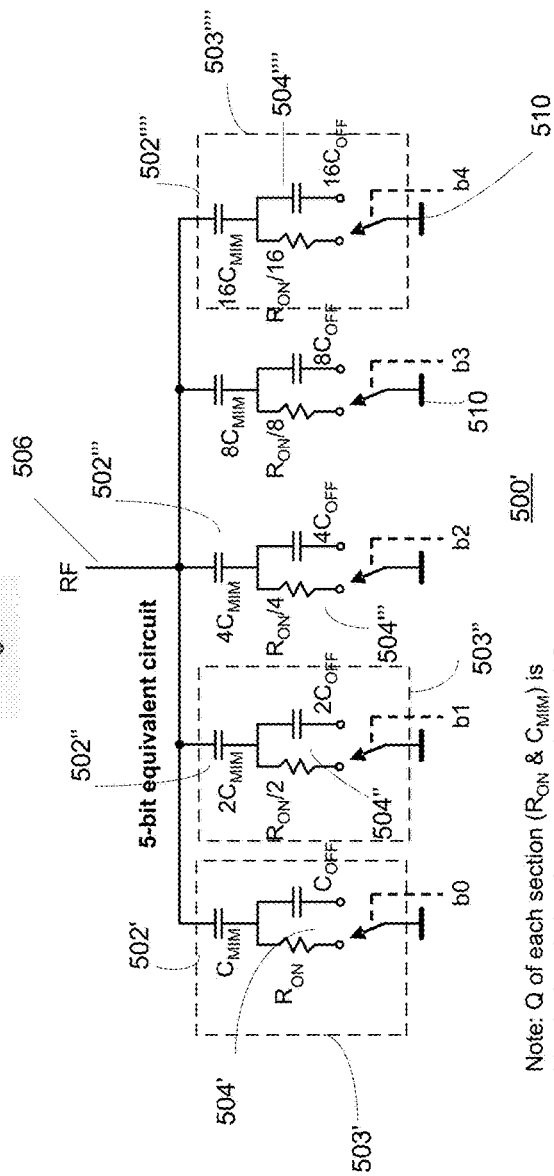

RF Equivalent Circuit of LSB bit in ON State

Simplified Equivalent Circuit of LSB bit in ON State

Simplified Equivalent Circuit of LSB bit in OFF state

RF Equivalent Circuit of LSB bit in OFF state

Input impedance (Zin) @ 900MHz
$Z_{ON}$ = 6.89 − j707 ohms
$C_{ON}$ = 0.2501 pF, $Q_{ON}$ = 103

$Z_{OFF}$ = 31.2 ohms − j3155 ohms
$C_{OFF}$ = 0.05605 pF, $Q_{OFF}$ = 101

$C_{MIN}$ = 1.79 pF
$C_{MAX}$ = 8.00 pF $C_{STEP}$ = 0.194 pF

Input impedance (Zin) @ 2200MHz
$Z_{ON} = 10.42 - j724\Omega$
$C_{ON} = 0.100$ pF, $Q_{ON} = 70$ $Z_{OFF} = 20.99\Omega - j2250\Omega$
$C_{OFF} = 0.03215$ pF, $Q_{OFF} = 107$ $C_{MIN} = 1.03$ pF
$C_{MAX} = 3.20$ pF $C_{STEP} = 0.0678$ pF Die area = 0.82mm²

Cmin = 1.65pF
Cmax = 7.75pF
Tuning Ratio (TR) = 4.70:1
Qmin = 80

1500

Tuning Ratio (TR) = 3:1     Die area = 0.55mm²
Qmin = 80

$$C_{ADD} = \frac{C_{max}^2 - C_{min}C_{max}TR}{C_{min} + (C_{max} - 2C_{min})TR} = \frac{7.75^2 - 1.65 \cdot 7.75 \cdot 3}{1.65 + (7.75 - 2 \cdot 1.65) \cdot 3} = 1.45\,pF$$

1500'

$$C_{min,2} = \frac{C_{max}}{TR} - C_{ADD} = \frac{7.75}{3} - 1.45 = 1.13\,pF$$

$$C_{max,2} = C_{max} - C_{ADD} = 7.75 - 1.45 = 6.3\,pF$$

$$Q_{min,2} = \frac{C_{max} - C_{ADD}}{C_{max}} Q_{min} = \frac{7.75 - 1.45}{7.75} \cdot 80 = 65.0$$

METHOD AND APPARATUS FOR USE IN DIGITALLY TUNING A CAPACITOR IN AN INTEGRATED CIRCUIT DEVICE

CROSS REFERENCE TO RELATED APPLICATIONS—CLAIMS OF PRIORITY

This patent application is a continuation application of U.S. patent application Ser. No. 14/638,917, filed Mar. 4, 2015 entitled "Method and Apparatus for use in Digitally Tuning a Capacitor in an Integrated Circuit Device", now U.S. Pat. No. 9,667,227 issued on May 30, 2017, which is a divisional U.S. patent application Ser. No. 12/735,954, filed Aug. 27, 2010, now U.S. Pat. No. 9,024,700 issued on May 5, 2015, entitled "Method and Apparatus for Use in Digitally Tuning a Capacitor in an Integrated Circuit Device", which is a national stage application filed pursuant to 35 U.S.C. § 371 of international application number PCT/US2009/001358 filed Mar. 2, 2009 (published Sep. 3, 2009 as publication number WO/2009/108391 A1), which application claims the benefit of priority to commonly-assigned U.S. Provisional Application No. 61/067,634, filed Feb. 28, 2008, entitled "Method and Apparatus for Digitally Tuning a Capacitor in an Integrated Circuit Device". The above-identified U.S. patent applications, provisional patent application and international application number PCT/US2009/001358 are hereby incorporated herein in their entirety by reference.

BACKGROUND

1. Field

This invention relates to integrated circuit devices, and more particularly to a method and apparatus for digitally tuning the capacitance of integrated circuit components in integrated circuit devices.

2. Related Art

Capacitors are used extensively in electronic devices for storing an electric charge. As is well known, generally speaking, capacitors essentially comprise two conductive plates separated by an insulator. Capacitors are used in a plurality of electronic circuits including, but not limited to, filters, analog-to-digital converters, memory devices, various control applications, power amplifiers, tunable (also referred to as "adaptive" or "reconfigurable") matching networks, etc.

One well-known problem to those skilled in the art of the design and manufacture of integrated circuits is the poor tolerance values associated with integrated circuit components, especially the tolerance values of passive circuit components. Due to process variations, device parameter spread, variations in critical parameters such as conductive layer sheet resistance values, film thickness, process uniformity and manufacturing equipment cleanliness, and other factors, integrated circuit passive electrical components often have tolerances that are approximately an order of magnitude worse than their analogous discrete external passive electrical components. Consequently, it has proven difficult and costly in the past to implement tuned networks or circuits using on-chip passive electrical components.

Post-fabrication trimming techniques can be used after manufacturing and testing an integrated circuit in order to physically alter the circuit using a variety of methods including "Zener-zapping", laser trimming and fuse trimming. Disadvantageously, the prior art post-fabrication techniques produce only static solutions. Although the trimmed devices may perform adequately under nominal conditions, they may not perform adequately under all of the operating conditions of the integrated circuit. Therefore, methods for improving the tolerances of passive electrical devices in an integrated circuit are needed which do not require the use of post-fabrication trimming techniques. Further, an improved method and apparatus is needed which dynamically monitors and corrects the performance characteristics of integrated circuits under all operating conditions. The improved method and apparatus should monitor and correct the performance characteristics of tuned networks especially as these performance characteristics are adversely affected by poor tolerances of on-chip passive electrical devices, and by the variable operating conditions of the device.

FIG. 1 shows a prior art attempt at solving the problem of implementing an adaptively tuned circuit using on-chip passive electrical devices. As shown in FIG. 1, using an integrated switchable capacitor circuit 100, two terminals of an integrated tuned circuit (i.e., terminal A 101 and terminal B 103) can be selectively coupled to a bank of switchably connected capacitors ($C_1$ through $C_n$). Each of the capacitors is selectively coupled between the terminals 101, 103 by closing an associated and respective coupling switch $S_n$. For example, capacitor $C_1$ 102 is coupled between the terminals 101, 103 by closing an associated switch $S_1$ 110. Similarly, capacitor $C_2$ 104 is coupled between the terminals 101, 103 by closing an associated switch $S_2$ 112. Finally, capacitor $C_n$ 108 is coupled between the terminals 101, 103 by closing an associated switch $S_2$ 116. Because the individual capacitors are connected in a parallel configuration, the total capacitance between the terminals 101, 103 is equal to the sum of the individual capacitors that are switched into the circuit (assuming that the switches do not also introduce capacitance to the circuit). By electrically connecting the terminals 101, 103 to a tuned circuit that is on the same integrated circuit as the switchable capacitor circuit 100, the capacitors can be selectively switched in and out of the tuned circuit, thereby changing the capacitance between the terminals 101, 103 to a desired value. Thus, despite the potentially poor tolerance characteristics of the capacitors $C_1$ through $C_n$, the tuned circuit can be adaptively adjusted to operate within desired parameters by simply changing the capacitance between terminals A 101 and B 103.

Disadvantageously, this prior art approach is undesirable when the tuned circuit operates at relatively high frequencies. For example, when the tuned circuit operates in the GHz range of operating frequencies, the bank of switches (e.g., 110, 112, 114, and 116) introduce significant loss into the tuned circuit and thereby degrade the circuit's performance characteristics. The prior art solution shown in FIG. 1 also disadvantageously increases both the amount of space (i.e., integrated circuit real estate) and the amount of power required to accommodate and operate the switches. Power requirements are increased due to the D.C. current required to operate the bank of switches.

As is well known, there is an ongoing demand in semiconductor device manufacturing to integrate many different functions on a single chip, e.g., manufacturing analog and digital circuitry on the same integrated circuit die. For example, recently there have been efforts to integrate the various mobile telephone handset (or cell phone) functions and circuits in a single integrated circuit device. Only a few short years ago, the integration of digital baseband, intermediate frequency (IF), and radio frequency (RF) circuitry on a single System-on-Chip (SoC) integrated circuit seemed improbable or nearly impossible owing to a number of factors such as incompatible process technologies, yield limitations, high testing costs, poor matching of passive components, and lack of on-chip passive components having adequate analog characteristics. However, a number of advancements have been made in circuit design, physical implementation of hardware components, process technologies, manufacturing and testing techniques. These advancements are making the integration of digital baseband, mixed-signal and RF circuitry into a single integrated circuit device more of a reality. One such advancement is described in an article entitled "Overcoming the RF Challenges of Multi-band Mobile Handset Design", by Mr. Rodd Novak, RF/Microwave Switches and Connectors, published Jul. 20, 2007, www.rfdesign.com. This article is incorporated by reference herein as if set forth in full.

As described in the Novak paper, the complexity of cellular telephones has increased rapidly, moving from dual-band, to tri-band, and more recently, quad-band. In addition, cellular phones need to be able to accommodate a variety of signals for peripheral radios, such as Bluetooth™, Wi-Fi, and GPS. This trend is expected to continue as other capabilities are added. As described in the Novak paper, handsets are now being developed that incorporate tri-band WCDMA and quad-band EDGE platforms. These architectures demand at least seven radios in a single handset. Complexity will continue to rise due to the increased popularity of peripheral radios and functions that also need access to the antenna. The increased complexity in mobile telephone handset design has greatly complicated the RF front-end by more than tripling the number of high-power signal paths. By its nature, a multiband handset must accommodate a plurality of RF signal paths that all operate on different bandwidths. Yet, all of the RF signal paths must share access to a single antenna. As described in the Novak paper, a very efficient solution is to route all of the competing RF signal paths to the antenna using a single single-pole, multi-throw, RF switch.

The assignee of the present application has developed and is presently marketing such RF switches, and exemplary RF switch designs are described in applications and patents owned by the assignee of the present application. For example, the following applications and patents describe RF switch designs that facilitate further integration of mobile handset circuitry: U.S. Pat. No. 6,804,502, issuing Oct. 12, 2004 to Burgener, et al., U.S. Pat. No. 7,123,898, issuing Oct. 17, 2006, also to Burgener, et al., (both patents entitled "Switch Circuit and Method of Switching Radio Frequency Signals"); pending U.S. application Ser. No. 11/582,206, filed Oct. 16, 2006, entitled "Switch Circuit and Method of Switching Radio Frequency Signals"; pending U.S. application Ser. No. 11/347,014, filed Feb. 3, 2006, and entitled "Symmetrically and Asymmetrically Stacked Transistor Grouping RF Switch"; U.S. Pat. No. 7,248,120, issuing Jul. 24, 2007 to Burgener, et al.; U.S. Pat. No. 7,088,971, issuing Aug. 8, 2006 to Burgener, et al.; pending U.S. application Ser. No. 11/501,125, filed Aug. 7, 2006, entitled "Integrated RF Front End with Stacked Transistor Switch"; and pending U.S. application Ser. No. 11/127,520, filed May 11, 2005, and entitled "Improved Switch Circuit and Method of Switching Radio Frequency Signals". All of the above-noted pending patent applications and issued patents are incorporated by reference herein as if set forth in full.

While these advancements in RF switch design facilitate further integration of mobile handset circuitry, a significant problem is presented as a result of mismatched impedances present at the mobile handset antenna terminal. Due to the variable operational environment of the mobile handset causing the impedance at the antenna terminal to vary over a wide range, antenna impedance mismatch poses significant technical challenges for the mobile handset design engineer. The problems associated with antenna impedance mismatch are described in a paper entitled "Antenna Impedance Mismatch Measurement and Correction for Adaptive CDMA Transceivers", authored by Qiao, et al., Published 12-17 Jun. 2005, by the IEEE in the 2005 Microwave Symposium Digest, 2005 IEEE MTT-S International, at Pages 4 et seq. (hereafter "the Qiao paper"), and incorporated by reference herein as if set forth in full.

As described therein, mobile handsets are used in a variety of configurations and positions, by users who manipulate the handset and, in particular, the antenna, in ways that are difficult to predict. While a nominal antenna provides an input impedance of 50 ohms, in actual usage the impedance at the antenna terminal can vary over a wide range, characterized by a voltage standing wave ratio (VSWR) of up to 10:1. (Qiao paper, see the Abstract). Consequently, it is a major design engineering challenge to maintain proper operation of the mobile handset over a wide range of antenna impedances.

For example, for the receiver, the non-optimal source impedance degrades noise figure, gain and dynamic range. For the power amplifier, the antenna impedance mismatch greatly impacts the efficiency, power gain, maximum output power and linearity. In the worst case, the high standing wave amplitude or possible oscillation caused by the mismatch in the circuit may damage the power amplifier. As described in the above-incorporated Qiao paper, in accordance with one prior art solution, an isolator, or Voltage Standing Wave Ratio (VSWR) protection circuitry, is inserted between the amplifier and the antenna in order to mitigate problems associated with the antenna impedance mismatch. Unfortunately, this solution is disadvantageous because it creates attenuation, and therefore decreases antenna efficiency. Other possible solutions include correcting the impedance mismatch using dynamic biasing of the power amplifier or using a tunable matching network. Adaptively correcting for environmental changes that cause antenna impedance variation (e.g. placing a finger on top of cellphone antenna) is an important motivation for the need for tunable components in handset RF front-ends. In addition, tunable components also allow the RF front-end to cover more and more frequency bands, without increasing the number of antennas in the cellular phone. One antenna needs to cover more frequency bands in the cellular phone. This has proven difficult to achieve in prior art mobile handsets. Using tunable matching networks, the performance of the amplifier can be preserved even under severe mismatch conditions. Several examples of tunable matching networks can be found in the prior art.

For example, exemplary tunable matching networks for use in mitigating problems associated with antenna impedance mismatch are described in a paper entitled "An Adaptive Impedance Tuning CMOS Circuit for ISM 2.4-GHz Band", authored by Peter Sjöblom, Published in the IEEE Transactions on Circuits and Systems—I: Regular Papers, Vol. 52, No. 6, pp. 1115-1124, June 2005, (hereafter "the Sjöblom paper"). As described therein, adaptive (or reconfigurable) matching networks are used between the RF antenna and RF switch in order to continuously adapt to the changing antenna impedance. The adaptive matching networks described in the Sjöblom paper are implemented using a bulk CMOS process in a configuration using switched capacitor banks in conjunction with inductors. The capacitors and the inductors create a ladder network. On the antenna side, a voltage detector is followed by an analog-to-digital (A/D) converter. A controller system controls the adaptive matching network by switching the bank of capacitors through all possible combinations to arrive at a state yielding the best performance. FIGS. 2A and 2B show two exemplary prior art tunable matching networks (200 and 200', respectively) made in accordance with the Sjöblom teachings. As shown in FIG. 2A, an exemplary tunable matching network 200 comprises a bank of three switched capacitors 202 coupled to an inductor 204 and a load 206. The load 206 typically comprises an RF antenna. To gain enough latitude to match a wide range of impedances, a single inductor will not suffice. An alternative prior art adaptive matching network 200' is shown in FIG. 2B. The alternative network includes two inductors (204' and 204"), and three capacitor banks (208, 210, and 212), arranged as shown in FIG. 2B, and coupled to the antenna 214. The inductors (204, 204', and 204") are typically located in "flipchip packaging" or low-temperature co-fired ceramic (LTCC) substrates.

Disadvantageously, the tunable networks described in the Sjöblom paper do not, and cannot be designed to provide sufficient power required by some wireless telecommunication applications. For example, the power handling capabilities of the tunable networks 200, 200' are insufficient for mobile handsets designed for use in the well-known Global System for Mobile communications (GSM). In order to be able to be used in a GSM/WCDMA handset the tunable component needs to tolerate at least +35 dBm of power without generating harmonics more than −36 dBm (based on the GSM spec). Also the IMD3 ($3^{rd}$ order intermodulation distortion) for WCDMA needs to be sufficiently low (typ −105 dbm . . . −99 dbm). These are the same requirements that are imposed on handset antenna switches. The Sjoblom paper is designed for low power applications (typ +20 . . . +25 dBm). It uses a single FET and a capacitor, whereas the digitally tuned capacitor (hereafter, "DTC") of the present teachings uses a stack of many FETs (typ 5-6) that improve the power handling capabilities of the DTC. Anything built on a bulk CMOS process cannot meet the higher power handling requirements. The UltraCmos process has the ability to allow use of stack transistors in the DTC thereby allowing the DTC to handle high power levels (similar to GSM/WCDMA antenna switches). Stacked transistors cannot be implemented using a bulk CMOS process due to problems associated with substrate coupling.

The above-referenced Qiao paper describes a tunable matching network 300 comprising silicon-on-sapphire (SOS) switches 302 coupled to shunt capacitors 304. An exemplary prior art tunable matching network 300 made in accordance with the Qiao teachings is shown in FIG. 3. As shown in FIG. 3, this tunable matching circuit comprises six transistors 302 which provide 64 ($2^6$) possible capacitor states. The best state is selected to meet any particular mismatch circumstance. The tunable matching network 300 is implemented on a PCB board using discrete components. The transistors 302 comprise 1000 μm*0.5 μm FETs arranged in parallel and combined by wire bonding. The ON resistance for the total switch is approximately 0.5 ohms, and the OFF capacitance is approximately 1.8 pF. While the switched capacitor approach taught by Qiao, et al., has promising aspects, an integrated circuit implementation using this approach would occupy significant integrated circuit real estate. For example, the die area estimate is approximately 1.2 mm$^2$ per 0.5 ohm FET, which for a six bit switched capacitor exceeds 7.2 mm$^2$ without the capacitors 204. A complete tunable matching network requires a total of four switched capacitor banks, leading to a total FET area of almost 30 mm$^2$. In addition to the unwieldy die area required by the Qiao teachings, it is also difficult to accurately control the overall capacitance due to the tolerance differences in the discrete capacitors. The circuit also disadvantageously has inferior power handling capabilities, linearity and Q-factor values for some applications. In addition, in this prior art solution, degradation in performance is caused by parasitic inductance of discrete capacitors. It is advantageous to use integrated capacitors (as opposed to discrete capacitors) because the parasitic inductance and Quality-factor (Q) of an integrated solution is higher using an integrated circuit on a sapphire substrate than what is typically achievable using discrete SMD capacitors.

As described in both the above-referenced Qiao and Sjöblom papers, at higher frequencies using integrated circuit technology, much work has been done using Micro-Electromechanical Systems (MEMS) switches instead of CMOS switches and capacitors. MEMS switches, varactors and thin-film Barium Strontium Titanate (BST) tunable capacitors have been used in the design of tunable or switched matching networks. Disadvantageously, these approaches have disadvantages of cost, tuning range (also referred to as "tuning ratio") (which generally corresponds with maximum available capacitance/minimum available capacitance), integration and linearity. For various reasons, these solutions fail to meet the power handling, tuning ratio, and linearity requirements imposed by many wireless telecommunication specifications. Even after years of research and development, several MEMS and BST manufacturing enterprises that were founded to pursue the tunable component opportunities have fallen short of the requirements and specifications set forth in various cellular telephone specifications. Consequently, mass produced tunable capacitors or inductors for GSM power levels (i.e., +35 dBm) and WCDMA linearity (IMD3 −105 dBm) simply do not exist. BST capacitors exhibit significant problems when operated at high temperatures where their Q-factor is significantly degraded.

For example, varactor diodes and bulk CMOS switched capacitors do not meet the power and linearity requirements of these cellular specifications. MEMS switched capacitor banks exist, but they do not seem to meet power and linearity requirements, they require separate high-voltage driver chip and hermetic packaging, and reliability is a problem in mobile handset applications. BST voltage tunable capacitors are based on ferroelectric materials. These prior art solutions have difficulty meeting power and linearity requirements. They also disadvantageously require an external high voltage (HV) integrated circuit in order to produce high bias voltages (e.g., 20-40V) and generally cannot be integrated with other control electronics. The BST voltage tunable capacitors also suffer from degraded performances due to hysteresis and temperature stability.

Therefore, a need exists for a method and apparatus for digitally tuning a capacitor in an integrated circuit device. A need exists for a method and apparatus that can overcome the disadvantages associated with the prior art solutions and that facilitates the integration of tunable capacitor networks on a single integrated circuit. The need exists for an apparatus that facilitates the full integration of a tunable matching network for use with other mobile handset circuits and functions. In addition, the need exists for an apparatus and method that can dynamically calibrate an integrated tuned capacitor network such as a tunable antenna matching network. The present teachings provide such a method and apparatus.

The details of the embodiments of the present disclosure are set forth in the accompanying drawings and the description below. Once the details of the disclosure are known, numerous additional innovations and changes will become obvious to those skilled in the art.

SUMMARY

A method and apparatus for use in a digitally tuning a capacitor in an integrated circuit device is described. A Digitally Tuned Capacitor DTC is described which facilitates digitally controlling capacitance applied between a first and second terminal. In some embodiments, the first terminal comprises an RF+ terminal and the second terminal comprises an RF− terminal. In accordance with some embodiments, the DTCs comprise a plurality of sub-circuits ordered in significance from least significant bit (LSB) to most significant bit (MSB) sub-circuits, wherein the plurality of significant bit sub-circuits are coupled together in parallel, and wherein each sub-circuit has a first node coupled to the first RF terminal, and a second node coupled to the second RF terminal. The DTCs further include an input means for receiving a digital control word, wherein the digital control word comprises bits that are similarly ordered in significance from an LSB to an MSB. Each significant bit of the digital control word is coupled to corresponding and associated significant bit sub-circuits of the DTC, and thereby controls switching operation of the associated sub-circuit. DTCs are implemented using unit cells, wherein the LSB sub-circuit comprises a single unit cell. Next significant bit sub-circuits comprise x instantiations of the number of unit cells used to implement its associated and corresponding previous significant bit sub-circuit, wherein the value x is dependent upon a weighting coding used to weight the significant bit sub-circuits of the DTC. DTCs may be weighted in accordance with a binary code, thermometer code, a combination of the two, or any other convenient and useful code. In many embodiments, the unit cell comprises a plurality of stacked FETs in series with a capacitor. The unit cell may also include a plurality of gate resistors $R_G$ coupled to the gates of the stacked FETs, and a plurality of $R_{DS}$ resistors coupled across the drain and source of the stacked FETs. The stacked FETs improve the power handling capabilities of the DTC, allowing it meet or exceed high power handling requirements imposed by current and future communication standards.

BRIEF DESCRIPTION OF THE DRAWINGS

FIG. 4A is a simplified schematic representation of one embodiment of a digitally tuned capacitor (DTC) in accordance with the present teachings.

FIG. 4B is a simplified schematic representation of the DTC of FIG. 4A.

FIG. 5A is a simplified schematic representation of another embodiment of a digitally tuned capacitor (DTC).

FIG. 5B is an equivalent circuit showing the ON resistances and OFF capacitances associated with the switching FETs of the DTC of FIG. 5A.

Like reference numbers and designations in the various drawings indicate like elements.

MODES OF CARRYING OUT THE INVENTION

Figure 1:
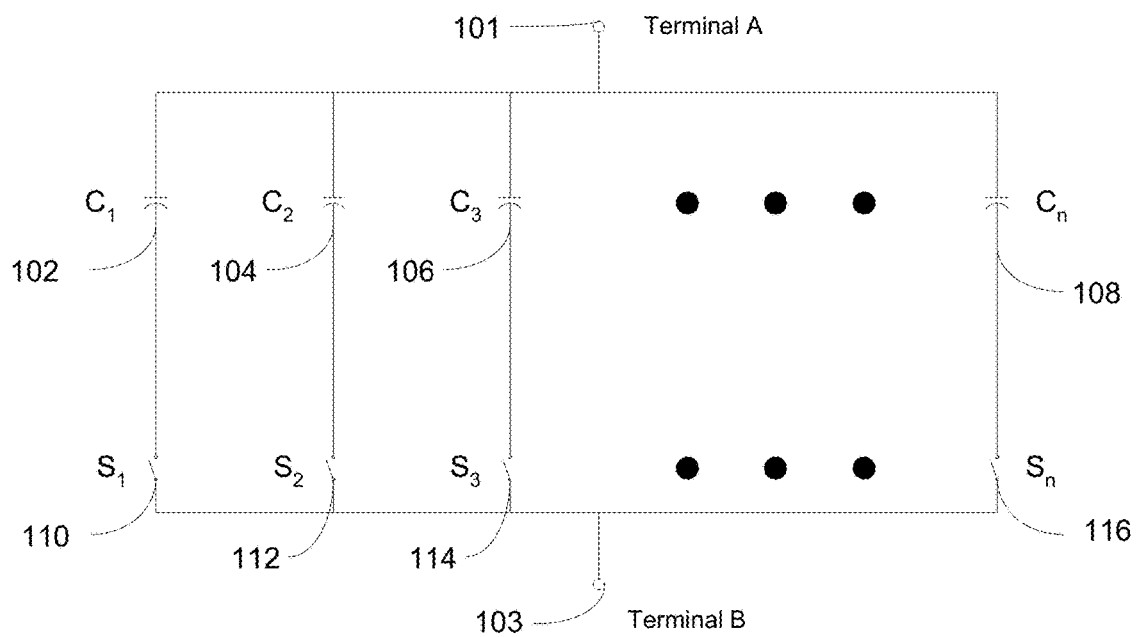
FIG. 1 is a simplified schematic of a prior art attempt at solving the problem of implementing an adaptively tuned circuit using on-chip passive electrical devices.

Throughout this description, the preferred embodiment and examples shown should be considered as exemplars, rather than as limitations on the present invention.

FIG. 4A shows a simplified schematic representation of a one embodiment of a digitally tuned capacitor (hereafter, "DTC") 400 for use in an integrated circuit device in accordance with the present teachings. As shown in FIG. 4A, in one exemplary embodiment, the DTC 400 comprises a plurality of capacitors (e.g., capacitors 402, 404, 406 and 408) having first terminals coupled in series to respective MOSFET devices (i.e., capacitor 402 is coupled to the source of FET 402', capacitor 404 is coupled to the source of FET 404', capacitor 406 is coupled to the source of FET 406', and capacitor 408 is coupled to the source of FET 408'). In the embodiment shown in FIG. 4A, second terminals of the capacitors 402, 404, 406 and 408 are coupled to a ground node or ground terminal 410. However, in a more general implementation of a DTC made in accordance with the present teachings, the second terminals of the capacitors 402, 404, 406 and 408 may be coupled together and coupled to an ungrounded terminal or port. Such ungrounded terminal or port may, in some embodiments, be coupled to a load, an RF port or terminal (a negative or positive RF port), or to any other convenient port or terminal.

Figure 4C:
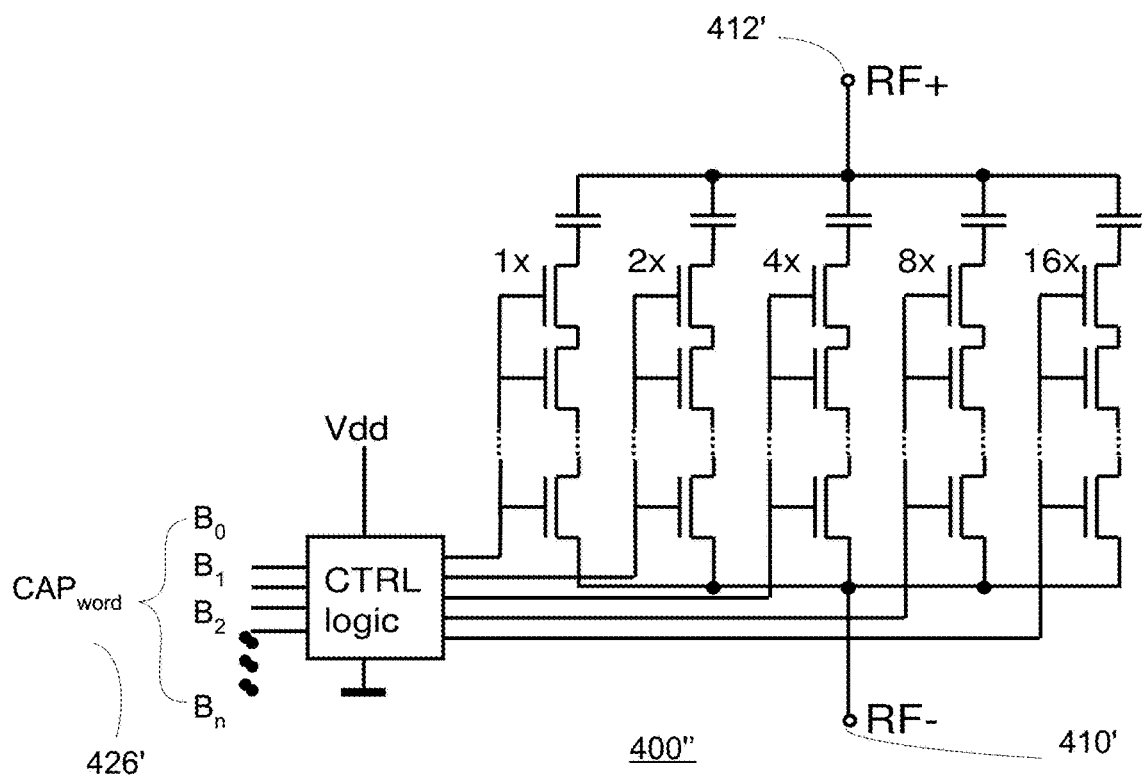
FIG. 4C is a simplified schematic representation of another embodiment of a digitally tuned capacitor (DTC) in accordance with the present teachings.

As shown in FIG. 4A, the drains of the FETs are coupled together, and coupled to a load terminal 412. Thus, the load terminal 412 and ground terminal 410 are analogous to the terminals A 101 and B 103 of FIG. 1, respectively. As described in more detail below, in some embodiments, the load terminal 412 may comprise a mobile handset antenna. As shown in the more generalized DTC 400'' of FIGS. 4C and 4D, the load terminal 412 comprises an RF+ terminal 412', and the "ground" terminal 410 (which is, in the more generalized case described below with reference to FIGS. 4C and 4D, not necessarily coupled to ground at all) comprises an RF− terminal 410'. These more generalized embodiments of the DTC are described in more detail below. Those skilled in the electronic device design arts shall recognize that the plurality of capacitors (402-408) may alternatively be coupled to the drains of the FETs (402'-408'), and the sources may be coupled to the load terminal 412, depending on whether the FETs comprise N-type of P-type MOSFETs. In one embodiment in accordance with the present teachings, the plurality of capacitors comprise metal-insulator-metal MIM capacitors. As is well known, MIM capacitors are widely used in monolithic integrated circuits in DC-decoupling, matching, and biasing circuits. In integrated circuit devices, the various MIM capacitors advantageously exhibit very good matching characteristics (i.e., they have excellent tolerance characteristics).

Although the DTCs of the present teachings are described throughout the present application as being implemented using MIM capacitors (e.g., the capacitors 402-408 of FIG. 4A), it will be appreciated by those skilled in the electronic design arts that the MIM capacitors may, in other embodiments, comprise different capacitor types. More specifically, these capacitors may comprise any useful RF capacitor having a high Q-factor value. In some embodiments, the capacitors may comprise MIM (Metal-Insulator-Metal), MM (Metal-Metal), Interdigitated Capacitors (IDC) and their variants. The "MIM" capacitors may also, in other embodiments, comprise FETs biased in an OFF state.

In accordance with the present teachings, the capacitance values of the MIM capacitors (i.e., the capacitors 402-408) are weighted in a convenient and desirable manner. For example, in one embodiment, the MIM capacitors of the DTC are given a binary weighting. More specifically, in accordance with this embodiment, the least-significant capacitor $C_1$ 402 is designed to have a desired least significant (or lowest) capacitance of $C_{LSB}$. The next significant capacitor $C_2$ 404 is designed to have a capacitance of twice $C_{LSB}$, or $2*C_{LSB}$. The binary weighting is assigned in like fashion with each next significant capacitor having a capacitance that is a power of two greater than the previous significant capacitor. Finally, the most significant capacitor $C_n$ 408 is designed to have a capacitance of $2^{n-1}*C_{LSB}$.

Those skilled in the IC manufacturing arts will appreciate that several alternative means may be used to implement the capacitance of a selected capacitor. For example, in one embodiment, the selected capacitor (e.g., $C_2$ 404) can be formed by placing two previous significant capacitors (in this example, $C_1$ 402) in parallel. Similarly, the next significant capacitor (e.g., $C_3$ 406) can be formed by placing four of the least significant capacitors (e.g., $C_1$ 402) in parallel. Alternatively, the capacitors may be designed to different physical dimensions to have the desired capacitance values. In addition, although the MIM capacitors of the embodiment shown in FIG. 4A are described as having a binary weighting, those skilled in the electronic design arts shall recognize that any convenient capacitance-weighting scheme can be assigned to the MIM capacitors. For example, in an alternative embodiment wherein a logarithmic scaling is desired, each capacitor can be designed to have a capacitance value that is ten times greater than its previous significant capacitor. More specifically, and referring again to FIG. 4A, capacitor $C_2$ 404 can be designed to have a capacitance that is $10*C_{LSB}$, wherein $C_1$ 402 is designed to have a capacitance of $C_{LSB}$. In this embodiment, $C_n$ is assigned a capacitance of $10^{n-1}*C_{LSB}$. As described below in more detail, in accordance with one embodiment of the present teachings, the MIM capacitors are weighted using a "thermometer coding" scheme.

As described in more detail below, in one embodiment of the present DTC, the MIM capacitors (e.g., the capacitors 402-408) are designed as part of a "unit cell" design block. As described in more detail below, the unit cell comprises a fundamental design building block that can be replicated (or instantiated) within an integrated circuit device to achieve a desired function. In accordance with the unit cell implementation, the least significant capacitor (i.e., capacitor $C_1$ 402) is part of a unit cell design block. For example, the unit cell design block may comprise the least significant bit (LSB) sub-circuit which comprises the least significant FET 402' coupled in series with the least significant shunt capacitor $C_1$ 402 (shown in FIG. 4A as a "unit cell design block" 414). In accordance with the unit cell implementation, the capacitance of a selected MIM capacitor (e.g., the second least significant shunt capacitor $C_2$ 404) comprises two unit cell blocks 414 electrically coupled in parallel. That is, the next significant bit sub-circuit comprises two instantiations of the unit cell design block (which comprises the LSB sub-circuit as described above). The capacitance of the next significant bit capacitor (i.e., $C_3$ 406) comprises four unit cell blocks 414 electrically coupled in parallel, and so on. The MSB significant bit sub-circuit comprises 8 instantiations of the LSB sub-circuit, coupled in parallel. The tolerances and matching of the MIM capacitors (402-408) are greatly improved using the unit cell design approach because they are based on identical unit cell building blocks. This implementation is described in much more detail below.

In accordance with one embodiment of the present DTC, both the capacitance values of the MIM capacitors (e.g., MIM capacitor $C_1$ 402) and the size of their respective FETs (e.g., FET 402') are weighted similarly. For example, and referring again to FIG. 4A, the least significant FET 402' can be designed to comprise the smallest (i.e., FET occupying the least integrated circuit die area) FET of the plurality of FETs used in the DTC 400. FET sizes are dimensioned such that the Q specification is met (Ron of the FET vs the Cmim capacitance) and also so that a desired tuning ratio is achieved. The capacitance of the FET when it is turned OFF is represented by "Coff". So when the FET is OFF, the total capacitance of the bit is $C_{min}$ in series with $C_{OFF}$. The selection of the FET size and thus $C_{OFF}$ of each FET determines the Cmin, or minimum capacitance for the entire DTC. Also, in a stack of FETs there is voltage division between the FETs. The MIM capacitor value can also be adjusted such the required stack height of FETs can be reduced, based on voltage division between $C_{OFF}$ of the FETs and $C_{min}$. Owing to its smallest size, the least significant FET 402' therefore has the highest ON Resistance ($R_{ON}$, which is defined herein as the resistance of the FET when it is turned ON) and the lowest OFF Capacitance ($C_{OFF}$, which is defined herein as the capacitance of the FET when it is turned OFF) as compared to all of the other FETs (e.g., 404', 406' and 408') of the DTC 400. For example, in one embodiment, if the least significant bit FET 402' has an ON resistance of $R_{ON}$, and an OFF capacitance of $C_{OFF}$, the next significant bit FET 404' can be binary weighted (similar to the binary weighting of the MIM capacitors) to be twice the size of its previous significant bit FET (i.e., 402'), and therefore have an ON resistance of $R_{ON}/2$, and an OFF capacitance of $C_{OFF}*2$. Similarly, the next significant bit FET 406' is binary weighted to be four times the size of the least significant FET (i.e., FET 402'), and therefore have an ON resistance of $R_{ON}/4$, and an OFF capacitance of $C_{OFF}*4$.

The binary weighting of the FETs are assigned in like fashion (similar to the binary weighting of the MIM capacitors) with each next significant bit FET having an ON resistance that is half that of the previous significant bit FET, and an OFF capacitance that is twice that of the previous significant bit FET. Finally, the most significant bit FET (e.g., the FET 408' of the DTC 400) $FET_n$ is designed to have a size that is $2^{n-1}*FET_{LSB}$ (wherein n is the number of FETs used in the DTC). In this embodiment, the most significant FET has a size that is $2^{n-1}*$the size of the least significant bit FET. The most significant bit FET therefore has an OFF capacitance that is $2^{n-1}*COFF_{LSB}$ (wherein $COFF_{LSB}$ comprises the $C_{OFF}$ of the least significant bit FET), and an ON resistance that is $RON_{LSB}/2^{n-1}$ (wherein $RON_{LSB}$ comprises the ON resistance of the least significant bit FET). As described above, similarly to the weighting of the MIM capacitors, other weighting schemes can be applied to the FETs. For example, a thermometer weighting scheme can be used. However, in the general case, whatever weighting scheme is used, it should be applied equally to both the MIM capacitors and their respective and associated FETs. For example, if a binary weighting scheme is used, it should be applied to each corresponding significant bit FET and MIM capacitor, on a one-to-one basis. Whatever weight is assigned to a selected capacitor (e.g., the MIM capacitor $C_3$ 406) should also be assigned to its corresponding and associated FET (i.e., the FET 406'). This configuration is described in more detail below. This aspect of the present DTC teachings is important because it maintains constant Q values for each of the bits. Constant Q factors are maintained for the FETs because the relationship between Ron and Cmim stays the same due to the scaling aspect. This also causes the Q-factor value of the entire DTC to remain the same as the unit cell (assuming all FETs are turned ON).

Because the plurality of MIM capacitors are coupled together in parallel as shown in FIG. 4A, their respective capacitance values combine by simply adding the capacitance values of all of the individual MIM capacitors. The capacitance of the DTC 400 (as measured between the load 412 and ground 410) is therefore equal to the sum of the capacitance of all of the MIM capacitors $C_n$.

Referring again to FIG. 4A, the capacitance between the load 412 and ground terminal 410 (i.e., the total capacitance of the DTC 400) is controlled by a digital control word $CAP_{word}$ 426 that is applied to a control logic block 416. In some embodiments, the control word $CAP_{word}$ 426 is applied directly to the DTC FETs without use of an intervening control logic block 416. The control word that is applied to the DTC FETs may be generated using a feedback circuit that identifies and tracks operation of a mobile telephone handset (for example, it may be continuously generated by monitoring impedance matching of the mobile handset with a handset antenna and adjusting the control word accordingly). Those skilled in the electronics design arts shall recognize that there are many ways to generate the digital control word in order to control the capacitance of the DTC 400, and such mechanisms are contemplated by and fall within the scope of the present teachings.

Referring again to FIG. 4A, the control word is applied to individually control the switching operation of each of the FETs (i.e., 402'-408') of the DTC 400. The control bits are ordered from least significant bit (LSB) to most significant bit (MSB), and are assigned to control the shunting FETs associated and corresponding to the least significant MIM capacitor to the most significant MIM capacitor. The least significant bit (e.g., Bo) of the control word is applied on signal line 418 to control the operation of the least significant bit FET 402'. The next significant bit (e.g., B1) of the control word is applied on signal line 420 to control the operation of the next significant bit FET 404'. The next significant bit (e.g., B2) of the control word is applied on signal line 422 to control the operation of the next significant bit FET 406'. Finally, the most significant bit (e.g., B3) of the control word is applied on signal line 424 to control the operation of the most significant bit FET 408'. In the example shown in FIG. 4A, a four bit control word controls the operation of the four FETs, thereby controlling which (and how many) of the MIM capacitors are applied between the load terminal 412 and ground 410. In the DTC 400 shown in FIG. 4A, the DTC can have one of sixteen (i.e., $2^4$) possible discrete capacitance values. FIG. 4B is a simplified schematic representation of the DTC 400 shown in FIG. 4A.

Figure 4D:
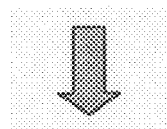
FIG. 4D is a simplified schematic representation of the DTC of FIG. 4C.
Figure 4D:
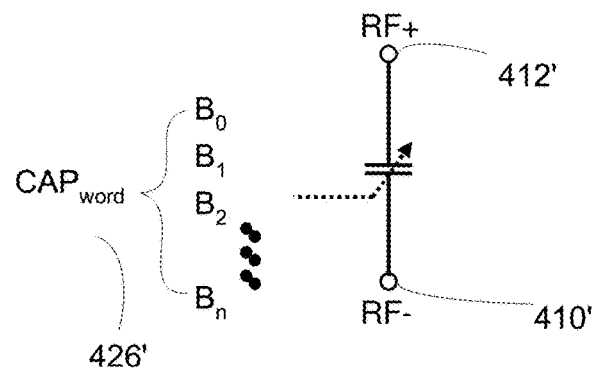

FIGS. 4C and 4D show simplified schematic representations of generalized embodiments of digitally tuned capacitors (DTCs) 400'', and 400''', respectively, made in accordance with the present teachings. The generalized embodiment of the DTC 400'' of FIG. 4C functions similarly to the DTC 400 described above with reference to FIG. 4A. However, as shown in FIGS. 4C and 4D, the generalized DTC 400'' (and generalized DTC 400''' of FIG. 4D) digitally tunes or varies the capacitance between a first RF terminal (specifically, an RF+ terminal 412') and a second RF terminal (specifically, an RF− terminal 410'). The sign designations shown in the DTCs of FIGS. 4C and 4D, and associated with the first and second RF terminals (i.e., the "+" and "−" sign designations), merely indicate a top terminal (i.e., "RF+" 412') and a bottom terminal (i.e., "RF−" 410') of the generalized DTCs 400'' and 400'''. The RF+ terminal 412' is analogous to the terminal A 101 of the prior art switchable capacitor circuit 100 of FIG. 1. The RF− terminal 410' is analogous to the terminal B 103 of the prior art switchable capacitor circuit 100 of FIG. 1. The RF+ 412' and RF− 410' terminals of the DTC 400'' may be coupled to any convenient port, terminal, load, or other circuit device, as required to meet design parameters and system requirements.

For example, in some embodiments the DTC 400'' is coupled to other circuits in a "Shunt" configuration. When coupled in such a "shunt" configuration, the RF+ terminal 412' may be coupled to a load or RF port and the RF− terminal 410' may be coupled to ground (i.e., connected similarly to connection of the DTC 400 described above with reference FIG. 4A). In another embodiment of a shunt configuration, the RF+ terminal 412' may be coupled to ground and the RF− terminal 410' may be coupled to a load or RF port. In still further embodiments, the DTC 400'' may be coupled to other circuits in a "Series" configuration. When coupled in a "series" configuration the RF+ terminal 412' may be coupled to an input port, such as, for example, an RF input port, and the RF− terminal 410' may be coupled to an output port, such as, for example, an RF output port. In another embodiment of a series configuration, the RF+ terminal 412' may be coupled to an output port, such as, for example, an RF output port, and the RF− terminal 410' may be coupled to an input port, such as, for example, an RF input port.

The DTC 400'' of FIG. 4C also shows the plurality of MIM capacitors as coupled in series at the top of a stack of FET switches. This configuration is described in more detail below. FIG. 4D is a simplified schematic representation of the DTC 400''' of FIG. 4C. The DTC 400''' also shows an implementation of a "5-bit" DTC, wherein the digital control word applied to control the tuning of the DTC comprises 5 bits, and the DTC 400''' is therefore implemented using 5 significant bit sub-circuits. As described above, in accordance with one embodiment of the unit cell design technique of the present teachings, each significant bit sub-circuit is implemented by coupling an appropriate number of unit cells together in parallel. For example, the LSB significant bit sub-circuit comprises the unit cell. The next significant bit sub-circuit comprises two instantiations of the unit cell, coupled in parallel. The next significant bit sub-circuit comprises four instantiations of the unit cell, also coupled in parallel. Finally, as shown in FIG. 4C, the MSB significant bit sub-circuit comprises 16 unit cells (or 16 LSB sub-circuits) coupled in parallel.

Figure 5C:
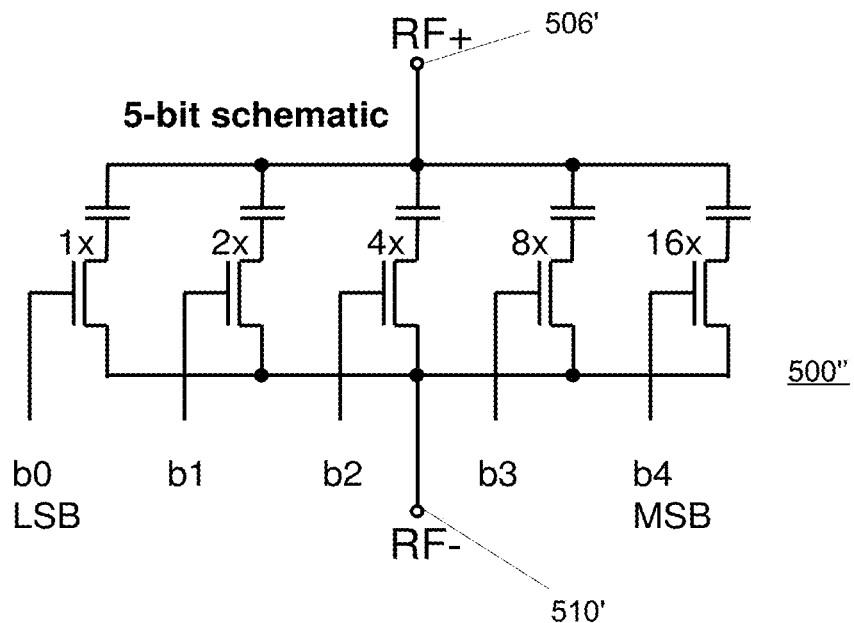
FIG. 5C is a simplified schematic representation of another embodiment of a digitally tuned capacitor (DTC).

FIG. 5A shows a simplified schematic representation of another embodiment of a digitally tuned capacitor (DTC) 500 for use in an integrated circuit device in accordance with the present teachings. As shown in FIG. 5A, in one exemplary embodiment, the DTC 500 comprises a plurality of capacitors coupled in series to a plurality of switching shunt FETs 504. Note that the plurality of MIM capacitors 502 of the DTC 500 of FIG. 5A are coupled between the plurality of shunt FETs 504 and an RF antenna terminal 506 (i.e., the MIM capacitors 502 are coupled "on top" of the shunt FETs 504 as contrasted with being coupled below the shunt FETs). Also, as described above with reference to the generalized DTC 400'' and as described below in more detail below with reference to the generalized DTC 500'' of FIG. 5C, a generalized implementation of the DTC 500 facilitates digitally tuning of the capacitance between a first terminal and a second terminal of the DTC. That is, although the DTC 500 is shown in FIGS. 5A and 5B as having an RF antenna terminal 506 (shown in FIGS. 5A and 5B as coupled to a first terminal of the MIM capacitors 502) and as having a ground terminal 510 (shown in FIGS. 5A and 5B as being coupled to the bottom (or drains) of the shunt FETs 504, a generalized implementation of a DTC is not so limited. As described in more detail below with regard to the more generalized DTC 500'' of FIG. 5C (and DTC 500''' of FIG. 5D), the RF antenna terminal 506 of the DTC 500 of FIG. 5A (and the RF antenna terminal 506 of the DTC 500' of FIG. 5B) may comprise an RF+ terminal 506'. The "ground" terminal 510 (which is, in the more generalized case described below with reference to FIGS. 5C and 5D, not necessarily coupled to ground at all) may comprise an RF− terminal 510'. These embodiments are described in more detail below with reference to the more generalized DTC 500'' of FIG. 5C and the DTC 500''' of FIG. 5D.

The 5-bit DTC 500 (control word bits $b_0$ through $b_4$ are used to control the total capacitance of the DTC 500) functions similarly to the 4 bit version described above with reference to FIGS. 4A and 4B. An equivalent circuit 500' is shown in FIG. 5B showing the ON resistances and OFF capacitances associated with the shunt FETs 504 of FIG. 5A.

The relative capacitances of the MIM capacitors 502 are also shown in FIG. 5B. As shown in FIG. 5B, and similar to the DTC 400 of FIG. 4A, the DTC 500' of FIG. 5B uses a binary weighting scheme. Specifically, the least significant bit (LSB) FET 504' has an ON resistance of $R_{ON}$ and an OFF capacitance of $C_{OFF}$. Its associated and corresponding MIM capacitor 502' has a capacitance of $C_{MIM}$. The next significant bit FET 504" has an ON resistance of $R_{ON}/2$ and an OFF capacitance of $2C_{OFF}$. Its associated and corresponding MIM capacitor 502" has a capacitance of $2C_{MIM}$. The remainder of the DTC 500' is similarly binary weighted, with the most significant bit FET 504"" having an ON resistance of $R_{ON}/16$ and an OFF capacitance of $16C_{OFF}$. Its associated and corresponding MIM capacitor 502"" has a capacitance of $16C_{MIM}$. Although not shown in FIG. 5B, each of the MIM caps in reality have an inherent loss term that is associated with it. The MIM Q value is approximately 100.200. The inherent loss would be represented by a resistor shown in series with the MIM.

As noted in the description of FIG. 5B, the Q-factor (or Quality factor) of each significant bit sub-circuit of the DTC 500' (i.e., the ON resistance $R_{ON}$ and $C_{MIM}$ values for each of the MIM capacitor/shunting FET sub-circuits [e.g., the LSB FET 504' coupled in series with its corresponding and associated MIM capacitor 502'] shown in FIG. 5B) are identical. In addition, the total Q-factor of the DTC 500' is identical to the Q-factor of each sub-section of the DTC 500' when all of the shunting FETs (i.e., when all of the FETs 504', 504", 504'" . . . 504"") are turned on. As is well known, the Q-factor, or "Factor of Merit", of a device is a measure of "quality" of that device. It is often used to indicate the efficiency of a device or circuit (for example, it can be used to compare the frequency at which a system oscillates to the rate at which it dissipates its energy). As is well known, many of the present wireless telecommunication specifications impose strict Q-factor requirements on RF front end circuitry. For example, the RF front end circuitry must exhibit low loss and have a Q-factor typically in the 50-100 range.

In one embodiment, as described above with reference to the DTC 400 of FIG. 4A, the Q (or Quality-factors) of each sub-circuit section (i.e., the values of $R_{ON}$ and $C_{MIM}$) are identical because the DTC 500' is implemented using the above described unit cell design technique. As described above, in accordance with this design technique, an LSB significant bit sub-circuit 503' (i.e., defined herein as the LSB FET 504' coupled in series with the LSB MIM capacitor 502') comprises a unit cell design block. All next significant bit sub-circuits (e.g., the next significant bit sub-circuit 503" comprising the FET 504" and its associated and corresponding MIM capacitor 502") are implemented by instantiating (or replicating) the LSB sub-circuit 503' (which comprise the unit cell design block for the described DTC 500') as many times as required to achieve binary weighting. For example, the LSB sub-circuit 503' (LSB FET 504' coupled in series with the LSB MIM capacitor 502') is instantiated twice (i.e., it is replicated), and the two instantiations are coupled in parallel, to implement the next significant bit sub-circuit 503" (comprising the FET 504" and its associated and corresponding MIM capacitor 502"). The LSB sub-circuit is instantiated four times (and coupled in parallel) to implement the next significant bit sub-circuit comprising the FET 504'" and its associated and corresponding MIM capacitor 502'", and so on. Finally, as shown in FIG. 5B, the MSB significant bit sub-circuit 503"" comprises 16 instantiations of the LSB sub-circuit (and coupled in parallel).

087 In accordance with one embodiment of the present DTC method and apparatus, the DTC is designed in accordance with the following idealized design equations (Equations 1-4):

$$C_{min} = (2^{bits} - 1)\frac{C_{MIM} \cdot C_{OFF}}{C_{MIM} + C_{OFF}}; \quad \text{Equation 1}$$

$$C_{max} = (2^{bits} - 1)C_{MIM}; \quad \text{Equation 2}$$

$$\text{Tuning ratio} = \frac{C_{max}}{C_{min}} = 1 + \frac{C_{MIM}}{C_{OFF}}; \quad \text{Equation 3}$$

$$Q_{min} = \frac{1}{\omega C_{MIM} R_{ON}} = \frac{1}{\omega \cdot \left(\frac{C_{max}}{C_{min}} - 1\right) \cdot R_{ON} C_{OFF}}; \quad \text{Equation 4}$$

wherein Cmin comprises the minimum capacitance that can be produced by the DTC 500', Cmax comprises the maximum capacitance that can be produced by the DTC 500', "bits" represents the number of bits in the control word, Tuning ratio (also referred to herein as "Tuning range") comprises the range of capacitances over which the DTC can be tuned, and wherein Qmin comprises the minimum allowable Q factor of the DTC 500'. As those skilled in the electronics design arts shall recognize, in practice, the "non-ideal" Q-value of the MIM capacitors would need to be accounted for in Equation 4 above. However, Equation 4 comprises an "idealized" equation, so this non-ideal Q factor is not accounted for therein.

Figure 5D:
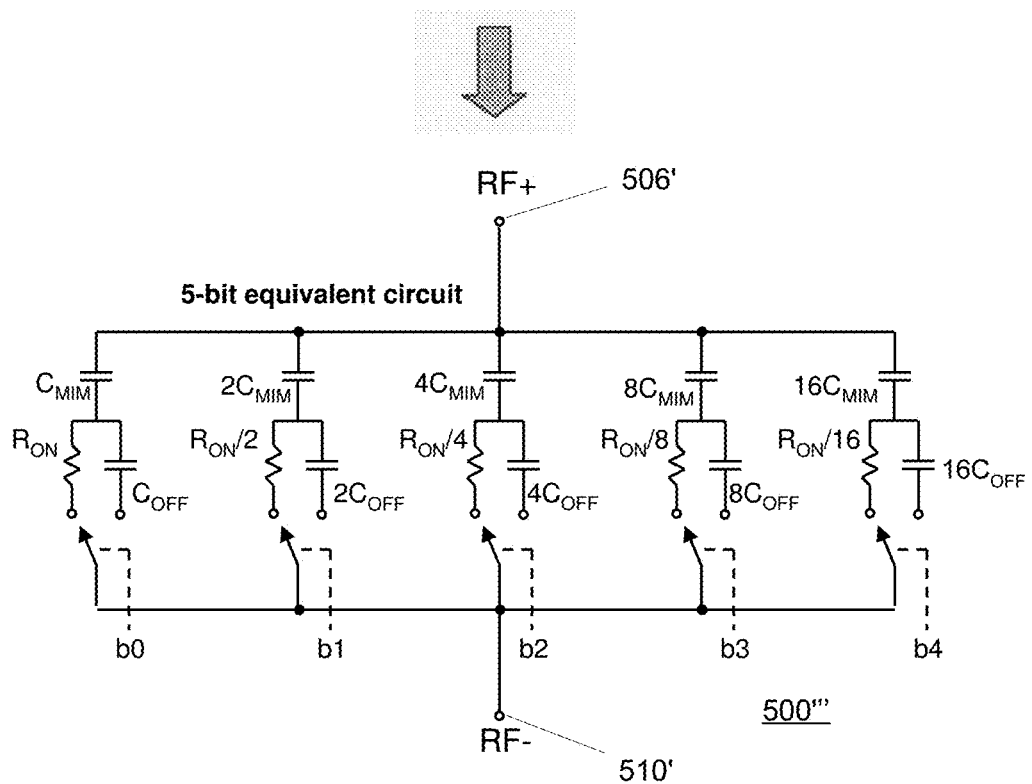
FIG. 5D is an equivalent circuit showing the ON resistances and OFF capacitances associated with the switching FETs of the DTC of FIG. 5C.

As noted briefly hereinabove, FIGS. 5C and 5D show generalized implementations of the DTC 500 (of FIG. 5A) and 500' (of FIG. 5B), respectively. The DTCs shown in FIGS. 5C and 5D function similarly to their respective DTC counterpart implementations, with the following important caveat. The DTC 500" of FIG. 5C (and the DTC 500'" of FIG. 5D) includes both an RF+ terminal 506' and an RF− terminal 510'. As described above with reference to the DTCs of FIGS. 4C and 4D, and as shown in the DTCs of FIGS. 5C and 5D, the DTC 500" (and DTC 500'" of FIG. 5D) digitally tunes or varies the capacitance between a first RF terminal (specifically, the RF+ terminal 506') and a second RF terminal (specifically, the RF− terminal 510'). The sign designations shown in the DTCs of FIGS. 5C and 5D, and associated with the first and second RF terminals (i.e., the "+" and "−" sign designations), merely indicate a top terminal (i.e., "RF+" 506') and a bottom terminal (i.e., "RF−" 510') of the generalized DTCs 500" and 500'". The RF+ terminal 506' is analogous to the terminal A 101 of the prior art switchable capacitor circuit 100 of FIG. 1, and it is also analogous to the RF+ terminal 412' of the DTC 400" and 400'". The RF− terminal 510' is analogous to the terminal B 103 of the prior art switchable capacitor circuit 100 of FIG. 1, and it is also analogous to the RF− terminal 410' of the DTC 400" and 400'". The RF+ 506' and RF− 510' terminals of the DTC 500" (and the DTC 500'" of FIG. 5D) may be coupled to any convenient port, terminal, load, or other circuit device, as required to meet design parameters and system requirements. In all other respects, the DTCs 500" and 500'" are implemented and operate similarly to their counterpart "grounded" DTC implementations of FIGS. 5A and 5B, and therefore no further description of these DTC implementations is set forth herein.

In one embodiment, the DTCs of the present teachings are implemented using UltraCMOS™ process technology. UltraCMOS™ comprises mixed-signal process technology that is a variation of silicon-on-insulator (SOI) technology on a sapphire substrate offering the performance of Gallium Arsenide ("GaAs") with the economy and integration of conventional CMOS. This technology delivers significant performance advantages over competing processes such as GaAs, SiGe BiCMOS and bulk silicon CMOS in applications where RF performance, low power and integration are paramount. This process technology is described in detail in several U.S. patents owned by the assignee of the present invention, including (but not limited to) U.S. Pat. No. 5,416,043, issuing on May 16, 1995; U.S. Pat. No. 5,492,857, issuing on Feb. 20, 1996; U.S. Pat. No. 5,572,040, issuing on Nov. 5, 1996; U.S. Pat. No. 5,596,205, issuing on Jan. 21, 1997; U.S. Pat. No. 5,600,169, issuing on Feb. 4, 1997; U.S. Pat. No. 5,663,570, issuing on Sep. 2, 1997; U.S. Pat. No. 5,861,336, issuing on Jan. 19, 1999; U.S. Pat. No. 5,863,823, issuing on Jan. 26, 1999; U.S. Pat. No. 5,883,396, issuing on Mar. 16, 1999; U.S. Pat. No. 5,895,957, issuing on Apr. 20, 1999; U.S. Pat. No. 5,930,638, issuing on Jul. 27, 1999; U.S. Pat. No. 5,973,363, issuing on Oct. 26, 1999; U.S. Pat. No. 5,973,382, issuing on Oct. 26, 1999; U.S. Pat. No. 6,057,555, issuing on May 2, 2000; U.S. Pat. No. 6,090,648, issuing on Jul. 18, 2000; U.S. Pat. No. 6,667,506, issuing on Dec. 23, 2003; U.S. Pat. No. 7,088,971, issuing on Aug. 8, 2006; U.S. Pat. No. 7,123,898, issuing on Oct. 17, 2006; and U.S. Pat. No. 7,248,120, issuing on Jul. 24, 2007. The above-cited present assignee owned patents are incorporated by reference herein as if set forth in full.

Implementing the DTCs of the present disclosure using the UltraCMOS™ process technology yields the following benefits and advantages as compared with the prior art tunable capacitor solutions: Binary-weighted switch FETs and MIM capacitors; Linear tuning curve; GSM/WCDMA compliant power handling (+35 dBm) and linearity (IMD3<−105 dBm) (this particular aspect is described in more detail below with reference to the figures that follow; also, it should be noted that this benefit is achievable due to the stacking FETs configuration, such stacking of FETs is not possible in bulk CMOS and is difficult in SOI implementations; however, it can be achieved using the present DTC teachings implemented in UltraCMOS, SOI and GaAs implementations); Integrated MIM capacitors, very good matching between the different MIM capacitors; No hysteresis (vs. BST solutions); No capacitance modulation with high power RF signal (vs. BST solutions); Standard control logic and VDD voltages (vs. BST/MEMS); Fast switching speed (approximately 1-3 µS); High reliability, manufacturability (vs. BST and MEMS prior art approaches); Flip-chip packaging option for low parasitic inductance; and Scaled back-end technology reduces the die area by 40%.

Although the DTC of the present application is described as being implemented in the above-cited UltraCMOS process technology, those skilled in the electronics arts shall appreciated that the DTC of the present teachings can also be implemented in any convenient integrated circuit process technology including, but not limited to, Silicon-on-Insulator (SOI) CMOS and GaAs process technology.

Figure 6A:
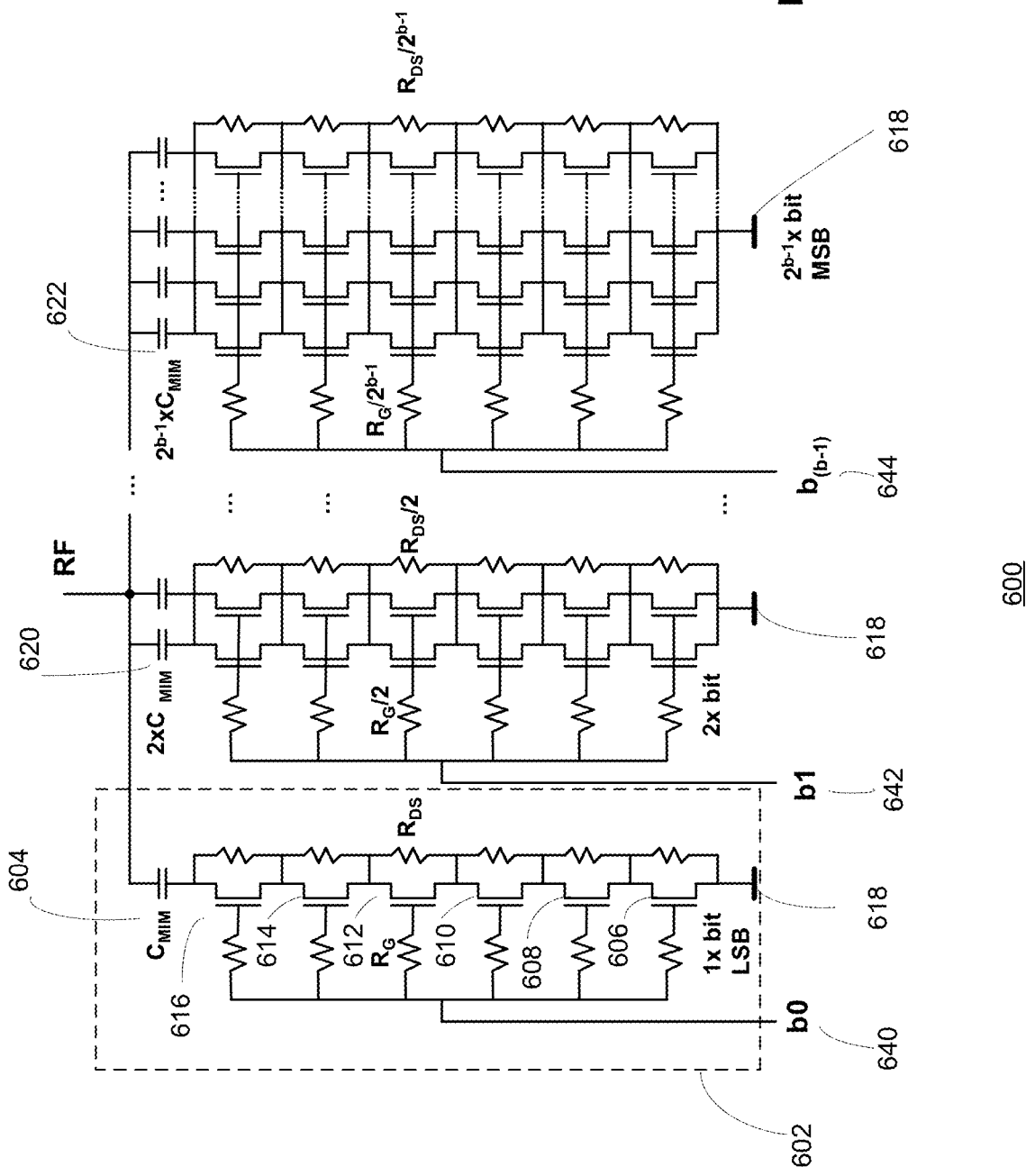
FIG. 6A shows design details of another embodiment of a DTC made in accordance with the present teachings; wherein the DTC is designed in accordance with a unit cell design block technique, and wherein the DTC includes a plurality of stacking FETs coupled in series with associated and corresponding MIM capacitors.

FIG. 6A shows another embodiment of a DTC 600 made in accordance with the present teachings. The DTC 600 of FIG. 6A teaches the use of stacking FETs which is necessary to meet high power requirements imposed by system standards. Nominally, in one exemplary embodiment, one FET can withstand Max_Vds=+2.54V RF voltage across its source and drain. Note that the specified Vds voltage across the FET refers to the RMS value and not the peak value of the voltage. In order to handle GSM power levels, in one embodiment the DTC would use a stack height of seven. The voltage handling in this example, then is equal to 7*2.54V=17.8V. The RF power handling in 50 ohm can be calculated based upon this value. When a MIM capacitor is placed on top of and in series with the FET stack, additional capacitive voltage division between Cmim and Coff of each FET occurs. If Cmim had the identical value as Coff, the stack height can be reduced by one FET (i.e., a stack-of-6 FETs plus one MIM, instead of stack-of-7). If the Cmim is smaller or larger than Coff, the effective power handling for the DTC can be calculated such that max_Vds (i.e., the maximum voltage that any FET in the FET stack can withstand) is not exceeded for each FET. The MIM capacitors can withstand much higher voltages than the FETs.

Figure 6B:
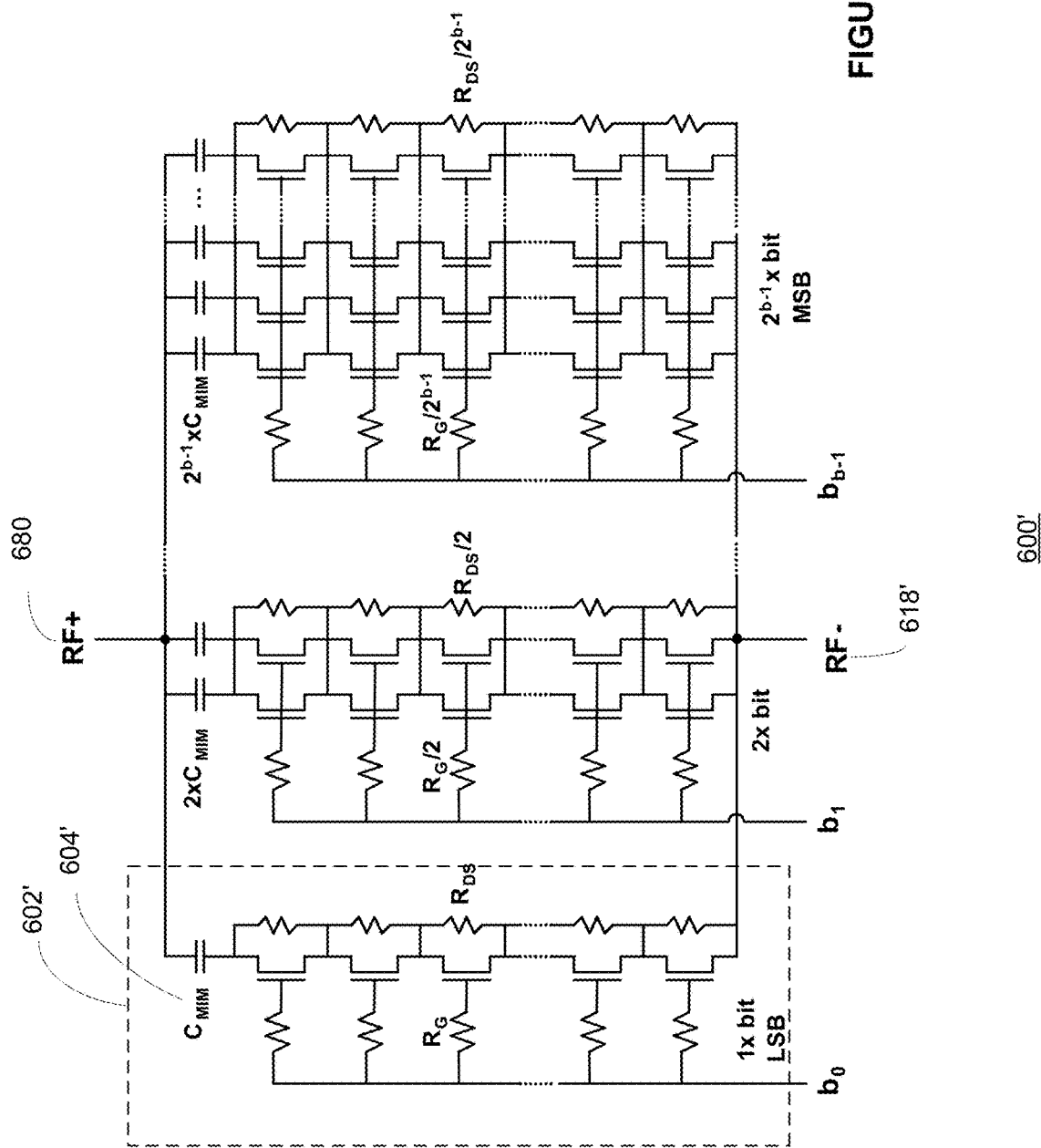
FIG. 6B shows design details of another embodiment of a DTC made in accordance with the present teachings; wherein the DTC comprises a more generalized version of the DTC of FIG. 6A and is designed in accordance with a unit cell design block technique, and wherein the DTC includes a plurality of stacking FETs coupled in series with associated and corresponding MIM capacitors.

The embodiments of the present DTCs shown in FIGS. 6A and 6B also teach design techniques including scaling of FETs, MIM capacitors, $R_{DS}$ and $R_G$ resistors to achieve the desired DTC functions. While the DTCs described above with reference to FIGS. 4A, 4C, and 5A-5D comprise simplified implementations, the DTCs of FIGS. 6A and 6B show more detailed and practical DTC implementations. As shown in FIG. 6A, for example, the DTC 600 comprises a plurality of stacked switching FETs coupled in series with associated and corresponding MIM capacitors. For example, in one embodiment, a least significant bit (LSB) sub-circuit 602 comprises a plurality of shunting FETs (in the examples shown in FIG. 6A the plurality comprises six shunting FETs) arranged in a stacked configuration, and coupled in series with a MIM capacitor 604. The stacked FETs (i.e., the FETs 606, 608, 610, 612, 614 and 616) are coupled together in series, and, in turn, the FET stack is coupled in series with the MIM capacitor 604. In one embodiment, the stacked FETs are implemented in accordance with a U.S. patent and pending patent applications owned by the assignee of the present patent application. More specifically, in accordance with this embodiment, the stacked FETs (e.g., the FETs 606-616) are implemented in accordance with U.S. Pat. No. 7,248,120, entitled "Stacked Transistor Method and Apparatus," issued to Burgener, et al., on Jul. 24, 2007; or in accordance with pending U.S. patent application Ser. No. 11/347,014, entitled "Symmetrically and Asymmetrically Stacked Transistor Grouping RF Switch", filed Feb. 3, 2006 in the name of Kelly, et al., or in accordance with pending U.S. patent application Ser. No. 11/501,125, entitled "Integrated RF Front End with Stacked Transistor Switch", filed Aug. 7, 2006 in the name of Burgener, et al. The above-cited U.S. patent (U.S. Pat. No. 7,248,120) and pending applications (application Ser. No. 11/347,014 and application Ser. No. 11/501,125) are incorporated by reference herein as if set forth in full.

As described in the above-incorporated patent and pending applications, the FET stacking configuration increases the power handling capabilities of the DTC 600. By increasing the number of stacked transistors in the stacked transistor groupings (i.e., by increasing the stacked FET "height"), the DTC 600 is able to withstand applied RF signals having increased power levels. The stacked FET configuration allows the DTC 600 to meet the stringent power handling requirements imposed by the GSM and WCDMA wireless telecommunication specifications. For example, the GSM and WCDMA specifications require power handling of approximately +35 dBm. Stacking the shunt FETs as shown in the least significant bit (LSB) sub-circuit 602 allows the DTC 600 to meet the high power handling requirements of the GSM and WCDMA specifications. The MIM capacitor 604 also drops some of the voltage across it which allows a reduction in the required FET stack height (i.e., it allows less stacked FETs to be used in order to meet the desired power handling requirements of the DTC 600).

In other embodiments, the least significant bit (LSB) sub-circuit 602 further includes a plurality of gate resistors ($R_G$) coupled to the gates of the stacked FETs and the least significant bit ($b_0$) of the control word. In these embodiments, the LSB sub-circuit 602 also includes a plurality of drain-to-source resistors ($R_{DS}$) configured as shown, wherein each $R_{DS}$ is coupled across the drain and source of its associated and corresponding shunting FET, and wherein the $R_{DS}$ resistors are coupled in series between the MIM capacitor 604 and a ground node 618. As described below in more detail with reference to the more generalized DTC 600' of FIG. 6B, the ground node 618 may be implemented as an RF− terminal (terminal 618' of FIG. 6B). The gate resistors ($R_G$) and drain-to-source resistors ($R_{DS}$) are required for biasing their associated and corresponding shunting FET devices. More specifically, the $R_G$ resistors are required as a consequence of the stacked FET configuration. Without stacking (i.e., stack "height"=1), the $R_G$ resistor could be eliminated. The $R_{DS}$ resistor is used with the "HARP" implementation described below in more detail. However, these resistors reduce the OFF-state Q-factor of the DTC 600. Larger gate resistors ($R_G$) and drain-to-source resistors ($R_{DS}$) can be used in order to improve the OFF-state Q-factor values. Unfortunately, increasing the size of these resistors also increases the integrated circuit die area occupied by the DTC 600. The switching time associated with the shunting FETs is also increased thereby.

Similar to the DTC 400 and 500' described above with reference to FIGS. 4A and 5B, respectively, in one embodiment, the DTC 600 is implemented using a unit cell design technique. Each significant bit sub-circuit of the DTC 600 is binary weighted similar to the binary weighting described above with reference to the DTCs 400 through 500'. As described above, in accordance with this design technique, the LSB sub-circuit 602 comprises a unit cell design block. As described above, in some embodiments the unit cell design block (i.e., the LSB sub-circuit 602) comprises at least the LSB stacked FETs 606-616, inclusive, coupled in series with the LSB MIM capacitor 604. In other embodiments, the unit cell design block also comprises the gate ($R_G$) resistors and drain-to-source ($R_{DS}$) resistors coupled as shown in the LSB sub-circuit 602 of FIG. 6.

As described above, in the embodiment of the DTC 600 shown in FIG. 6A, the LSB sub-circuit 602 comprises a unit cell design block. All next significant bit sub-circuits (e.g., the next significant bit sub-circuit controlled by the next significant bit $b_1$ of the control word) are implemented by instantiating (or replicating) the LSB sub-circuit 602 as many times as required to achieve the binary weighting. For example, the LSB sub-circuit 602 is instantiated twice (i.e., it is replicated), and coupled in parallel, to implement the next significant bit sub-circuit. The LSB sub-circuit is instantiated four times (and coupled in parallel) to implement the next significant bit sub-circuit (which is controlled by the next significant bit of the control word), and so on. Finally, as shown in FIG. 6A, the MSB most significant bit sub-circuit (which is controlled by the most significant bit (MSB) [$b_{(b-1)}$] of the control word, wherein "b" comprises the number of bits of the control word) is implemented by instantiating (or replicating) the LSB sub-circuit 602 $2^{b-1}$ times.

In the embodiments of the DTC 600 wherein the unit cell design block (i.e., the LSB sub-circuit 602) comprises only the stacked FETs (i.e., the FETs 606-616, inclusive) coupled in series with the MIM capacitor 604), while the LSB sub-circuit is instantiated as described above in implementing the next significant bit sub-circuits, the $R_{DS}$ and $R_G$ resistors are not so instantiated (or duplicated). Rather, in these embodiments (as shown in the DTCs 600 and 600' of FIGS. 6A and 6B, respectively), the $R_{DS}$ and $R_G$ resistors are scaled in half for each successive significant bit sub-circuit. For example, As shown in FIG. 6A, although the MIM capacitors (e.g., the MIM capacitors 604, 620, 622) are weighted similarly to the weighting of the analogous MIM capacitors of the DTC 500, 500' of FIGS. 5A and 5B, respectively, the gate resistors ($R_G$) and drain-to-source resistors ($R_{DS}$) have decreasing values (for increasing significant bit sub-circuits) similar to the ON resistances ($R_{ON}$) described above with reference to the DTC 500' of FIG. 5B. For example, the resistance of the gate resistors ($R_G$) of the sub-circuit that is controlled by control bit $b_1$ is ½ that of the resistance of the gate resistors of the LSB sub-circuit 602. Similarly, the resistance of the drain-to-source resistors ($R_{DS}$) of the sub-circuit that is controlled by control bit $b_1$ is ½ that of the resistance of the drain-to-source resistors ($R_{DS}$) of the LSB sub-circuit 602. The $R_G$ and $R_{DS}$ resistors for the next significant bit sub-circuits are weighted similarly. These embodiments of the DTC 600 (of FIG. 6A) and the DTC 600' (of FIG. 6B) significantly reduce the amount of integrated circuit die area required to implement the DTCs, and improves performance characteristics of the DTCs.

As noted briefly above, in another embodiment the DTC can be implemented in accordance with a thermometer weighting scheme. In accordance with this thermometer weighting embodiment, instead of binary weighting each of the successive significant bit sub-circuits (as implemented in the DTC 600 of FIG. 6A and the DTC 600' of FIG. 6B), a "thermometer coding" scheme is used, wherein the entire DTC comprises $2^n-1$ (31 for a 5 bit capacitance control word) identical unit cell design blocks (i.e., the LSB sub-circuit 602). In the thermometer coded embodiments of the DTC, the DTC has $2^n$ possible capacitance tuning states using $2^n-1$ identical unit cell design blocks. For example, if the digital control word comprises 5 bits, the thermometer coded embodiments of the DTC are implemented using 31 identical unit cell design blocks and have 32 possible capacitance tuning states.

The thermometer weighting advantageously results in a DTC having identical capacitance steps (i.e., the capacitance differential resulting between two adjacent states of the control word, such as between "00000" and "00001") and guaranteed monotonicity. In contrast, when a binary weighting scheme is used, different sized sub-circuits are switched ON and OFF depending on which state the DTC is in. For example, when switching between a capacitance control word of 01111 and 10000, the largest (MSB) sub-circuit is turned ON, and all other significant bit sub-circuits are turned OFF. If the capacitance tolerance is relatively poor, this can result in varying capacitance steps as compared to, for example, switching from 10000 to 10001. One disadvantage with using thermometer weighting is related to the physical sizes of the $R_{DS}$ and $R_G$ resistors. The 1×bit (LSB) unit cell comprises the largest sized $R_{DS}$ and $R_G$ resistors. Consequently, these resistors occupy a significant portion of integrated circuit die area. In contrast, the MSB bit sub-circuit occupies ¹⁄₁₆th of the area occupied by the 1×bit (LSB) unit cell. Consequently, implementing the DTC using thermometer weighting wastes much of the precious integrated circuit die area due to the space occupied by the $R_{DS}$ and $R_G$ resistors. In other embodiments, it is also possible to use a combination of binary weighting and thermometer coding, or any other convenient weighting scheme. The DTC of the present teachings contemplate use of any convenient weighting scheme, and these implementations fall within the scope and spirit of the present teachings.

Note that the MIM capacitors (i.e., the MIM capacitors 604, 620 and 622) are positioned on top of the stack of shunting FETs as shown in FIGS. 6A and 6B. From an RF perspective, the control lines (e.g., the control lines 640, 642 and 644) behave as if they are coupled to ground. Due to this aspect of the DTC 600 of FIG. 6A, it is better to position the MIM capacitors at the top, rather than at the bottom, of the FET stack in this implementation. When the MIM capacitors are positioned at the bottom of FET stack, the $R_G$ resistors are effectively placed in parallel with the MIM capacitors when the corresponding and associated FET is in the ON state. This configuration (placing the MIM capacitors at the bottom of their respective FET stacks) thereby reduces their associated Q-factor values. That being said, the present DTC teachings contemplate use of either configuration (i.e., MIM capacitors placed on top or bottom of the FET stack), and any such designs fall within the scope and spirit of the present DTC teachings.

Note that the MIM capacitors (i.e., the MIM capacitors 604, 620 and 622) are based on identical unit cells and therefore have excellent tolerance characteristics and matching between the different capacitors. In addition, the larger sized stacked FETs (i.e., those having more "fingers") have smaller ON resistances ($R_{ON}$) and larger OFF capacitance values ($C_{OFF}$) as compared to the smaller sized shunting FETs. The stacked FETs (i.e., the FETs 606-616) of the LSB sub-circuit 602 comprise the smallest sized FETs of the DTC 600. The LSB sub-circuit 602 also includes the smallest sized MIM capacitor, largest gate resistors ($R_G$) and largest drain-to-source resistors ($R_{DS}$). The switching time of the stacked FETs ((the gate resistance $R_G$)*(the gate capacitance $C_{GATE}$ of the FET)) are constant across all of the FETs in the DTC 600. In addition, the ON state Q-factor of the unit cell stack (i.e., the unit cell design block 602 of FIG. 6A) is dominated by the ON resistance ($R_{ON}$) of the stacked FETs (606-616) and the MIM capacitor 604 capacitance $C_{MIM}$.

FIG. 6B shows a more generalized version 600' of the DTC 600 described above with reference to FIG. 6A. As shown in FIG. 6B, the generalized DTC 600' includes a first RF terminal (an RF+ terminal 680) and a second RF terminal (an RF− terminal 618'). The RF+ terminal 680 is coupled to a first terminal of each of the MIM capacitors of each significant bit cell (for example, it is coupled to a first terminal of the MIM capacitor 604' of a least significant bit (LSB) sub-circuit 602' as shown in FIG. 6B. It is also coupled to first terminals of each of the other MIM capacitors as shown in FIG. 6B. The RF− terminal 618' is coupled as shown to the bottom FETs of the FET stacks of each significant bit sub-circuit of the DTC (i.e., it is coupled to the drains of the bottom FET of each FET stack). The RF− terminal 618' therefore supplants the ground terminal 618 of the DTC 600 described above with reference to FIG. 6A. The DTC 600' is also generalized in the sense that it allows for any desired number of stacked FETs to be used to implement the LSB sub-circuit 602' (whereas the DTC 600 of FIG. 6A uses six stacked FETs). In all other respects, the DTC 600' of FIG. 6B is implemented and functions similarly to the DTC 600 described above with reference to FIG. 6A, and it is therefore not described in more detail herein.

Similarly to the operation of the DTCs described above with reference to the DTCs of FIGS. 4A-5D, a digital control word is applied to the DTCs 600 and 600' to selectively control the switching operation of each of the significant bit sub-circuits of the DTCs 600 and 600'. The control word bits are ordered from a least significant bit (LSB) (i.e., $b_0$) to a most significant bit (MSB) (i.e., $b_{(b-1)}$, wherein b comprises the number of control word bits). As shown in FIGS. 6A and 6B, each significant bit of the control word is coupled to an associated and corresponding significant bit sub-circuit. For example, as shown in FIG. 6A, the LSB $b_0$ of the control word is coupled via the gate resistors $R_G$ to the gates of the LSB sub-circuit 602 FET stack (i.e., it is coupled to control the gates of the stacked FETs 606-616). The next significant bit (i.e., $b_1$) of the control word is similarly coupled via the gate resistors $R_G/2$ to the gates of the next significant bit sub-circuit FET stack, thereby controlling the switching operation of the next significant bit sub-circuit, and so on. Finally, the MSB $b_{(b-1)}$ of the control word is coupled via the gate resistors $R_G/2^{b-1}$ to the gates of the MSB significant bit sub-circuit FET stack, thereby controlling the switching operation of the MSB sub-circuit.

In one embodiment of the DTCs 600 and 600', the FET stacks are turned ON (e.g., the stacked FETs 606-616 of the LSB sub-circuit 602 are switched to an ON state) by applying a positive voltage at their associated and corresponding control bits (e.g., LSB control bit $b_0$ 640). For example, in one exemplary embodiment, the control bits apply a positive voltage of +2.75 volts to turn ON their associated and corresponding FET stacks. Although many prior art examples use 0V (i.e., ground) to turn OFF FET devices, in order to achieve improved linearity, the present implementation turns OFF the FET stacks by applying a negative voltage on their associated and corresponding control bits. For example, in one exemplary embodiment, the control bits apply a −3.4V signal to turn OFF their associated and corresponding FET stacks. The more negative the control voltage is, the better the linearity characteristics of the FETs in the FET stacks. However, the applied control bit voltage should not be allowed to become too negative as it might then exceed the maximum voltage limits of the FETs used in implementing the FET stacks. In some embodiments, the negative voltages are generated by a Negative Voltage Generator which may be integrated on the same integrated circuit die as are the DTCs.

In addition to the Negative Voltage Generator noted above, the integrated circuit die within which the DTCs are implemented may also include Serial Interfaces and ESD protection circuits. The DTCs may, in some embodiments, be coupled to any and all of these devices, thus allowing for the integration of additional functions on the same die as the DTC. In addition, a single integrated circuit die may contain multiple DTCs, and the DTCs may be coupled to any and all of the multiple DTCs to achieve desired circuit and system requirements. In some embodiments, the multiple DTCs are completely separate and unconnected to each other. Alternatively, the multiple DTCs may be configured in a series shunt configuration. Further, in other embodiments, the DTCs may all be configured in a shunt configuration.

Figure 7A:
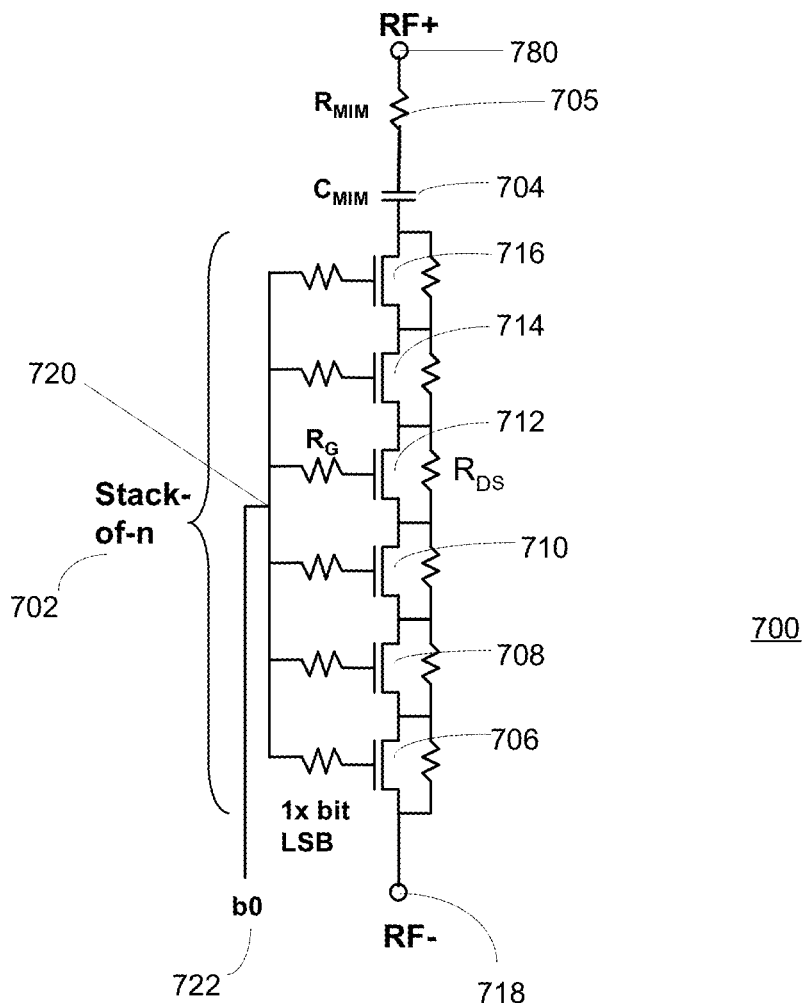
FIG. 7A is a schematic of a generalized unit cell design block (an LSB sub-circuit) that is used to implement a DTC in accordance with the present teachings.

FIG. 7A is a circuit schematic showing design details of a generalized unit cell design block 700 that is analogous to the unit cell (i.e., the least significant bit (LSB) sub-circuit 602 described above with reference to FIG. 6A, and more accurately, the LSB sub-circuit 602' described above with reference to the DTC 600' of FIG. 6B). As described above in more detail, the unit cell design block is used to implement many embodiments of the DTC in accordance with the present teachings. As shown in FIG. 7A, one embodiment of the unit cell 700 comprises a stack of n shunting FETs 702, wherein the stack 702 is coupled in series with a MIM capacitor 704. The individual shunting FETs of the FET stack (i.e., the FETs 706, 708, 710, 712, 714 and 716) are coupled together in series, and the entire FET stack is coupled in series to a first terminal of the MIM capacitor 704. A second terminal of the MIM capacitor 704 is shown coupled to a resistor, shown in FIG. 7A as $R_{MIM}$ 705. In this embodiment, the resistor $R_{MIM}$ 705 comprises an Equivalent Series Resistance (ESR) of the MIM capacitor 704. The MIM capacitor 704 is depicted in FIG. 7A as being coupled to a first RF terminal (i.e., an RF+ terminal 780) via its associated $R_{MIM}$ resistor 705.

The unit cell 700 also includes n drain-to-source resistors ($R_{DS}$) configured as shown, wherein each $R_{DS}$ is coupled across the drain and source of an associated and corresponding shunting FET, and wherein the $R_{DS}$ resistors are coupled in series between the first terminal of the MIM capacitor 704 and a second RF terminal (i.e., an RF− terminal 718). The unit cell 700 also includes n gate resistors $R_G$ coupled to the gates of their associated and corresponding switching FETs. The n gate resistors $R_G$ are coupled together at a node 720, wherein the node 720 is controlled by a control bit (e.g., the LSB control bit $b_0$ 722 of the control word). In most embodiments, the operation of the unit cell is controlled by the LSB control bit of the control word as shown in FIG. 7A. As described above with reference to the DTC 600 and DTC 600' of FIGS. 6A and 6B, respectively, the unit cell is used to implement the remaining significant bit sub-circuits of the DTC. Using the unit cell approach, the tolerances and values of the various components are very well matched, if not identical.

As described above with reference to the DTC 600 of FIG. 6A, the gate resistors ($R_G$) and drain-to-source resistors ($R_{DS}$) are required for biasing their associated and corresponding shunting FET devices. However, these resistors reduce the OFF-state Q-factor value of the DTC. Larger gate resistors ($R_G$) and drain-to-source resistors ($R_{DS}$) can be used in order to improve the OFF-state Q-factor values. Unfortunately, increasing the size of these resistors also increases the integrated circuit die area required to implement the DTC.

Figure 7B:
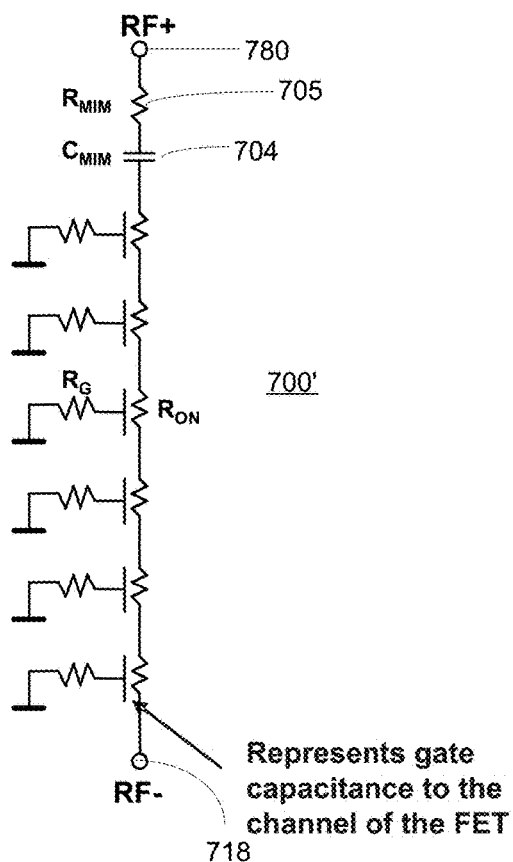
FIG. 7B is a schematic of an ON state RF equivalent circuit of the unit cell design block of FIG. 7A.
Figure 7C:
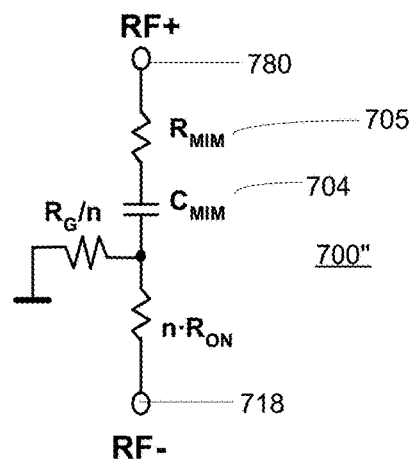
FIG. 7C is a schematic of a simplified equivalent circuit of the ON state RF equivalent circuit of FIG. 7B.
Figure 7D:
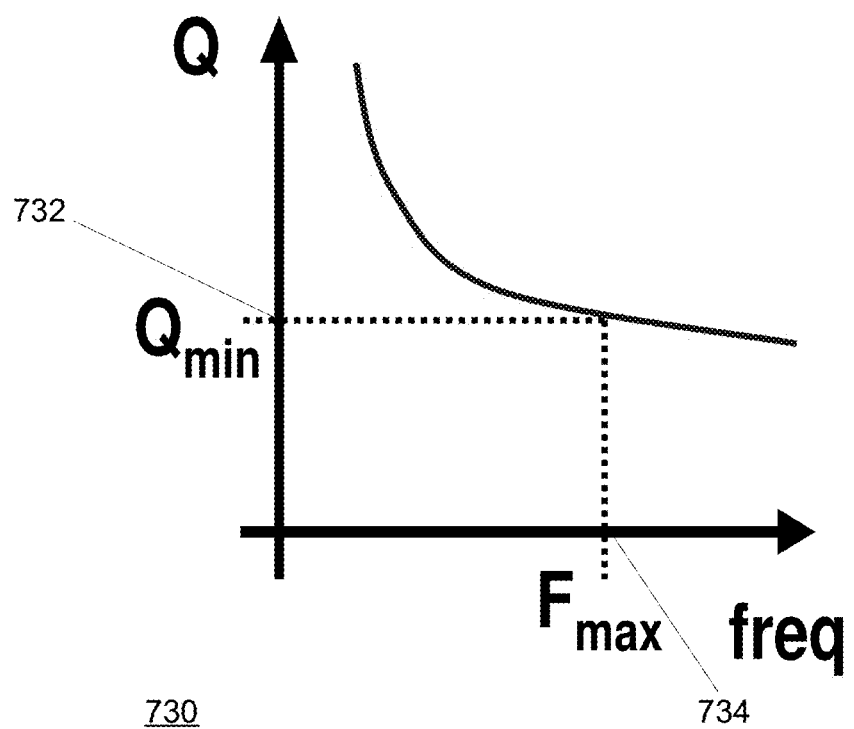
FIG. 7D is a plot showing the Q vs. freq curve for the unit cell design block of FIGS. 7A-7C.

FIG. 7B shows a schematic of an ON state RF equivalent circuit 700' of the unit cell 700 described above with reference to FIG. 7A. The ON state RF equivalent circuit 700' comprises the state of the unit cell 700 wherein all of the shunting FETs (i.e., the shunt FETs 706-716, inclusive) are turned ON (i.e., wherein the LSB control bit $b_0$ 722 is in a state that causes all of the shunt FETs to turn ON). FIG. 7C shows a schematic of a simplified equivalent circuit 700'' of the ON state RF equivalent circuit 700' of FIG. 7B. As shown in FIGS. 7B and 7C, when the unit cell 700 is in an ON state, the equivalent resistance between the RF+ 780 and RF− 718 terminals comprises n*$R_{ON}$ (i.e., the ON resistance $R_{ON}$ of one of the FETs in the stack), added to the $R_{MIM}$ 705 resistor value (i.e., the Equivalent Series Resistance of the MIM capacitor 704). The FET on-resistance ($R_{ON}$) and $R_{MIM}$ 705 determine the Q-factor value of the unit cell stack when the unit cell 700 is in an ON state (i.e., the "$Q_{ON}$" of the unit cell). As shown in the graph 730 of FIG. 7D, the $Q_{ON}$ value is proportional to 1/freq (wherein "freq" comprises the frequency of the signal applied to the unit cell). The $Q_{ON}$ of the unit cell (shown along the y axis of the graph 730) decreases as the frequency (freq) of the applied signal (shown along the x axis of the graph 730) increases. In some embodiments, the ON resistance $R_{ON}$ is selected to meet the minimum Q-factor specification (Qmin 732) at the highest operating frequency ($F_{max}$, also referred to herein as "$f_{MAX}$", 734) of the applied signal. Equation 5a, set forth below, shows the mathematical relationship of ON-state $Q_{ON}$, f (frequency), $C_{MIM}$, $R_{MIM}$, n, $R_G$ and $R_{ON}$, when driving RF+ terminal while RF− terminal is coupled to ground (preferred).

$$Q_{ON}^{+} = \frac{1}{2\pi f \cdot C_{MIM}\left(R_{MIM} + \frac{1}{\frac{1}{n \cdot R_{ON}} + \frac{n}{R_G}}\right)} \quad \text{Equation 5a}$$

Equation 5b, set forth below, shows the mathematical relationship of ON-state $Q_{ON}$, f, $C_{MIM}$, $R_{MIM}$, n, $R_G$ and $R_{ON}$, when driving the RF− terminal and while the RF+ terminal is coupled to ground. In this case the Q value is degraded as the $R_G$ is now effectively in parallel with $C_{MIM}$. Hence it is preferred that the RF− terminal is coupled to ground, instead of the RF+ terminal.

$$Q_{ON}^{-} = \frac{1}{2\pi f \cdot C_{MIM}\left(\frac{n}{R_G(2\pi f \cdot C_{MIM})^2} + R_{MIM} + n \cdot R_{ON}\right)} \quad \text{Equation 5b}$$

As will be appreciated by those skilled in the electronic design arts, the equations set forth above (i.e., Equations 5a and 5b) allows the DTC to be designed to meet a given Q-factor that is required by a system specification or standard (e.g., as required by a wireless telecommunications standard such as WCDMA). For a given Q-factor (i.e., for a given $Q_{ON}$ value) and a given maximum operating frequency (i.e., for a given $f_{MAX}$), the DTC designer may determine the $C_{MIM}$, $R_{MIM}$, n, $R_G$ and $R_{ON}$ values for the unit cell in accordance with Equations 5a and 5b.

Figure 7F:
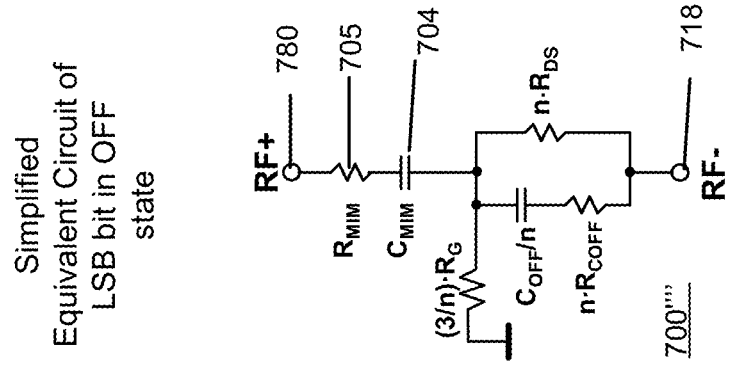
FIG. 7F is a schematic of a simplified equivalent circuit of the OFF state RF equivalent circuit of FIG. 7E.
Figure 7E:
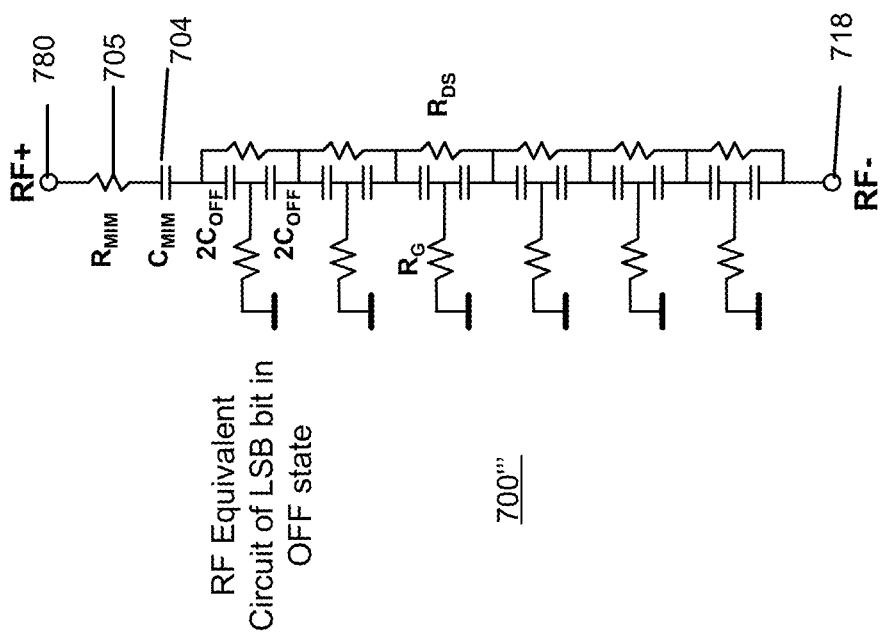
FIG. 7E is a schematic of an OFF state RF equivalent circuit of the unit cell design block of FIG. 7A.

FIG. 7E shows a schematic of an OFF state RF equivalent circuit 700''' of the unit cell 700 described above with reference to FIG. 7A. The OFF state RF equivalent circuit 700''' comprises the state of the unit cell 700 wherein all of the shunting FETs (i.e., the stacked shunting FETs 706-716, inclusive) are turned OFF (i.e., wherein the LSB control bit $b_0$ 722 is in a state that causes all of the shunting FETs to turn OFF). FIG. 7F shows a schematic of a simplified equivalent circuit 700'''' of the OFF state RF equivalent circuit 700''' of FIG. 7E. As shown in FIGS. 7E and 7F, when the unit cell 700 is in an OFF state, the equivalent resistance between the first RF terminal (i.e., the RF+ terminal 780) and the second RF terminal (i.e., the RF− terminal 718) is determined by many factors, including the following: $R_{MIM}$ (the Equivalent Series Resistance (ESR) of the MIM capacitor 704); n*$R_{DS}$ (i.e., the total resistance value of all of the drain-to-source resistors $R_{DS}$ coupled in series); n*$R_{COFF}$, wherein n comprises the number of FETs in the stack and wherein $R_{COFF}$ comprises an Equivalent Series Resistance (ESR) of the FET OFF capacitance $C_{OFF}$; and the value of (3/n)*$R_G$, wherein $R_G$ comprises the resistance value of a gate resistor.

Figure 7G:
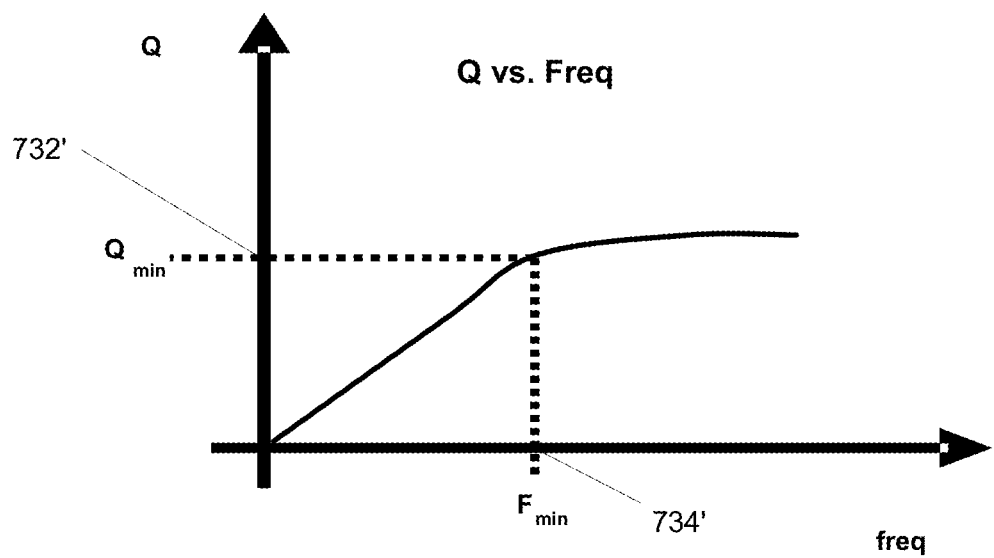
FIG. 7G is a plot showing the QOFF vs. freq for the OFF state RF equivalent circuit of FIG. 7E.

The resistance values of the drain-to-source and gate resistors, $R_{DS}$ and $R_G$, respectively, aid in determining the Q-factor value of the unit cell stack when the unit cell 700 operates in an OFF state (i.e., the "$Q_{OFF}$" of the unit cell 700). As shown in the graph of FIG. 7G, for example, for applied signal frequencies ranging from DC to a minimum Frequency ($F_{min}$), the $Q_{OFF}$ value is approximately linearly proportional to the frequency (shown as 'freq' in the graph of FIG. 7G) of the signal applied to the unit cell 700. As shown in the graph of FIG. 7G, the $Q_{OFF}$ value increases approximately linearly as the frequency applied to the unit cell 700 increases from DC to $F_{min}$. The Q factor then "flattens" or levels out as the applied signal frequency increases beyond $F_{min}$. In some embodiments, the drain-to-source $R_{DS}$ and gate $R_G$ resistance values are selected to meet the minimum Q-factor specification (Qmin 732') at the lowest operating frequency ($F_{min}$, also referred to herein as "$f_{MIN}$", 734') of the applied signal. Equation 6a, set forth below, shows the mathematical relationship of OFF-state $Q_{OFF}$, f (frequency), $C_{MIM}$, $R_{MIM}$, n, $R_G$, $R_{DS}$, $C_{OFF}$ and $R_{COFF}$, when driving the RF+ terminal and while the RF− terminal is coupled to ground.

$$Q_{OFF}^+ = \frac{\frac{1}{C_{MIM}} + \frac{n}{C_{OFF}}}{2\pi f \cdot \left( \frac{n^3}{3R_G(2\pi f \cdot C_{OFF})^2} + \frac{n}{R_{DS}(2\pi f \cdot C_{OFF})^2} + R_{MIM} + n \cdot R_{COFF} \right)} \quad \text{Equation 6a}$$

Equation 6b, set forth below, shows the mathematical relationship of OFF-state $Q_{OFF}$, f (frequency), $C_{MIM}$, $R_{MIM}$, n, $R_G$, $R_{DS}$, $C_{OFF}$ and $R_{COFF}$, when driving the RF− terminal and while coupling the RF+ terminal to ground.

$$Q_{OFF}^- = \frac{\frac{1}{C_{MIM}} + \frac{n}{C_{OFF}}}{2\pi f \cdot \left( \frac{n}{3R_G(2\pi f \cdot C_{MIM})^2} + \frac{n}{R_{DS}(2\pi f \cdot C_{OFF})^2} + R_{MIM} + n \cdot R_{COFF} \right)} \quad \text{Equation 6b}$$

Exemplary component values for the equations set forth above comprise the following:

$R_{ON}$=2.14 Ω
$R_{MIM}$=12.6Ω
$C_{MIM}$=100e−15 F
$R_{DS}$=277e3Ω
$R_G$=1106e3Ω
$C_{OFF}$=280e−15 F
$R_{COFF}$=7 Ω
n=6

As will be appreciated by those skilled in the electronic design arts, the equation set forth above (i.e., Equation 6) allows the DTC to be designed to meet a given Q-factor that is required by a specification (e.g., as required by a wireless telecommunications standard such as WCDMA). For a given Q-factor (i.e., for a given $Q_{OFF}$ value) and a given minimum operating frequency (i.e., for a given $f_{MIN}$), the DTC designer may select $C_{MIM}$, $R_{MIM}$, $C_{OFF}$, $R_{COFF}$, n, $R_{DS}$, and $R_G$ values for the unit cell. Typically $R_{DS}$ is set equal to $R_G/n$, wherein n comprises the stack height (i.e., the number of FETs in the stack). However, those skilled in the electronic design arts shall recognize that other values can be selected for the gate and drain-to-source resistors without departing from the scope or spirit of the present disclosure.

Figure 2A:
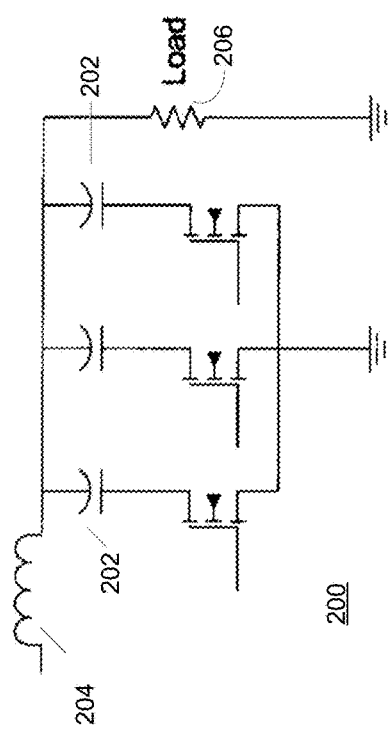
FIGS. 2A and 2B are schematics of exemplary prior art tunable matching networks comprising banks of shunt capacitors coupled to respective inductors and a load.
Figure 2B:
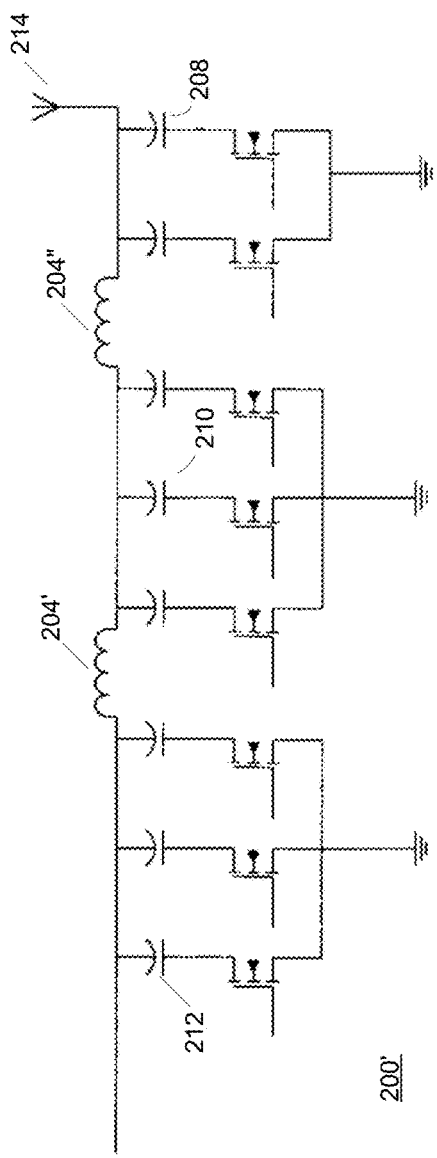
Figure 3:
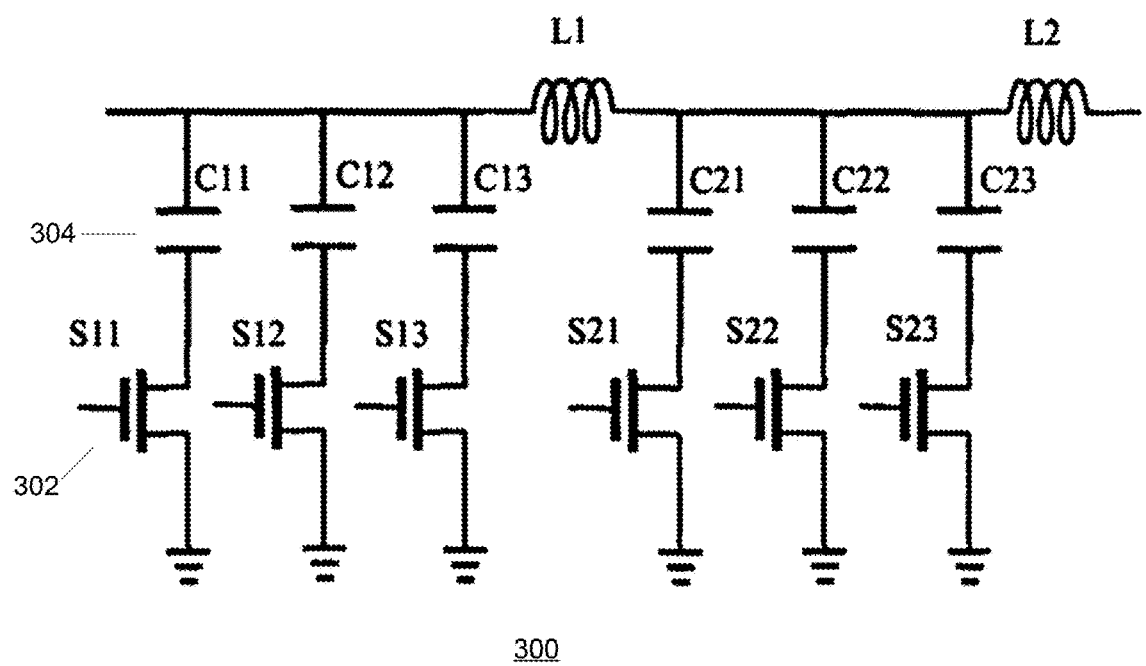
FIG. 3 is a schematic of another exemplary prior art tunable matching circuit comprising a stack of six transistors which provide 64 ($2^6$) possible capacitor states.

As described above with reference to FIGS. 4A, 5A-5D, 6A and 6B, and 7A-7G, DTCs implemented in accordance with the present disclosed unit cell design technique provide significant advantages as compared with the prior art tunable capacitor solutions. Because the DTC is fabricated using the LSB sub-circuit as the unit cell, and because the unit cell comprises a fundamental building block, and because all other significant bit sub-circuits comprise replicated versions of this fundamental building block, the tolerances and Q-factors of the various sub-circuits (and their components) are very well matched, and, in some cases, are identical. This aspect is in stark contrast with the prior art solutions such as the tunable matching circuits described above with reference to FIGS. 1-3, wherein the tolerances and Q-factors of the switched capacitor circuits were not well matched, and clearly not identical. The unit cell technique also advantageously facilitates a scalable design that can be replicated to achieve almost any tuning ratio. The stacked FET configuration comprising a stack of n FETs allows the DTC to meet a desired power handling specification. The DTC designer can adjust n accordingly to meet the power handling requirements. If the DTC needs to handle less power, the number of FETs in the stack can be decreased (thereby saving precious integrated circuit real estate). In contrast, if the power handling capabilities of the DTC need to be increased, n may also be increased accordingly. As described above with reference to FIGS. 7A-7G, the various components and electrical characteristics of the unit cell can be selected by the DTC designer to accommodate almost any desired Q-factor for a given operating frequency range.

Figure 7H:
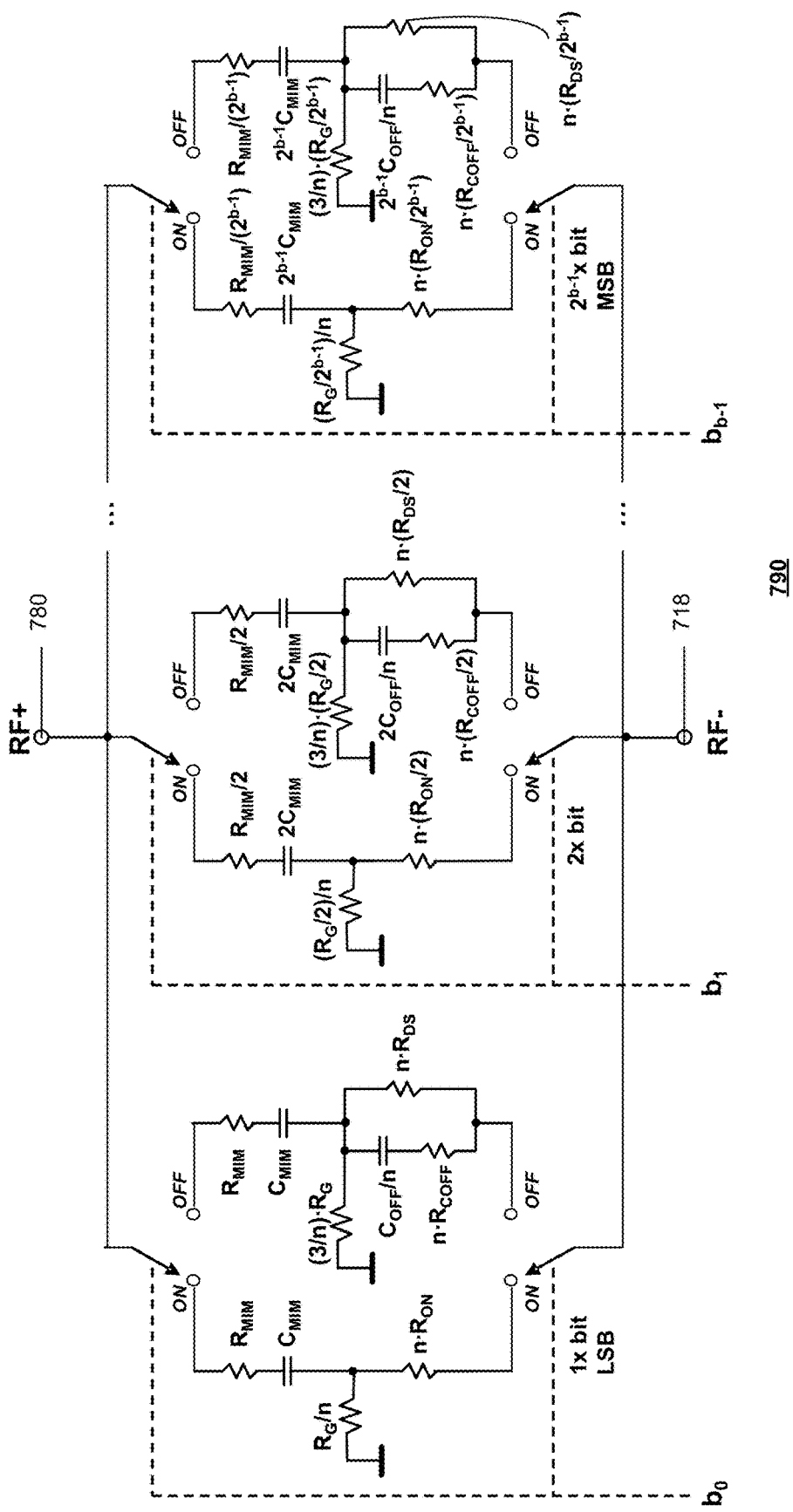
FIG. 7H shows a simplified equivalent circuit of a fully implemented and complete DTC using the design principles and concepts described with reference to FIGS. 7A-7G.

FIG. 7H shows a simplified equivalent circuit of a fully implemented and complete DTC 790 using the design principles and concepts described above with reference to FIGS. 7A-7G. The equivalent circuit of the completed DTC 790 is produced using the generalized unit cell 700 design block described above with reference to FIG. 7A, and by coupling the equivalent circuits described above with reference to FIGS. 7B-7C and 7E-7F in a manner that reflects the OFF and ON states of each significant bit sub-circuit. Specifically, the fully implemented and complete equivalent circuit 790 of FIG. 7H is created by using the equivalent circuits described above with reference to FIGS. 7C and 7F. As indicated by switch arrows shown in FIG. 7H, either of the above-described ON or OFF equivalent circuits are coupled between the RF+ terminal 780 and RF− terminal 718. This switching is controlled by the digital control word applied to the DTC 790. Depending on whether a selected significant bit is turned ON or OFF, either one of these circuits is placed between RF+ and RF− terminals, as shown by the arrow "switch" arrow symbols.

Figure 7I:
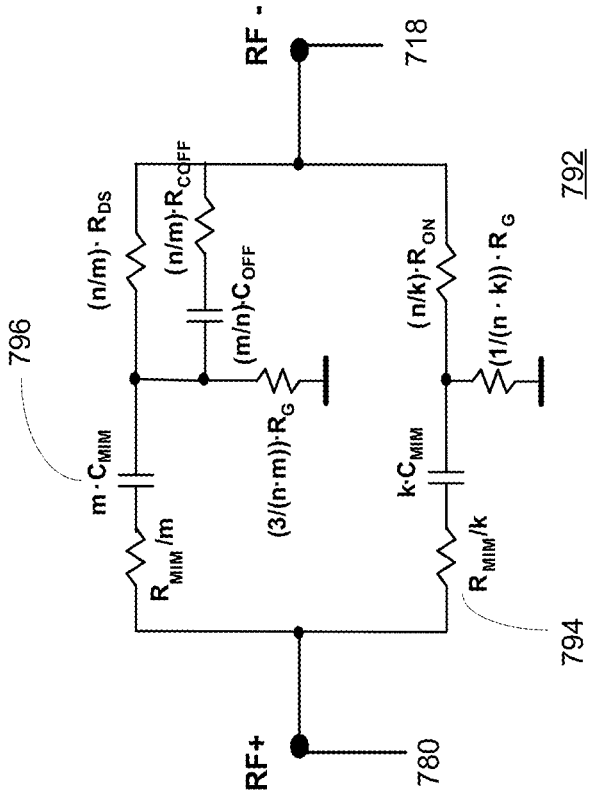
FIG. 7I shows a simplified equivalent circuit of the fully implemented and complete DTC of FIG. 7H.

FIG. 7I shows a simplified equivalent circuit 792 of the fully implemented and complete DTC 790 described above with reference to FIG. 7H. The simplified equivalent circuit 792 teaches how to derive a complete and accurate equivalent circuit useful in modeling the complete DTC 790 across all possible tunable states of the DTC. For example, for a 5 bit DTC 790, the DTC 790 may have 32 distinct tunable states. That is, such a DTC can produce 32 distinct tunable capacitance states between the RF+ terminal 780 and the RF− terminal 718 (e.g., numbered such that the states range between a tuning state 0 through a tuning state 31). The values of each of the equivalent resistors and capacitors used to implement the simplified equivalent circuit 792 are determined in accordance with the mathematical formulae set forth in FIG. 7I, wherein each mathematical formula is shown in FIG. 7I adjacent to its corresponding and associated component. For example, an equivalent $R_{MIM}/k$ resistor 794 value is determined in accordance with the mathematical formula shown adjacent to the resistor 794 in FIG. 7I (i.e., it is equal to the value of $R_{MIM}/k$, wherein k is selected tunable state of the DTC 792 (or the "decimal equivalent" of the binary digital control word applied to control the DTC 792). Similarly, the capacitance value of an equivalent $m*C_{MIM}$ capacitor 796 is determined in accordance with the associated and corresponding mathematical expression shown adjacent to the capacitor 796 in FIG. 7I (i.e., it is determined in accordance with the mathematical expression of $(m*C_{MIM})$, wherein $m=(2^b-1)-k$; k is the selected tunable state of the DTC 792, and b is the number of DTC control bits. The values of the remaining equivalent circuit components are similarly determined in accordance to their associated and corresponding mathematical expressions as set forth in FIG. 7I. The definition of the terms used in the mathematical expressions of FIG. 7I are described above in detail with reference to FIGS. 7A-7H. Exemplary values for some of these terms are also set forth in FIG. 7I. These exemplary values are identical to those described above with reference to Equations 6a and 6b.

Figure 7J:
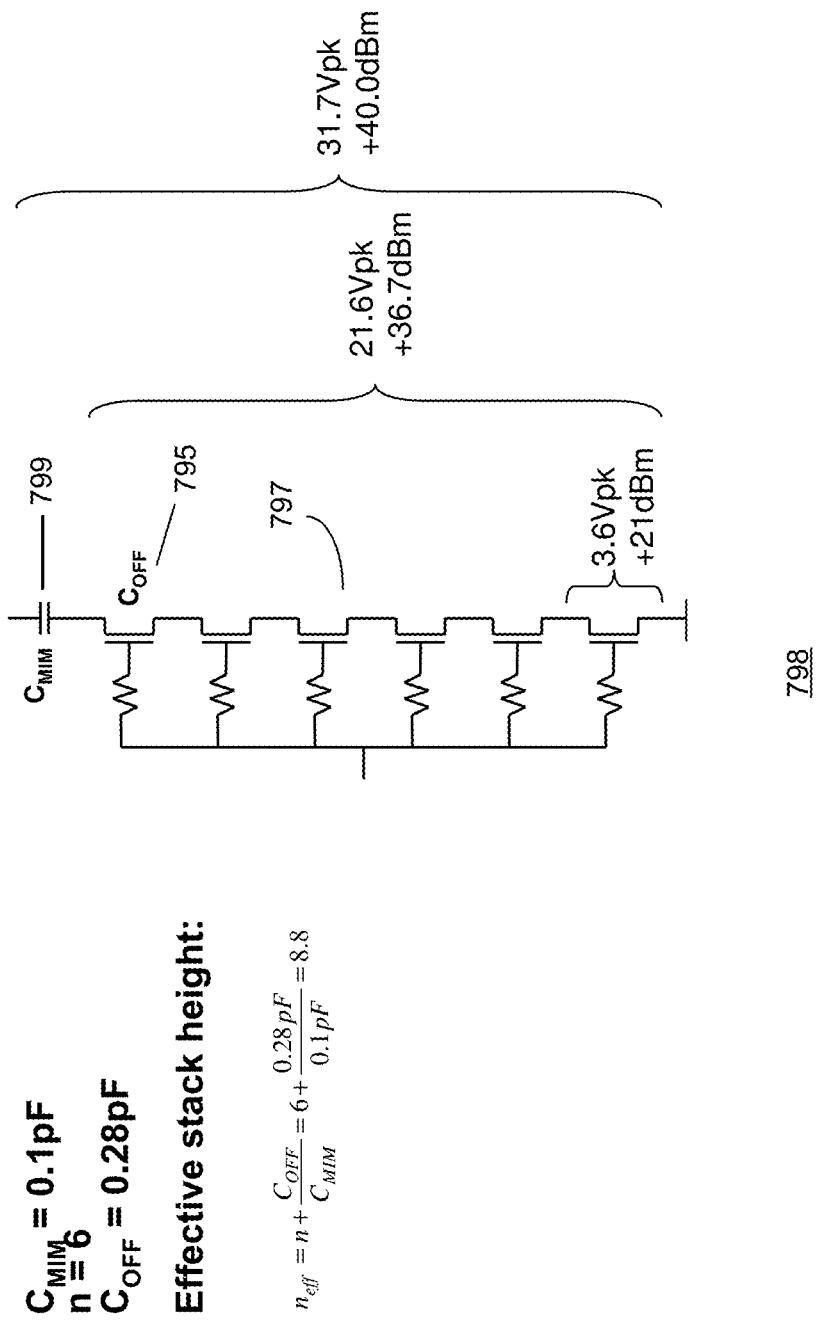
FIG. 7J shows a simplified schematic of a FET stack showing how an effective FET stack height is achieved using the present teachings, wherein the effective stack height exceeds the actual stack height of the present DTC.

As described above with reference to the DTC implementations of FIGS. 6A, 6B, and FIGS. 7A-7I, DTCs made in accordance with the present teachings are implemented using an arrangement of stacked FETs. The stacked FETs aid the present DTCs in meeting high power requirements imposed by system standards. FIG. 7J shows how an "effective" FET stack "height" (i.e., the effective number of FETs in a FET stack) is achieved using the present teachings, wherein the effective stack height exceeds the actual stack height of the DTC (i.e., wherein the actual stack height equals the number of FETs used in implementing the FET stack). The circuit 798 of FIG. 7J shows how the power handling of the DTC is increased by using FET stacking and by positioning the MIM capacitor 799 at the top of the FET stack 797. Due to the voltage division that occurs between the MIM capacitor 799 and the FET stack 797 when the stacked FETs are turned OFF, the effective stack height ($n_{eff}$) is thereby increased beyond the actual FET stack height. This further increases the DTC power handling as shown in the circuit of FIG. 7J. For this example, the stack height for FETs is 6, but the effective stack height due to the MIM capacitor is 8.8.

As shown in FIG. 7J, the effective stack height ($n_{eff}$) may be calculated in accordance with the following mathematical expression:

$$n_{eff} = n + \frac{C_{OFF}}{C_{MIM}} = 6 + \frac{0.28 \text{ pF}}{0.1 \text{ pF}} = 8.8;$$

wherein $n_{eff}$ comprises the effective stack height, n comprises the number of FETs in the stack, $C_{MIM}$ comprises the capacitance value of the MIM capacitor 799, and $C_{OFF}$ comprises the OFF capacitance of a single FET of the FET stack 797 such as FET 795. As described above, given the exemplary values set forth in FIG. 7J, the effective stack height is 8.8, while the actual stack height is 6.

Table 1 below shows exemplary design characteristics for an exemplary 1 GHz DTC and 2 GHz DTC made in accordance with the present disclosure. As shown in Table 1, in the embodiment shown, the exemplary 1 GHz DTC uses a 5 bit control word and six stacked FETs. The exemplary 2 GHz DTC uses a 5 bit control word and five stacked FETs. The total area occupied by the exemplary 1 GHz DTC is 0.886 mm², and the total area occupied by the exemplary 2 GHz DTC is 0.402 mm².

TABLE 1

| | 1 GHz DTC capacitor TR 25-Nov-07 | | | 2 GHz DTC capacitor TR 25-Nov-07 | |
|---|---|---|---|---|---|
| Inputs: | | | Inputs: | | |
| CMIM | 0.25 | [pF] | CMIM | 0.1 | [pF] |
| COFF | 0.073333 | [pF] | COFF | 0.048 | [pF] |
| Bits | 5 | | Bits | 5 | |
| Stack | 6 | | Stack | 6 | |
| RonCoff | 0.6 | [pF * ohm] | RonCoff | 0.6 | [pF * ohm] |
| Fet_area | 0.0064 | [mm2], 1 ohm single fet | Fet_area | 0.0064 | [mm2], 1 ohm single fet |
| MIM_area | 0.0017 | [mm2], 1 pF cap | MIM_area | 0.0017 | [mm2], 1 pF cap |
| Vds_lin | 2.54 | [Vpk] | Vds_lin | 2.54 | [Vpk] |
| Vds_max | 3.50 | [Vpk] | Vds_max | 3.50 | [Vpk] |
| Outputs: | | | Outputs: | | |
| Unit cells | 31 | | Unit cells | 31 | |
| Ron | 8.18 | | Ron | 12.5 | |
| Cmin | 1.81 | [pF] | Cmin | 1.04 | [pF] |
| Cmax | 8.00 | [pF] | Cmax | 3.20 | [pF] |
| Cstep | 0.193 | [pF] | Cstep | 0.068 | [pF] |
| Range | 4.41 | | Range | 3.08 | |
| Q900 | 86.5 | | Q900 | 141.5 | |
| Q1800 | 43.2 | | Q1800 | 70.7 | |
| Q2200 | 35.4 | | Q2200 | 57.9 | |
| FET area | 0.873 | [mm^2] | FET area | 0.397 | [mm^2] |
| MIM area | 0.013 | [mm^2] | MIM area | 0.005 | [mm^2] |
| Total area | 0.886 | [mm^2] | Total area | 0.402 | [mm^2] |
| Vpk_lin | 19.7 | [Vpk] | Vpk_lin | 18.8 | [Vpk] |
| Vpk_max | 27.2 | [Vpk] | Vpk_max | 25.9 | [Vpk] |
| Pwr_lin | 35.9 | [dBm] | Pwr_lin | 35.5 | [dBm] |
| Pwr_max | 38.7 | [dBm] | Pwr_max | 38.3 | [dBm] |

Figure 8A:
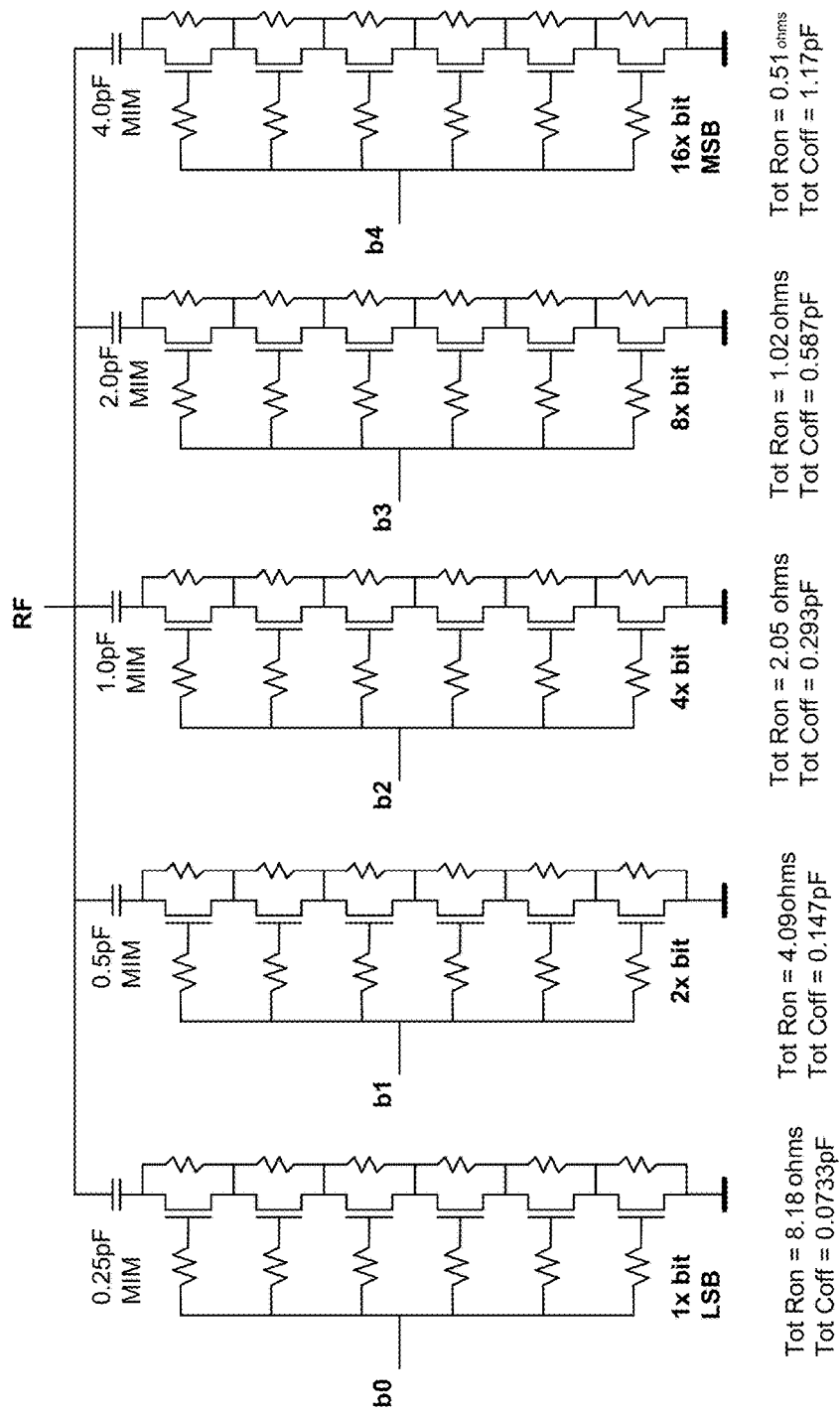
FIG. 8A is a schematic of an exemplary 1 GHz DTC made in accordance with the design characteristics set forth in Table 1.

FIG. 8A shows a schematic of an exemplary 1 GHz DTC 800 made in accordance with the design characteristics set forth in Table 1. As shown in FIG. 8A, all of the significant bit sub-circuits are binary weighted. As described above, both the MIM capacitors and the stacking FETs are binary weighted from a LSB to a MSB. The DTC is designed in accordance with the above-described unit cell design approach. FIG. 8A shows the total on resistance (Ron) and off capacitance (Coff) of each of the significant bit sub-circuits (also referred to herein as circuit elements). For example, the LSB significant bit sub-circuit has an on resistance (Ron) of 8.18 ohms, and an off capacitance (Coff) of 0.0733 pF. The next significant bit sub-circuit has an on resistance (Ron) of 4.09 ohms, and an off capacitance (Coff)

of 0.147 pF. The DTC 800 uses a 5 bit control word which yields a "capacitance step" (Cstep) of 0.2 pF. The capacitance step comprises the difference in total capacitance of the DTC achieved by changing from a selected capacitance level (selected control word value) to the next significant bit capacitance level (selected control word value increased by a least significant bit [e.g., by changing the control word from "00000" to "00001"]). The tuning range, or tuning ratio, (defined herein as "$C_{max}/C_{min}$") of the DTC is approximately 4.41 (i.e., the DTC achieves a total capacitance of approximately 1.81 pF when the control word is 00000, and it achieves a total capacitance of approximately 8.0 pF when the control word is 11111). As shown in FIG. 8A, the stacked FETs comprise six stacked FETs (i.e., n=6). $T_{IN}$ equals 0.4 wherein $T_{IN}$ comprises a "flavor" of the FET used in this exemplary embodiment. In the embodiment shown, in this particular example a thick-oxide IN transistor with 0.4 µm gate length is used. However, the skilled person will recognize other "flavors" of FETs can be used without departing from the spirit and scope of the present teachings. RonCoff of the DTC=600 fF-Ω. The switching time of the DTC is equal to $R_G*C_{ON}$, which in the DTC 800 of FIG. 8A equals 2.9 µs.

Figure 8B:
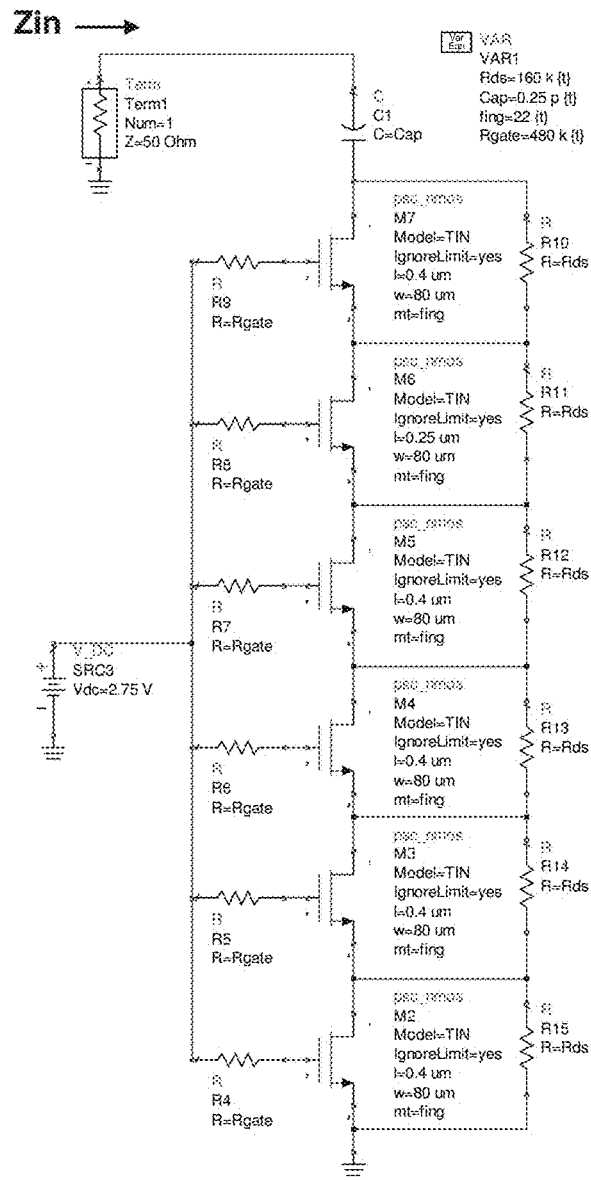
FIG. 8B shows a model simulation of the 1 GHz DTC of FIG. 8A.
Figure 8C:
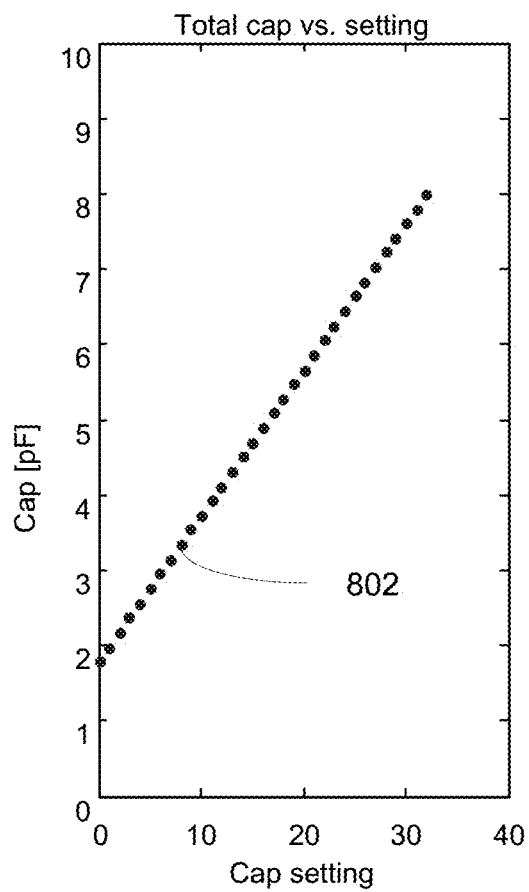
FIG. 8C is a plot of the total capacitance of the DTC of FIG. 8A versus the DTC capacitance control word setting.

FIG. 8B shows a model simulation of the 1 GHz DTC 800 of FIG. 8A. In some embodiments, for ESD protection reasons, a stack of FETs (i.e., a stack-of-8) is inserted from RF pin to GND pin. This additional FET stack does not typically include a MIM capacitor on top of the FET stack, and it is always biased OFF. This stack of FETs protects the MIM capacitors in the event of an ESD strike. The "ESD stack" is small and typically smaller than is the unit cell (LSB bit). FIG. 8C shows a plot 802 of the total capacitance of the DTC (y axis) versus the DTC capacitance control word setting (i.e., it shows the total capacitance of the DTC 800 as the 5-bit control word is increased from a minimum setting of zero (binary 00000) to a maximum setting of 31 (binary 11111)). As shown by the plot 802, advantageously, the total capacitance of the DTC 800 increases linearly with respect to the capacitance control setting. This is an improvement over the prior art tunable capacitors which tended to have a non-linear plot of total capacitance versus capacitance setting. The tuning range of the DTC comprises 1.79 pF to 8.0 pF, and the Cstep is 0.194 pF.

Figure 8D:
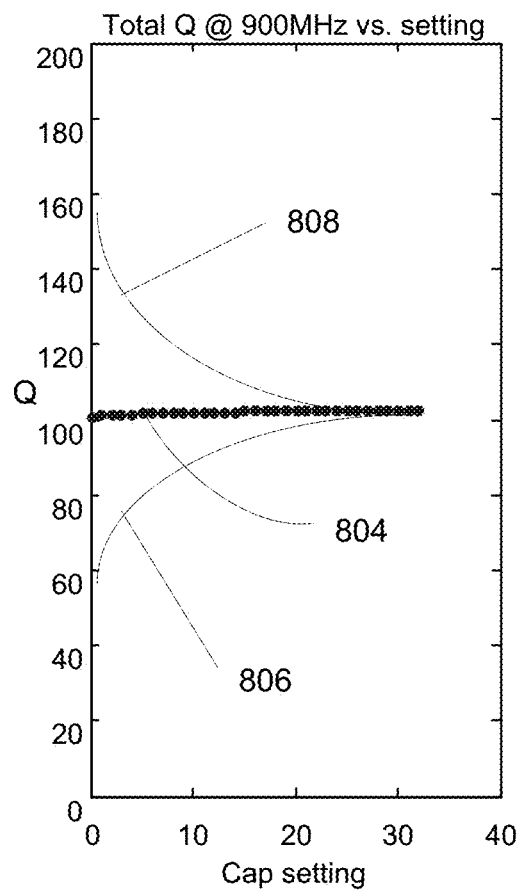
FIG. 8D is a plot of the total Q-factor value versus the DTC capacitance control word setting of the DTC of FIG. 8A for a given applied signal frequency.

FIG. 8D shows a plot 804 of the total Q-factor value of the DTC for a given applied signal frequency (in this example, the Q-factor is measured at a signal frequency of 900 MHz) versus the DTC capacitance control word setting (i.e., it shows the total Q-factor value of the DTC 800 as the 5-bit control word is increased from a minimum setting of zero (binary 00000) to a maximum setting of 31 (binary 11111)). As shown by the plot 804, advantageously, the total Q-factor value of the DTC 800 remains relatively constant over the entire tuning range. For example, as shown in FIG. 8D, the total Q-factor of the DTC at a signal frequency of 900 MHz remains at approximately 100 over all of the possible capacitance settings. This is a tremendous improvement over the prior art tunable capacitors which exhibited a non-linear relationship between the total Q-factor values and capacitance settings. For example, the prior art tunable capacitor solutions exhibited Q-factor plots similar to the exemplary plots 806 and 808. As shown in FIG. 8D, the exemplary prior art Q-factor plot 806 shows a non-linearly increasing Q-factor value with an increasing capacitance setting. The exemplary prior art Q-factor plot 808 also shows a non-linearly decreasing Q-factor value with an increasing capacitance setting.

Figure 8E:
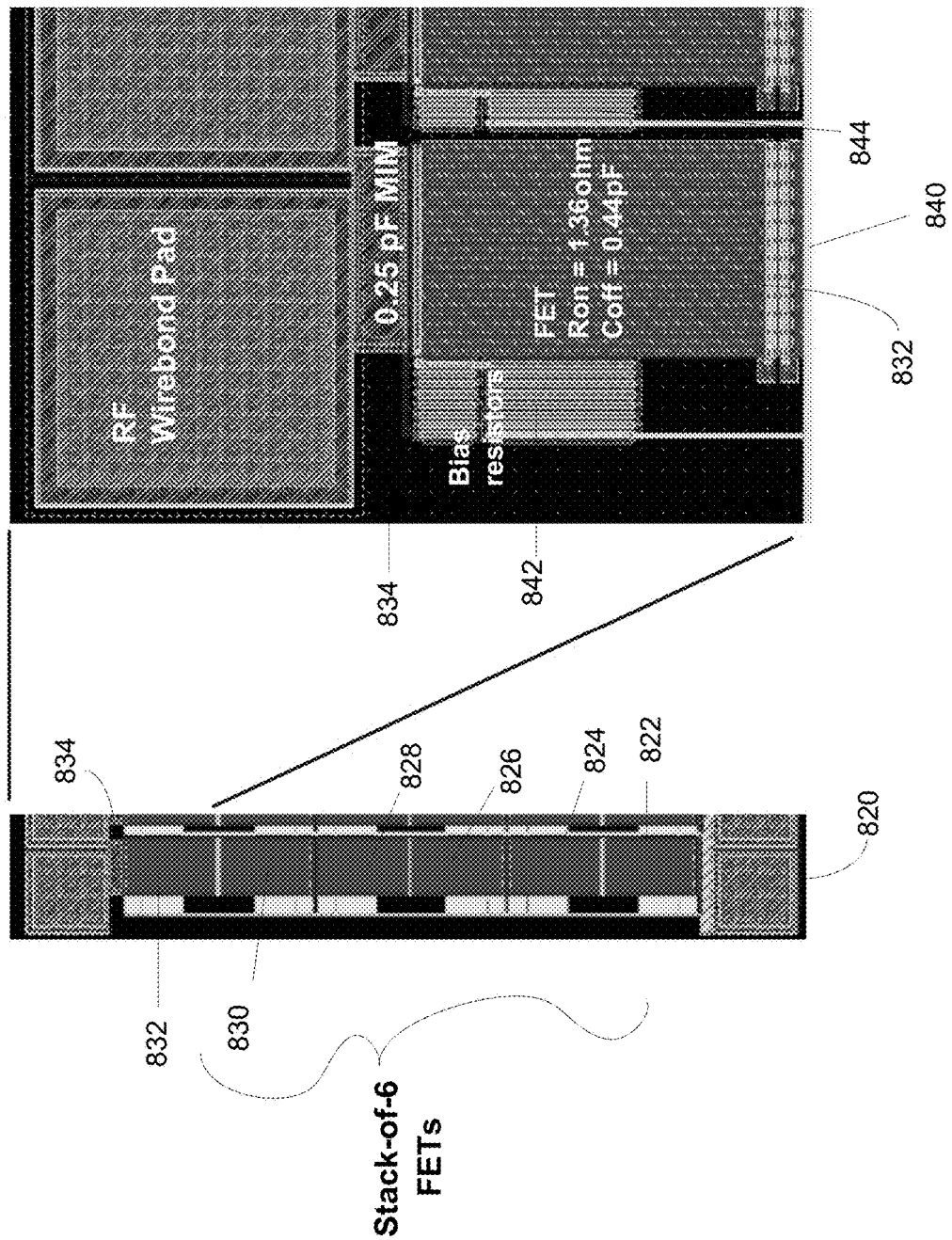
FIG. 8E shows an exemplary integrated circuit layout of a 1×bit LSB unit cell of the DTC of FIG. 8A made in accordance with the present teachings.
Figure 8F:
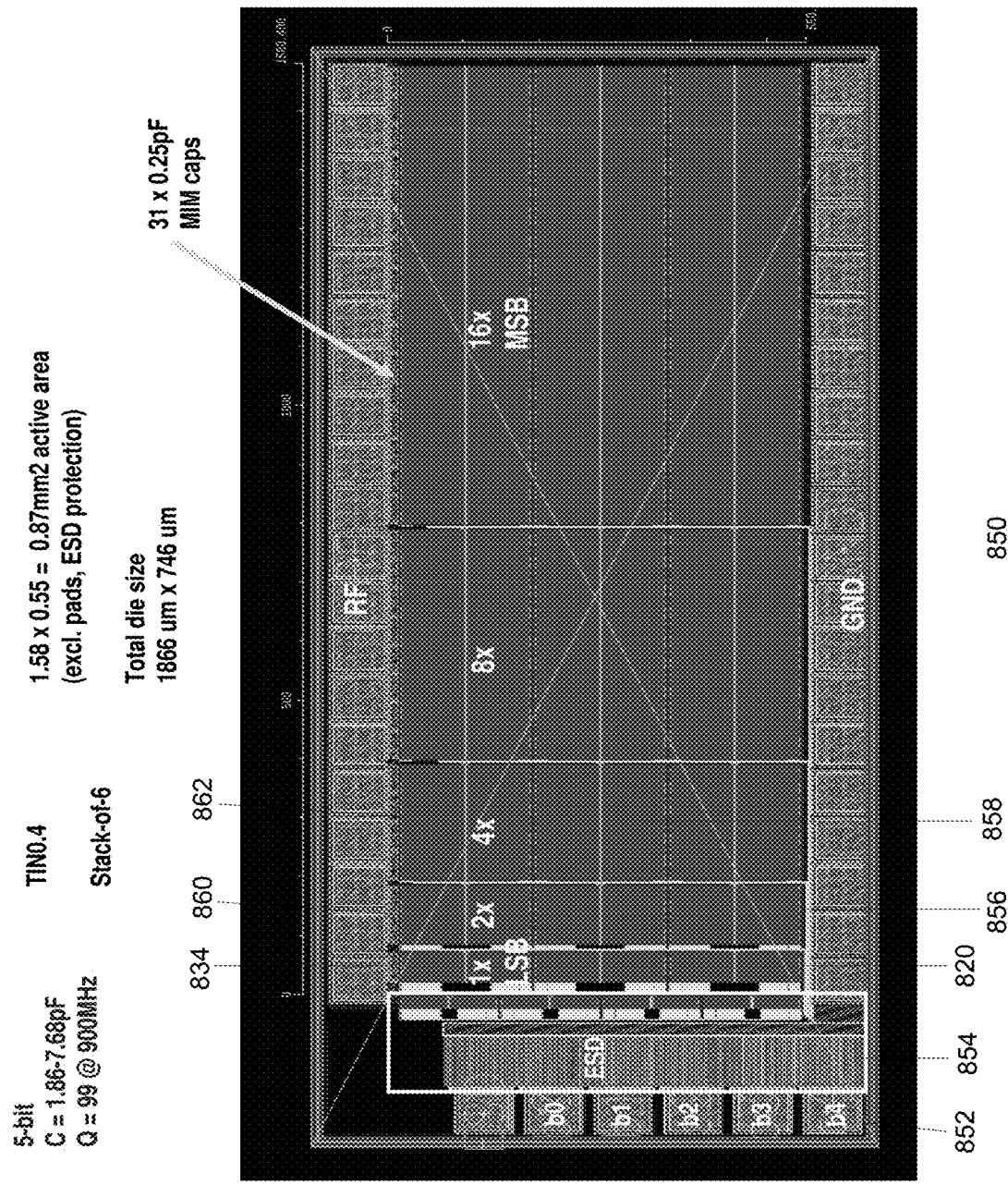
FIG. 8F shows an exemplary integrated circuit layout of the 1 GHz DTC of FIG. 8A.

FIGS. 8E and 8F show exemplary integrated circuit layout representations of the 1 GHz DTC described above. More specifically, FIG. 8E shows an exemplary integrated circuit layout of a 1×bit LSB unit cell 820 made in accordance with the present teachings. As shown in FIG. 8E, the 1×bit LSB unit cell 820 comprises a stack of 6 FETs (FETs 822, 824, 826, 828, 830, and 832), wherein the FETs are coupled together in series, and wherein the stack of FETs is coupled in series to a 1×bit MIM capacitor 834. FIG. 8E shows a close-up layout 840 of the topmost portion of the 1×bit LSB unit cell 820. As shown in FIG. 8E, the close-up layout 840 shows more details of the topmost FET (i.e., the FET 832) and the MIM capacitor 834. Details of the gate resistors $R_G$ ("bias" resistors) 842 and drain-to-source $R_{DS}$ resistors 844 are also shown in the close-up layout 840 of FIG. 8E. In the embodiment shown in FIG. 8E, the MIM capacitor 834 comprises a 0.25 pF capacitor, the FETs have an ON resistance $R_{ON}$ of 1.36 ohms, and an OFF capacitance $C_{OFF}$ of 0.44 pF.

FIG. 8F shows an exemplary integrated circuit layout 850 of the 1 GHz DTC described above. The capacitor control word ($b_0$, $b_1$, $b_2$, $b_3$, and $b_4$) 852 is coupled to the DTC via electrostatic discharge protection circuitry 854. As shown in FIG. 8F, the 1×bit LSB unit cell comprises a 1×bit LSB unit cell 820 of FIG. 8E. In the embodiment shown in FIG. 8F, each increasingly more significant bit sub-circuit is binary weighted as described above. For instance, the second significant bit sub-circuit 856 comprises 2*the LSB unit cell 820. The next significant bit sub-circuit (or element) 858 comprises 4*the LSB unit cell 820, and so on. The MIM capacitors are also binary weighted as described in more detail above. For example, the second significant bit sub-circuit 856 comprises a MIM capacitor 860 that is twice the size of the MIM capacitor 834 of the LSB unit cell 820 (as shown in FIG. 8F, in some exemplary embodiments the 2×MIM capacitor 860 comprises two instantiations of the 1×LSB MIM capacitor 834). The next significant bit sub-circuit (or element) 858 comprises a MIM capacitor 862 that is 4× the size of the MIM capacitor 834 of the LSB unit cell 820 (or it may comprise four instantiations of the LSB MIM capacitor 834), and so on.

Figure 9A:
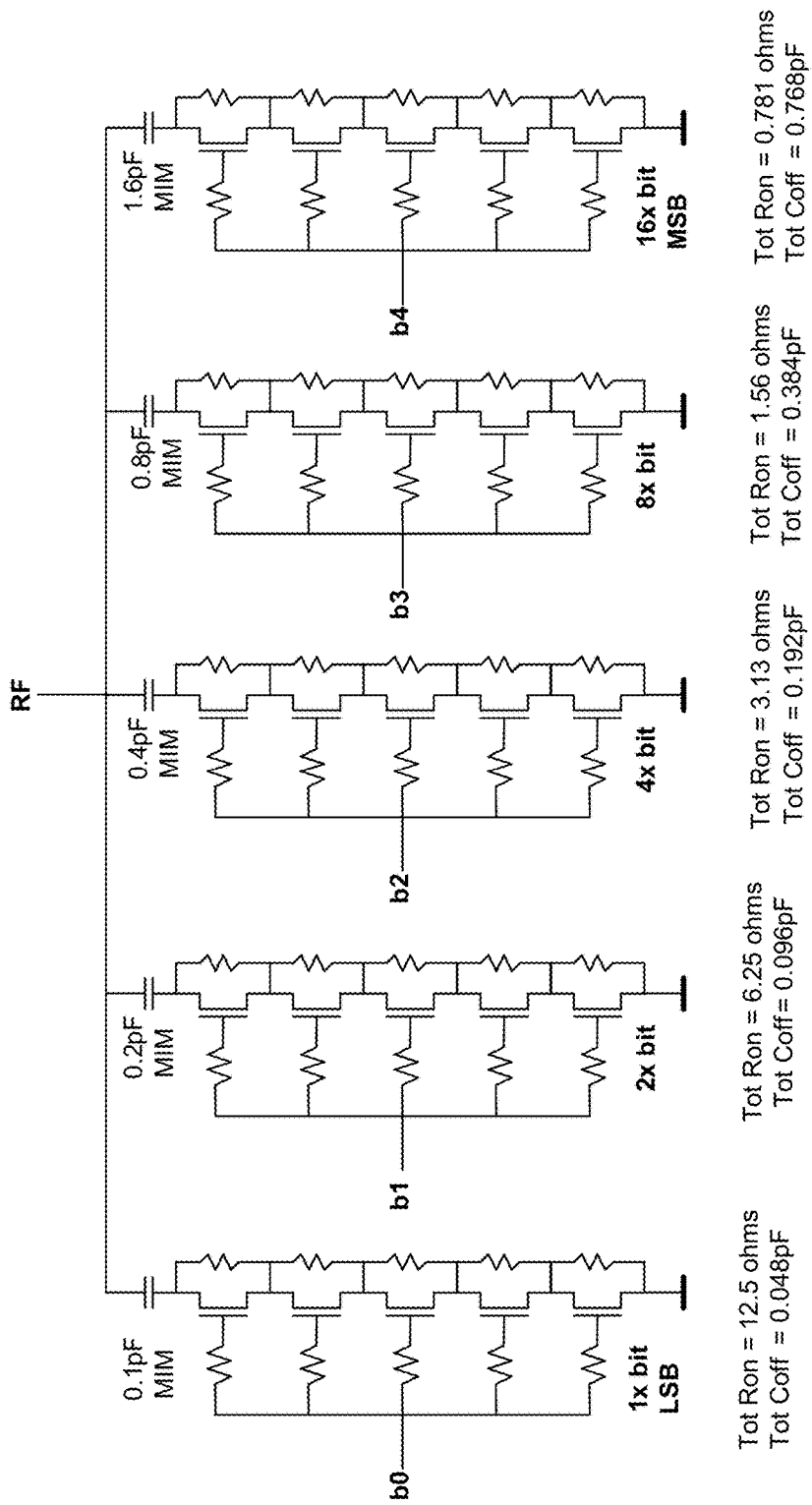
FIG. 9A is a schematic of an exemplary 2 GHz DTC made in accordance with the design characteristics set forth in Table 1.

FIG. 9A shows a schematic of an exemplary 2 GHz DTC 900 made in accordance with the design characteristics set forth in Table 1. As shown in FIG. 9A, all of the significant bit sub-circuits are binary weighted. As described above, both the MIM capacitors and the stacking FETs are binary weighted from a LSB to a MSB. The DTC is designed in accordance with the above-described unit cell design approach. FIG. 9A shows the total on resistance (Ron) and off capacitance (Coff) of each of the significant bit sub-circuits (also referred to herein as circuit elements). For example, the LSB significant bit sub-circuit has an on resistance (Ron) of 12.5 ohms, and an off capacitance (Coff) of 0.048 pF. The next significant bit sub-circuit has an on resistance (Ron) of 6.25 ohms, and an off capacitance (Coff) of 0.096 pF. The DTC 900 uses a 5 bit control word which yields a capacitance step (Cstep) of 0.067 pF. The tuning range, or tuning ratio, (defined herein as "$C_{max}/C_{min}$") of the DTC is approximately 3.08 (i.e., the DTC achieves a total capacitance of approximately 1.04 pF when the control word is 00000, and it achieves a total capacitance of approximately 3.2 pF when the control word is 11111). As shown in FIG. 9A, the stacked FETs comprise five stacked FETs (i.e., n=5). $T_{IN}$ equals 0.4 and RonCoff of the DTC=600 fF-Ω. The switching time of the DTC is equal to $R_G*C_{ON}$, which in the DTC 900 of FIG. 9A equals 0.8 µs.

Figure 9B:
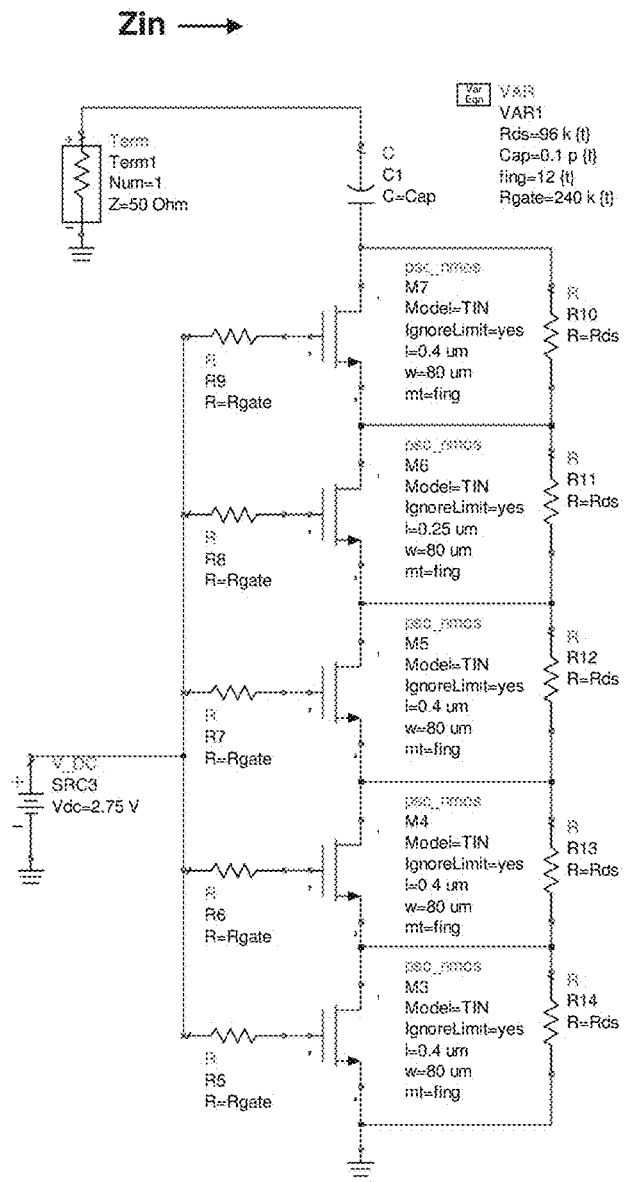
FIG. 9B shows a model simulation of the 2 GHz DTC of FIG. 9A.
Figure 9C:
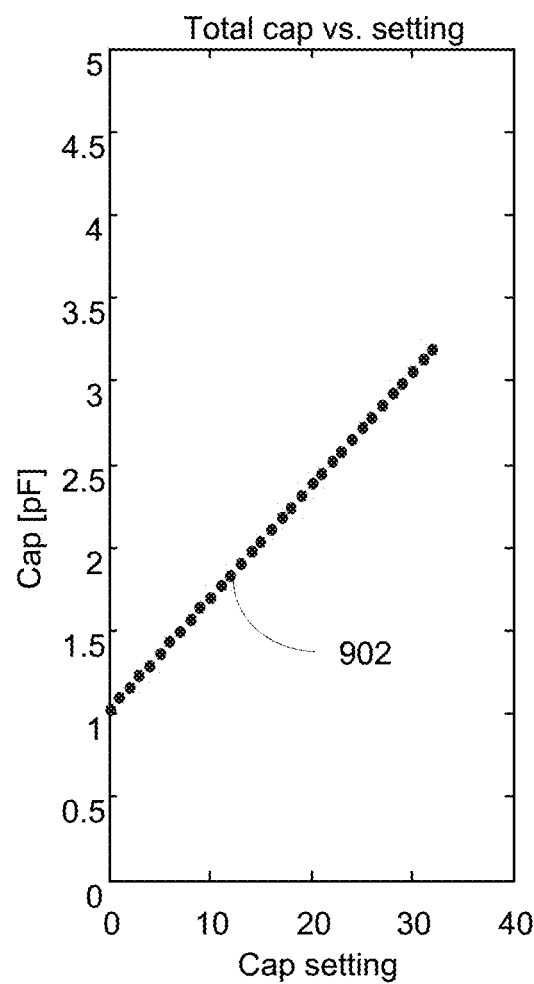
FIG. 9C is a plot of the total capacitance of the DTC of FIG. 9A versus the DTC capacitance control word setting.

FIG. 9B shows a model simulation of the 2 GHz DTC 900 of FIG. 9A. FIG. 9C shows a plot 902 of the total capacitance of the DTC (y axis) versus the DTC capacitance control word setting (i.e., it shows the total capacitance of the DTC 800 as the 5-bit control word is increased from a minimum setting of zero (binary 00000) to a maximum setting of 31 (binary 11111)). As shown by the plot 902, advantageously, the total capacitance of the DTC 900 increases linearly with respect to the capacitance control setting. The tuning range of the DTC comprises 1.03 pF to 3.20 pF, and the Cstep is 0.0678 pF.

Figure 9D:
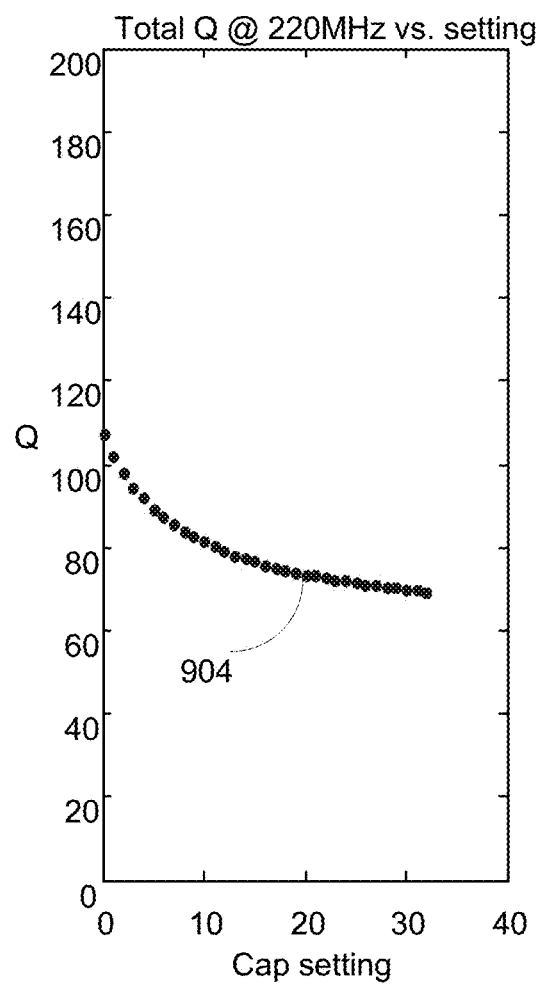
FIG. 9D is a plot of the total Q-factor value versus the DTC capacitance control word setting of the DTC of FIG. 9A for a given applied signal frequency.
Figure 9E:
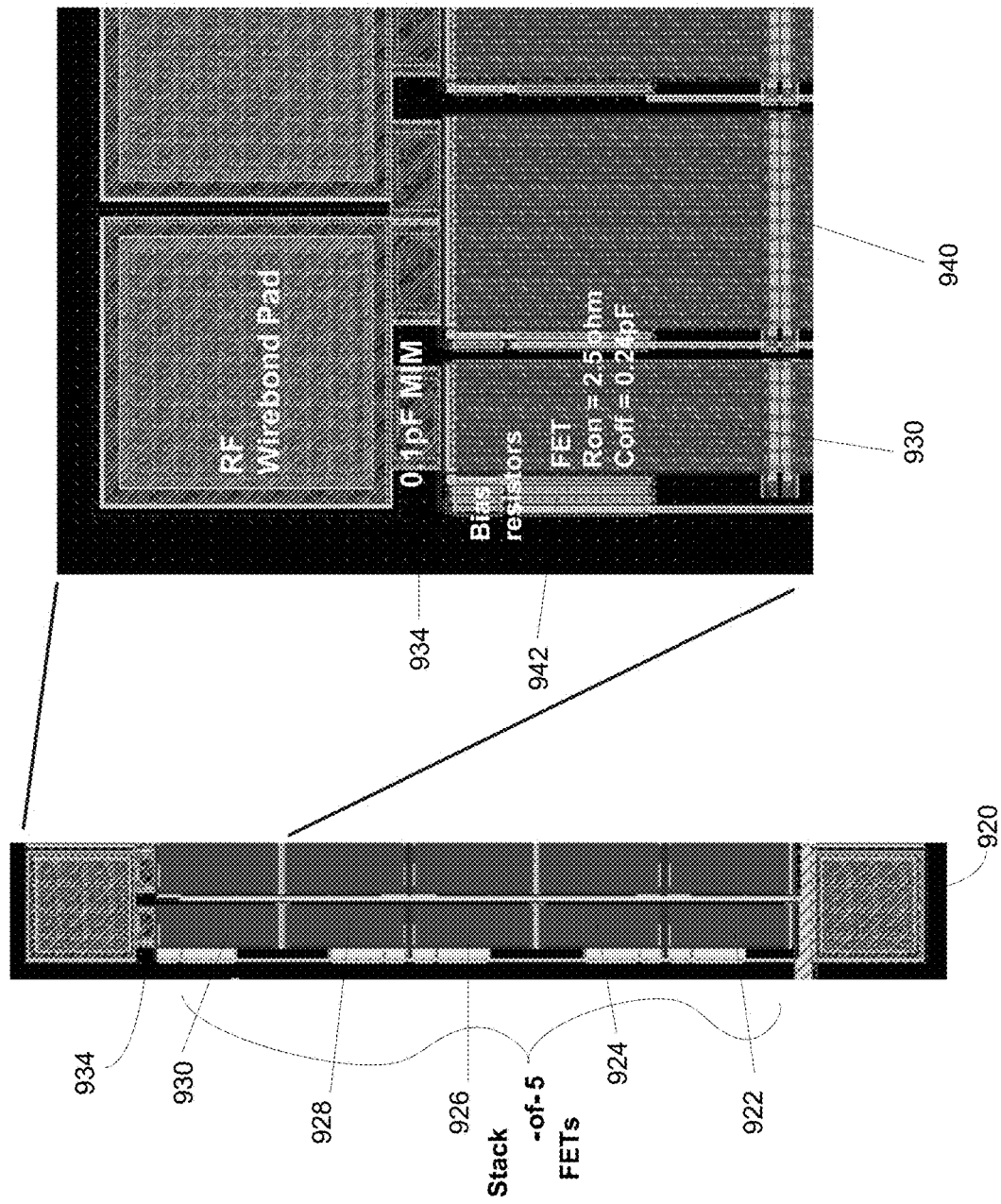
FIG. 9E shows an exemplary integrated circuit layout of a 1×bit LSB unit cell of the DTC of FIG. 9A made in accordance with the present teachings.
Figure 9F:
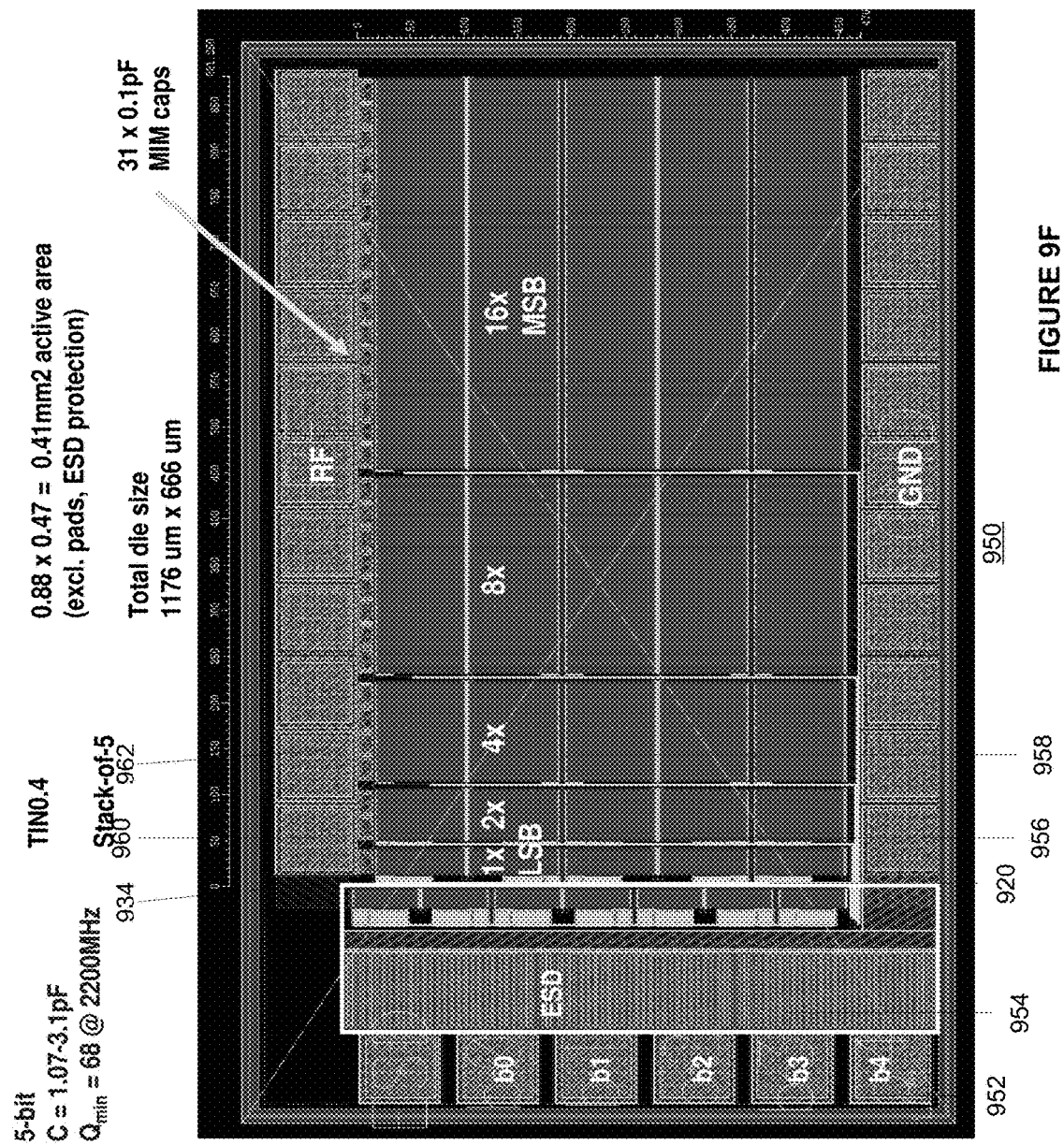
FIG. 9F shows an exemplary integrated circuit layout of the 2 GHz DTC of FIG. 9A.

FIG. 9D shows a plot 904 of the total Q-factor value of the DTC 900 for a given applied signal frequency (in this example, the Q-factor is measured at a signal frequency of 220 MHz) versus the DTC capacitance control word setting. As shown by the plot 904, advantageously, the total Q-factor value of the DTC 900 remains relatively constant over the entire tuning range. FIGS. 9E and 9F show exemplary integrated circuit layout representations of the 2 GHz DTC described above. More specifically, FIG. 9E shows an exemplary integrated circuit layout of a 1×bit LSB unit cell 920 made in accordance with the present teachings. As shown in FIG. 9E, the 1×bit LSB unit cell 920 comprises a stack of 5 FETs (FETs 922, 924, 926, 928, and 930), wherein the FETs are coupled together in series, and wherein the stack of FETs is also coupled in series to a 1×bit MIM capacitor 934. FIG. 9E shows a close-up layout 940 of the topmost portion of the 1×bit LSB unit cell 920. As shown in FIG. 9E, the close-up layout 940 shows more details of the topmost FET (i.e., the FET 930) and the MIM capacitor 934. Details of the gate resistors $R_G$ ("bias" resistors) 942 and drain-to-source $R_{DS}$ resistors are also shown in the close-up layout 940 of FIG. 9E. In the embodiment shown in FIG. 9E, the MIM capacitor 934 comprises a 0.1 pF MIM capacitor, the FETs have an ON resistance $R_{ON}$ of 2.5 ohms, and an OFF capacitance $C_{OFF}$ of 0.24 pF.

FIG. 9F shows an exemplary integrated circuit layout 950 of the 2 GHz DTC described above. The capacitor control word ($b_0$, $b_1$, $b_2$, $b_3$, and $b_4$) 952 is coupled to the DTC via electrostatic discharge protection circuitry 954. As shown in FIG. 9F, the 1×bit LSB unit cell comprises a 1×bit LSB unit cell 920 of FIG. 9E. In the embodiment shown in FIG. 9F, each increasingly more significant bit sub-circuit is binary weighted as described above. For instance, the second significant bit sub-circuit 956 comprises 2*the LSB unit cell 920. The next significant bit sub-circuit (or element) 958 comprises 4*the LSB unit cell 920, and so on. The MIM capacitors are also binary weighted as described in more detail above. For example, the second significant bit sub-circuit 956 comprises a MIM capacitor 960 that is twice the size of the MIM capacitor 934 of the LSB unit cell 920 (as shown in FIG. 9F, in some exemplary embodiments the 2×MIM capacitor 960 comprises two instantiations of the 1×LSB MIM capacitor 934). The next significant bit sub-circuit (or element) 958 comprises a MIM capacitor 962 that is 4× the size of the MIM capacitor 934 of the LSB unit cell 920 (or it may comprise four instantiations of the 1×LSB MIM capacitor 934), and so on.

Figure 10A:
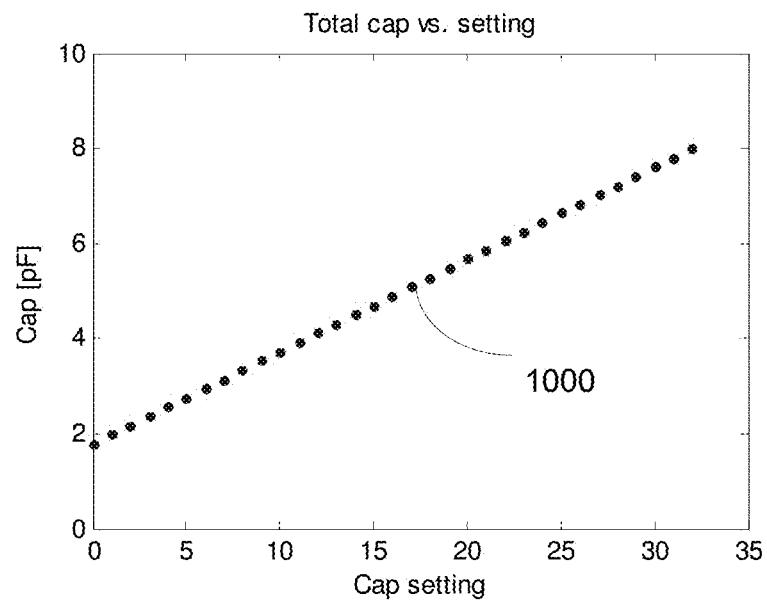
FIGS. 10A and 10B show a comparison of the capacitance tuning curves of the present DTCs with those of thin-film Barium Strontium Titanate (BST) tunable capacitors.
Figure 10B:
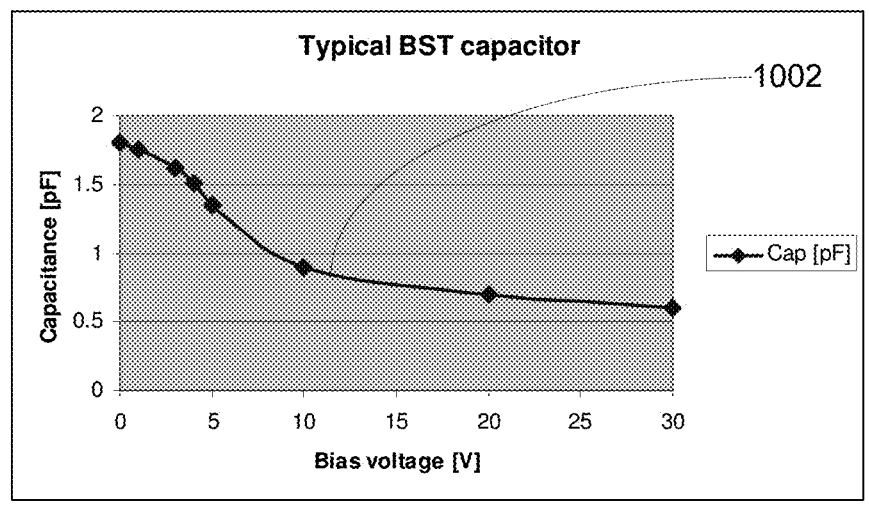

FIGS. 10A and 10B show a comparison of the capacitance tuning curves of the above-described DTCs with those of thin-film Barium Strontium Titanate (BST) tunable capacitors. More specifically, FIG. 10A shows a plot 1000 of the DTC total capacitance versus the capacitance control setting for a DTC made in accordance with the present teachings. FIG. 10B shows a plot 1002 of the BST capacitance versus the bias voltage for a BST tunable capacitor. As described above in more detail with reference to the plots of FIGS. 8C and 9C, and as shown in FIG. 10A, advantageously, the total capacitance of the DTC made in accordance with the present teachings increases linearly with respect to the capacitance control setting. This is an improvement over the prior art BST tunable capacitors which have non-linear plots similar to the curve 1002 of total capacitance versus capacitance setting (i.e., bias voltage). In addition, the BST tunable capacitors also suffer from problems associated with hysteresis. The DTCs made in accordance with the present teachings advantageously do not have this drawback.

DTC Design "Trade-Offs" and Design Considerations

The above-described digitally tuned capacitor (DTC) method and apparatus advantageously may be designed to optimize or satisfy a wide range of circuit performance and DTC size characteristics. Using these design characteristics and "trade-offs", the DTCs can be customized and optimized to satisfy specifications and requirements imposed by system providers.

Design Trade-Offs—Tuning Range Vs. Frequency at $Q_{min}$ Values

Figure 11:
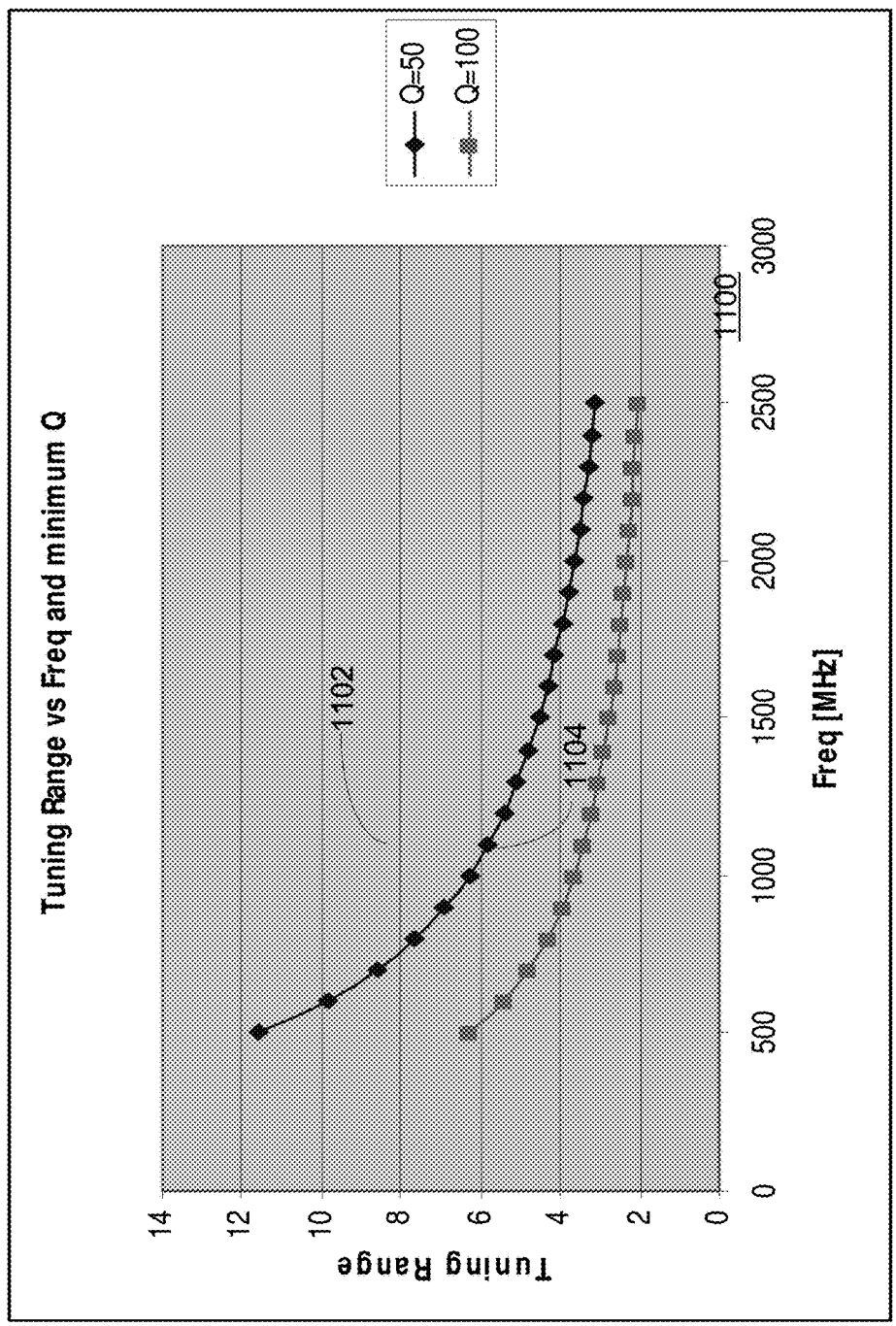
FIG. 11 shows a graph of the tuning range of a DTC versus the frequency of the applied signal for a selected minimum Q-factor value ($Q_{min}$).

For example, FIG. 11 shows a graph 1100 of the tuning range of a DTC versus the frequency of the applied signal for a selected minimum Q-factor value ($Q_{min}$). Two curves are shown in FIG. 11. A first curve 1102 shows the tuning range of a first DTC having a minimum Q-factor of 50 as the tuning range varies as a function of the frequency of the applied signal. A second curve 1104 shows the tuning range of a second DTC having a minimum Q-factor of 100 as the tuning range varies as a function of the frequency of the applied signal. As described above with reference to Equations 1-6, the minimum Q-factor value ($Q_{min}$) and the tuning range ($C_{max}/C_{min}$) are strongly related to each other due to the operating principle and design of the DTC of the present teachings. The minimum Q-factor of the present DTC is dependent on the product of the DTC ON resistance $R_{ON}$ and the DTC OFF capacitance $C_{OFF}$ (i.e., $R_{ON}C_{OFF}$). The curves 1102 and 1104 of FIG. 11 are plotted assuming that Ron-Coff=600 fF-Ω.

In some embodiments, the tuning range is determined in accordance with the following Equation 7:

$$\text{Tuning\_range} = \frac{1}{\omega \cdot R_{ON} C_{OFF} \cdot Q_{min}} + 1. \qquad \text{Equation 7}$$

Equation 7 shows the limitation of the tuning range based on the RonCoff of the process and Q requirement. Equation 3 teaches how to choose the ratio between Coff and CMIM based on the required Tuning ratio specification. The tuning range "rule-of-thumb" design characteristics are set forth in Table 2 below:

TABLE 2

| Frequency of Applied Signal | Q = 50 | Q = 100 |
|---|---|---|
| 900 MHz | Tuning Ratio = 7:1 | Tuning Ratio = 4:1 |
| 1800 MHz | Tuning Ratio = 4:1 | Tuning Ratio = 2.5:1 |
| 2200 MHz | Tuning Ratio = 3.4:1 | Tuning Ratio = 2.2:1 |

Design Trade-Off—Tuning Range and Die Area Vs. $Q_{min}$ Values

Figure 12:
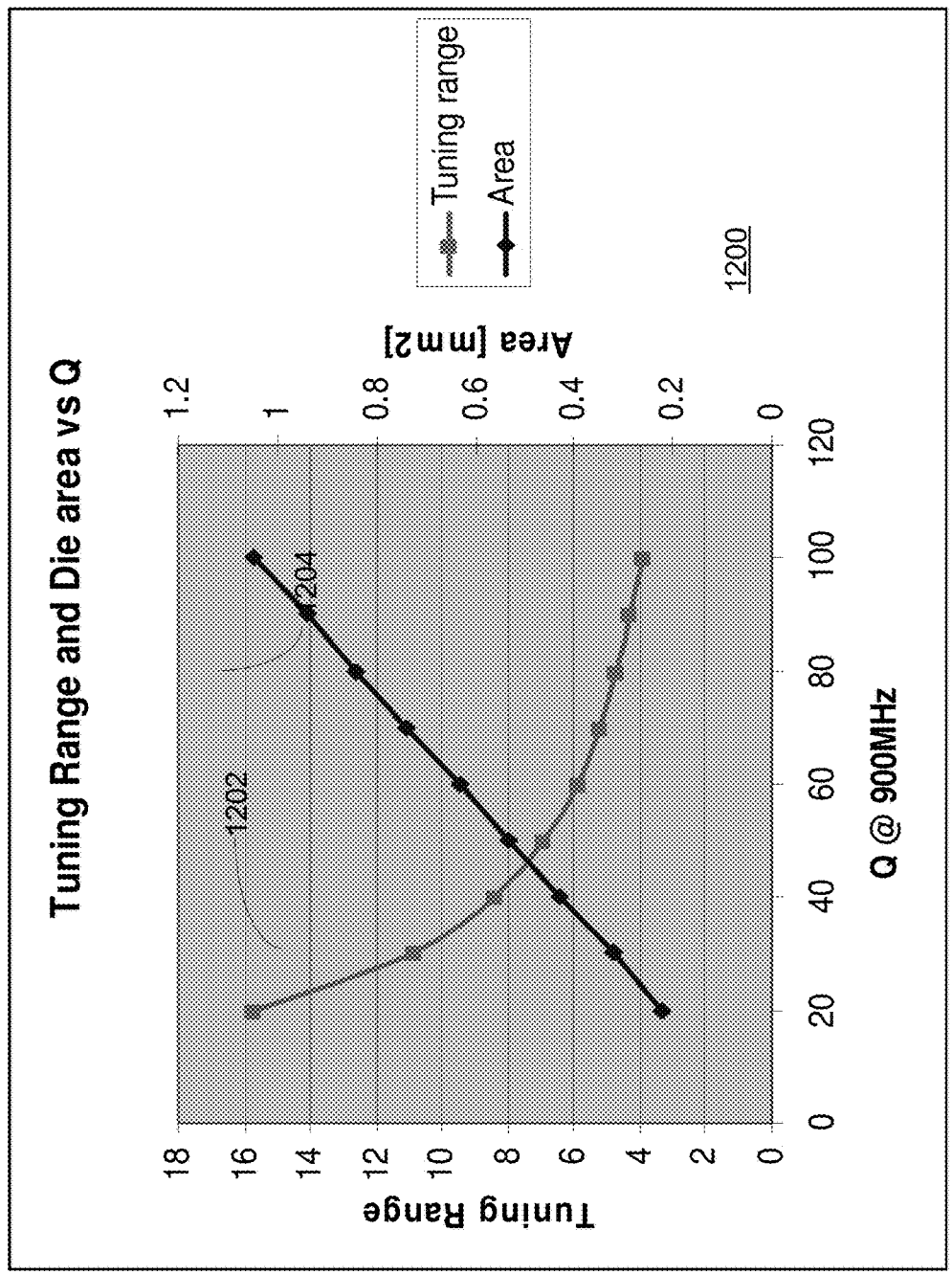
FIG. 12 shows a graph of the tuning range and die area requirements versus minimum Q-factor values ($Q_{min}$) for a selected DTC at a given applied signal frequency of 900 MHz.

As described above with reference to the DTCs of FIGS. 4A, 5A-5B, 6, 8A, 8F, 9A, and 9F, owing to the operating principles and design techniques of the present DTC teachings, the die area occupied by the DTC increases and its associated tuning range decreases with increasing Q-factor values. This design trade-off is shown diagrammatically in the graph 1200 of FIG. 12. FIG. 12 shows a graph 1200 of the tuning range and die area requirements versus minimum Q-factor values for a selected DTC at a given applied signal frequency (in the plot 1200 of FIG. 12 the curves 1202 and 1204 are plotted assuming that the applied signal frequency comprises 900 MHz). Referring again to FIG. 12, the curve 1202 shows how the tuning range decreases as the Q-factor requirement of the DTC increases. The curve 1204 shows how the die area requirement of the DTC increases as the Q-factor requirement of the DTC increases. The curves 1202 and 1204 of FIG. 12 are plotted assuming the following: RonCoff=600 fF-Ω; the frequency of the applied signal is 900 MHz; the capacitance control word is 5 bits; a FET Stack-of-6 (i.e., n=6); and Cmax=8.2 pF.

Design Trade-Off—Cmax Vs. FET Die Area

Figure 13:
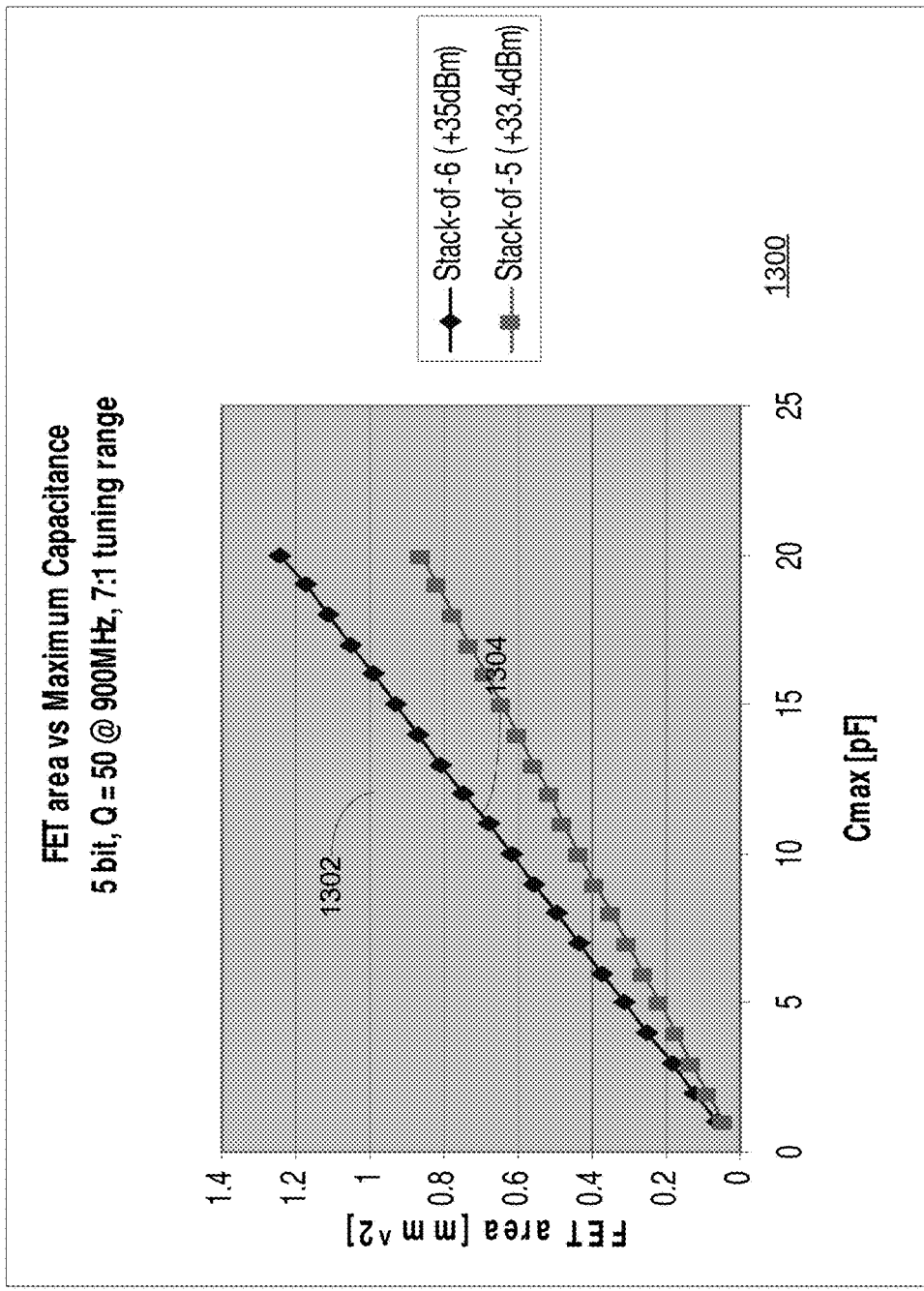
FIG. 13 shows plots showing how FET die area requirements (i.e., the die area requirement of the FETs of the DTC) associated with different FET stack heights increases as the maximum DTC capacitance (Cmax) increases.

As described above with reference to the DTCs of FIGS. 4A, 5A-5B, 6, 8A, 8F, 9A, and 9F, owing to the operating principles and design techniques of the present DTC teachings, the die area requirements of the DTC is proportional to its maximum capacitance (Cmax) (i.e., the maximum capacitance achievable by the DTC). Referring now to FIG. 13, curve 1302 shows how the FET die area requirement (i.e., the die area requirement of the FETs of the DTC) increases as the maximum DTC capacitance (Cmax) increases. Curve 1302 shows the relationship between the FET die area and Cmax for a DTC having a stack of six shunting FETs (thereby providing a DTC power handling capability of approximately +35 dBM). Curve 1304 shows the relationship between the FET die area and Cmax for a DTC having a stack of five shunting FETs (thereby providing a DTC power handling capability of approximately +33.4 dBM). As expected, the DTC having the lower power handling requirement (and fewer number of stacked FETs) occupies less die area than does the DTC having the higher power handling requirement (and therefore requiring a greater number of stacked FETs). The plots 1302, 1304 assume the following: Q=50 @ 900 MHz; a capacitance control word of 5 bits, and that the DTC has a 7:1 tuning range. It is also assumed that the FET (IN 0.4) area comprises 80 um×80 um for a 1Ω single FET.

Design Considerations—Optimizing DTC for Reduced IC Die Area

Reducing the Cmax of the DTC—

Several design trade-offs and design considerations can be taken advantage of in order to reduce the integrated circuit die area occupied by the DTC. For example, as described above with reference to FIG. 13, owing to the operating principles and design techniques of the present DTC teachings, the die area requirements of the DTC is proportional to its maximum capacitance (Cmax) (i.e., the maximum capacitance achievable by the DTC). Therefore, if the maximum capacitance of the DTC (Cmax) can be reduced, the die area required by the DTC can also be reduced. Consequently, in order to optimize the DTC for the smallest possible die area, it is useful to use a tuner topology that requires the smallest maximum capacitance Cmax. For example, a coupled-resonator tuner topology is significantly better. As an example, if the maximum capacitance Cmax specification of a selected DTC is reduced from 9.4 pF to 6.0 pF, the die area required by the selected DTC made in accordance with the present teachings is reduced by 36%= [(1)−(6/9.4)].

Reducing the FET Stack Height of the DTC—

As described above with reference to FIG. 13, if the power handling requirements of the DTC are reduced, the DTC can be implemented using a fewer number n of stacked FETs, and the die area required by the DTC can also thereby be reduced. As described in more detail above, the power handling requirements imposed upon the DTC dictate the number n of stacked FETs required to implement the unit cell sub-circuits. Therefore, if the power handling specification can be relaxed, the integrated circuit die area required by the DTC can be reduced. For example, a reduction of the maximum power handling specification from +38.5 dBM to +36.6 dBM results in a reduced die area of approximately 30% for a selected DTC made in accordance with the present teachings. If the DTCs are implemented in the above-described UltraCMOS™ process technology, the DTCs are not sensitive to power. However, the UltraCMOS DTC is sensitive to the voltage swing of the applied RF signal which can theoretically double in infinite mismatch. However, when the DTC is used in a mobile handset, for example, the power amplifiers of the handset do not typically produce very high voltages. Therefore, the power handling specification of the DTC may be able to be relaxed, resulting in reduced power handling requirements, a lower number n of stacked FETs (i.e., a lower stacked FET height), and a correspondingly reduced IC die area.

Placing a Fixed MIM Capacitor in Parallel with the DTC—

As described above with reference to the DTCs of FIGS. 4A, 5A-5B, 6, 8A, 8F, 9A, and 9F, owing to the operating principles and design techniques of the present DTC teachings, the tuning ratio of the DTC (Cmax/Cmin) is determined by the DTC Q-factor value imposed by system specifications, the frequency of the applied signal, and the $R_{ON}C_{OFF}$ figure-of-merit of the switch process (i.e., the product of the DTC ON resistance $R_{ON}$ and the DTC OFF capacitance $C_{OFF}$). If the tuning ratio for a selected DTC is greater than a tuning ratio required by a system specification, a fixed MIM capacitor can be added ($C_{ADD}$), or coupled in parallel, to the DTC resulting in a significantly scaled-down version of the selected DTC. The scaled-down DTC occupies much less IC die area than its unmodified DTC counterpart, yet it still meets all of the required system specifications (such as, for example, tuning ratio, Q-factor minimum value, Cmax, etc.).

In one embodiment of a DTC modified to include an added capacitor $C_{ADD}$ coupled in parallel to the unmodified DTC, and assuming the Q-factor remains the same, changing the tuning ratio of the modified DTC (i.e., the tuning ratio of the circuit comprising the unmodified DTC coupled in parallel with the fixed MIM capacitor $C_{ADD}$) from 4.7:1 to 3:1 reduces the DTC die area by approximately 30%= [1−3/4.7]. Relaxing or reducing the Q-factor requirements of the DTC results in increased tuning ratios. This leads to even greater IC die area reduction when a fixed MIM capacitor $C_{ADD}$ is coupled in parallel to the DTC. Reducing the Q-factor value from 80 to 60 increases the DTC tuning ratio from 4.7:1 to 5.9:1. If the tuning ratio of the modified DTC is then forced to be 3:1, for example, with a fixed capacitor coupled in parallel to the DTC, this reduces the DTC die area by approximately 62%=[1−60/80*3/5.9].

Table 3 set forth below shows the reduction in die area occupied by a given DTC that is achieved by taking advantage of the design considerations and trade-offs described above. As shown in Table 3, for the given reductions in Cmax (9.4 pF to 6.0 pF), Tuning Ratio (4.7:1 to 3:1), Q-factor (80 to 60), linear power (35.7 dBm to 33.8 dBm), and Max Power (38.5 dBM to 36.6 dBM), and by modifying the DTC to include a fixed MIM capacitor $C_{ADD}$ coupled in parallel to the DTC, an approximately 70% IC reduction in die area required to implement the DTC can be realized in accordance with the present disclosure (i.e., from 0.96 mm² to 0.29 mm²).

TABLE 3

|  | Design A | Design B |
| --- | --- | --- |
| Max cap (Cmax) | 9.4 pF | 6.0 pF |
| Min cap (Cmin) | 2.0 pF | 2.0 pF |
| Tuning Ratio | 4.7:1 | 3:1 |
| Q @ 900 MHz | 80 | 60 |
| Linear Power | 35.7 dBm | 33.8 dBm |
| Max Power | 38.5 dBm | 36.6 dBm |
| Die Area | 0.96 mm² | 0.29 mm² |

Tuning Range and Die Area Vs. $Q_{min}$ Values for Unmodified and Modified DTCs

Figure 14A:
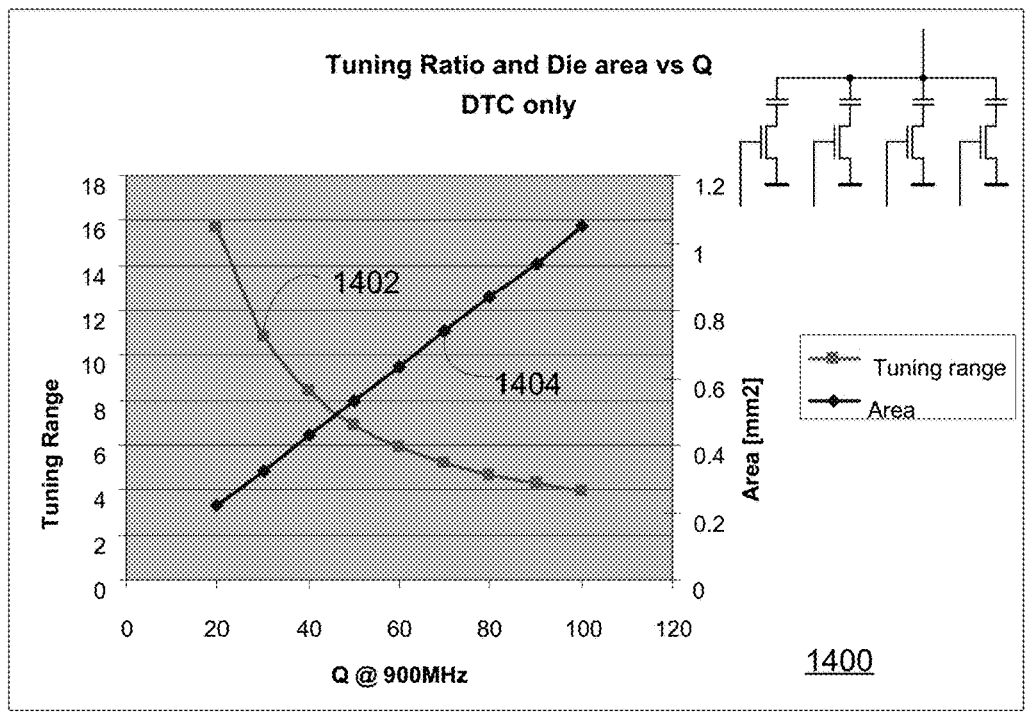
FIG. 14A is a graph showing plots of the tuning ranges and die area requirements versus minimum Q-factor values ($Q_{min}$) for a selected unmodified DTC.
Figure 14B:
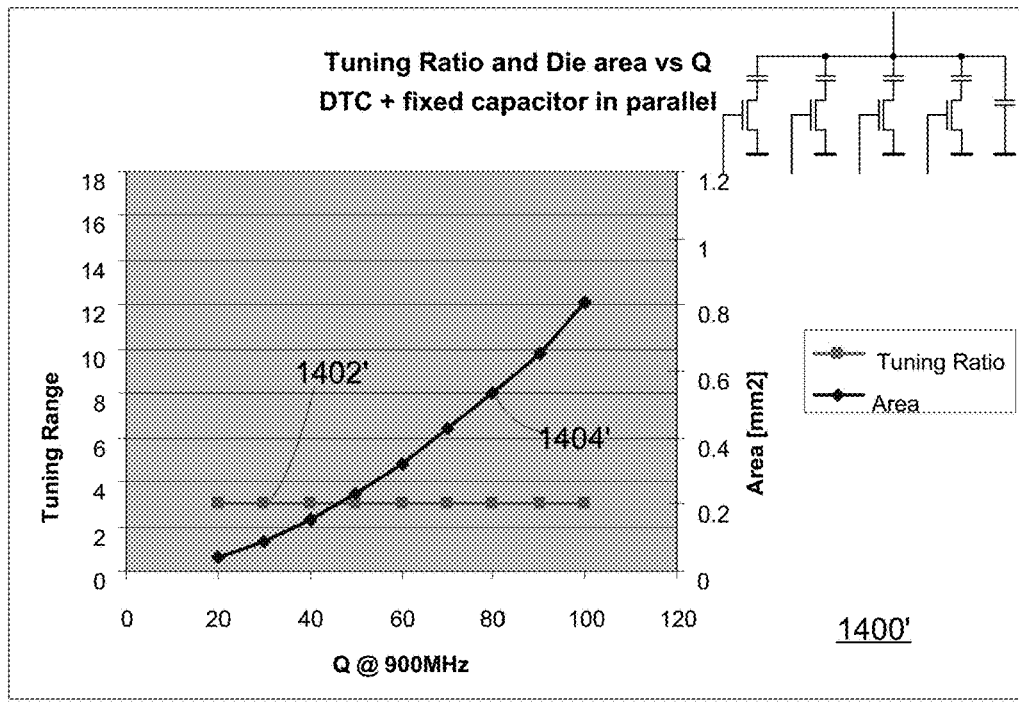
FIG. 14B is a graph showing plots of the tuning ranges and die area requirements versus minimum Q-factor values ($Q_{min}$) for a modified DTC, wherein the modified DTC comprises the unmodified DTC modified to include a fixed capacitor in parallel thereto.

As noted above, the IC die area required by a DTC can be reduced in cases where the DTC tuning ratio exceeds that imposed by system specifications. This reduction can be achieved by coupling a fixed MIM capacitor (CD) in parallel with the DTC. FIGS. 14A and 14B show graphs of the tuning ranges and die area requirements versus minimum Q-factor values for a selected unmodified DTC (graph 1400 of FIG. 14A) and a modified DTC (graph 1400' of FIG. 14B, wherein the selected DTC is modified by coupling a fixed MIM capacitor $C_{ADD}$ in parallel to the DTC) at a given applied signal frequency. In the example shown, the curves of the graphs 1400, 1400' are plotted assuming that the applied signal frequency comprises 900 MHz. The graph 1400 is identical to the graph 1200 described above with reference to FIG. 12. Referring now to FIG. 14A, the curve 1402 shows how the tuning range decreases as the Q-factor requirement of the DTC increases. The curve 1404 shows how the die area requirement of the DTC increases as the Q-factor requirement of the DTC increases. The curves 1402 and 1404 of FIG. 14A are plotted assuming the following conditions: RonCoff=600 fF-Ω; the frequency of the applied signal is 900 MHz; the capacitance control word is 5 bits; a FET Stack-of-6 (i.e., n=6); and Cmax=8.2 pF. As shown in FIG. 14A, and specifically as shown by the curve 1404, for a given unmodified DTC having a Q-factor value of 80, a capacitance range of 1.7 to 8.0 pF, and therefore a tuning range (or tuning ratio) of 4.7:1, the die area required for the given unmodified DTC equals 0.82 mm².

As noted above, if the tuning range of a given unmodified DTC exceeds that required by system specifications, the DTC can be modified by coupling a fixed MIM capacitor ($C_{ADD}$) in parallel to the unmodified DTC, resulting in a reduction of the IC die area occupied by the modified DTC. The graph 1400' of FIG. 14B diagrammatically shows this phenomenon. The curve 1402' shows that the tuning range of the modified DTC can be forced to be relatively stable (i.e., it does not vary significantly) as the Q-factor requirement of the modified DTC increases. The curve 1404', similar to the curve 1404 of FIG. 14A, shows how the die area requirement of the modified DTC increases as the Q-factor requirement of the DTC increases. The curves 1402' and 1404' of FIG. 14B are plotted assuming the following conditions: RonCoff=600 fF-Ω; the frequency of the applied signal is 900 MHz; the capacitance control word is 5 bits; a FET Stack-of-6 (i.e., n=6); and Cmax=8.2 pF. As shown in FIG. 14B, assuming a Q-factor of 80, for example, and specifically as shown by the curve 1402', the tuning range of the modified DTC is reduced from 4.7:1 (see curve 1404) (i.e., C ranging between 1.7 and 8.0 pF) to 3:1 (see curve 1404') (i.e., C ranging between 2.67 and 8.0 pF).

As shown in FIG. 14B and specifically as shown by the curve 1404', for a given modified DTC having a Q-factor value of 80, a capacitance range of 2.67 to 8.0 pF, and therefore a tuning range (or tuning ratio) of 3:1, the die area required for the modified DTC equals 0.54 mm². Thus, by reducing the tuning range (i.e., forcing the tuning range to be lowed than its unmodified counterpart DTC) of the modified DTC, and modifying the DTC to include a fixed MIM capacitor coupled in parallel to the DTC, a reduction of approximately 34% (1−0.54 mm²/0.82 mm²) in IC die area is achieved for a Q-factor of 80. As shown by the curve 1404' of FIG. 14B, different die area savings are achievable using this same design technique for different Q-factor values.

Idealized Equations Governing $C_{ADD}$ and the Design Parameters of the Modified DTC As described above with reference to FIGS. 14A and 14B, in cases wherein a selected DTC has a tuning ratio exceeding that required by the system specifications (such as those imposed by the various wireless telecommunication standards), the selected DTC can be modified with a fixed MIM capacitor $C_{ADD}$ coupled in parallel to the DTC. For a given minimum Q-factor of the DTC, such a modification reduces the IC die area otherwise required by the DTC while also maintaining all other system performance requirements. The fixed MIM capacitor $C_{ADD}$ comprises an "ideal" capacitor because it is independent of the ON resistance $R_{ON}$ of the DTC. In contrast to the MIM capacitors of the DTC sub-circuits (e.g., the 1×LSB MIM capacitor of the unit cell block), the fixed MIM capacitor $C_{ADD}$ is not switched by a switching FET. Rather, $C_{ADD}$ is constantly applied between the terminals of the DTC). $C_{ADD}$ increases the total effective Q-factor value of the combined circuit comprising the unmodified (or "original") DTC coupled to the fixed MIM capacitor $C_{ADD}$. Consequently, the Q-factor value of the DTC advantageously can be reduced because $C_{ADD}$ helps to keep the total Q-factor of the combined circuit at the value required by the system specifications. The DTC therefore is re-designed to have a lowered Q-factor value. To compensate for the other effects that the additional fixed capacitance of $C_{ADD}$ has on the combined DTC-$C_{ADD}$ circuit, the DTC is also re-designed to have a lower maximum total capacitance (Cmax) and higher tuning ratio (TR). In one embodiment, the parasitic capacitance within the DTC should be lumped together with the capacitance of $C_{ADD}$.

Figure 15A:
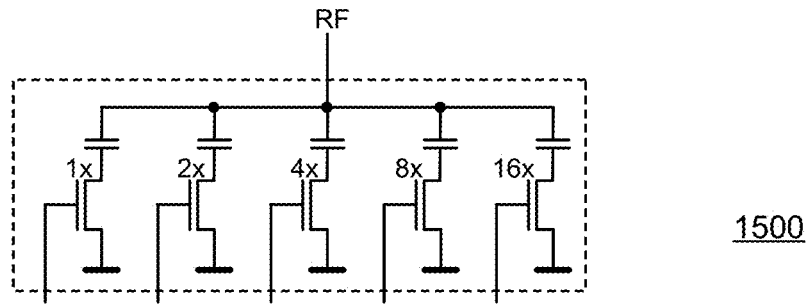
FIG. 15A is a simplified schematic of an unmodified DTC made in accordance with the present teachings, and wherein FIG. 15A also includes DTC parameter values.
Figure 15B:
FIG. 15B is a simplified schematic of a modified DTC made in accordance with the present teachings, wherein the modified DTC is implemented by coupling a fixed capacitor in parallel with the unmodified DTC of FIG. 15A.
Figure 15B:
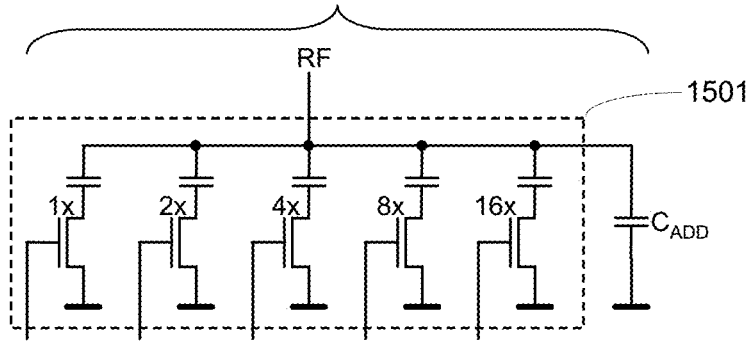

As shown in FIG. 15A, the unmodified DTC has a minimum total capacitance (Cmin) of 1.65 pF; a maximum total capacitance (Cmax) of 7.75 pF; thereby producing a Tuning Ratio (or Tuning Range, TR) of 4.70:1 [as TR=(Cmax/Cmin):1, by definition]; and a minimum Q-factor value Qmin of 80. FIG. 15B shows how the DTC 1500 of FIG. 15A is modified with $C_{ADD}$ to produce the modified DTC 1500'. FIG. 15B also shows idealized equations (described in more detail below) that are used to re-design (i.e., modify) the DTC 1500 to produce a modified DTC 1501 having a reduced Q-factor value, a lower maximum total capacitance (Cmax) and a higher tuning ratio (TR). FIG. 15B also shows the idealized equation for determining the value of $C_{ADD}$.

As shown in FIG. 15B, in one embodiment, the modified DTC 1500' is designed in accordance with the following equations:

$$C_{ADD} = \frac{C_{max}^2 - C_{min}C_{max}TR}{C_{min} + (C_{max} - 2C_{min})TR};$$ Equation 8

$$C_{min,2} = \frac{C_{max}}{TR} - C_{ADD}; \quad \text{Equation 9}$$

$$C_{max,2} = C_{max} - C_{ADD}; \quad \text{Equation 10}$$

$$Q_{min,2} = \frac{C_{max} - C_{ADD}}{C_{max}} Q_{min}; \quad \text{Equation 11}$$

wherein $C_{ADD}$ comprises the capacitance of the fixed capacitor coupled in parallel to the modified DTC 1501; $C_{min}$ comprises the minimum total capacitance of the unmodified DTC (i.e., the DTC 1500 of FIG. 15A); $C_{max}$ comprises the maximum total capacitance of the unmodified DTC 1500; $Q_{min}$ comprises the minimum allowable Q-factor value of the unmodified DTC 1500, TR comprises the total Tuning Ratio (or Tuning Range) of the re-designed and modified DTC 1500' (i.e., the total Tuning Range of the combined DTC-$C_{ADD}$ circuit 1500'); $C_{min,2}$ comprises the minimum total capacitance of the modified DTC 1501; $C_{max,2}$ comprises the maximum total capacitance of the modified DTC 1501; and wherein $Q_{min,2}$ comprises the minimum allowable Q-factor value of the modified DTC 1501. Note that the minimum allowable Q-factor $Q_{MIN\text{-}total}$ of the entire modified DTC 1500' (i.e., the $Q_{MIN}$ of the combined DTC-$C_{ADD}$ circuit 1500') is determined in accordance with Equation 12 set forth below:

$$Q_{MIN\text{-}total} = Q_{min,2}/((C_{max} - C_{ADD})C_{max}). \quad \text{Equation 12:}$$

Using the idealized equations (Equations 8-11) set forth above, the DTC circuit designer can readily design the modified DTC 1501 to have a lower Q-factor value (i.e., a lowered minimum Q-factor value $Q_{min,2}$ of the modified DTC 1501 is computed in accordance with Equation 11), and a lower maximum total capacitance (Cmax) (i.e., a lower maximum total capacitance $C_{max,2}$ of the modified DTC 1501 is computed in accordance with Equation 10). Equation 8 is used to calculate the capacitance value of $C_{ADD}$. The minimum total capacitance of the modified DTC 1501 $C_{min,2}$ is computed in accordance with Equation 9. The tuning ratio of the modified DTC circuit alone 1501 (i.e., the tuning ratio of the DTC uncoupled from the $C_{ADD}$) is increased as compared to the tuning ratio of the unmodified DTC 1500. However, the tuning ratio TR of the combined DTC-$C_{ADD}$ circuit 1500' can be forced to be a lower tuning ratio (as compared with the TR of the unmodified DTC 1500). For example, as shown in FIGS. 15A and 15B, the TR of the DTC is lowered from 4.70:1 to 3:1. The value of TR for the combined DTC-$C_{ADD}$ circuit 1500' is forced to 3:1 in this example.

As shown in FIGS. 15A and 15B, an exemplary unmodified DTC 1500 has the following parameters: Cmin=1.65 pF; Cmax=7.75 pF, the tuning ratio is therefore equal to 4.70:1; and the DTC 500 has a minimum allowable Q-factor value of 80. Based on these DTC parameters, and using the above described Equations 8-11, the $C_{ADD}$, $C_{min,2}$, $C_{max,2}$, and $Q_{min,2}$ parameters of the modified DTC 1501 are computed. The TR of the DTC 1500' is forced to be 3:1 in this example. The resulting exemplary calculations are set forth in the equations below:

$$C_{ADD} = \frac{C_{max}^2 - C_{min}C_{max}TR}{C_{min} + (C_{max} - 2C_{min})TR} = \quad \text{Equation 8'}$$

$$\frac{7.75^2 - 1.65 \cdot 7.75 \cdot 3}{1.65 + (7.75 - 2 \cdot 1.65) \cdot 3} = 1.45 \text{ pF};$$

$$C_{min,2} = \frac{C_{max}}{TR} - C_{ADD} = \frac{7.75}{3} - 1.45 = 1.13 \text{ pF}; \quad \text{Equation 9'}$$

$$C_{max,2} = C_{max} - C_{ADD} = 7.75 - 1.45 = 6.3 \text{ pF}; \quad \text{Equation 10'}$$

$$Q_{min,2} = \frac{C_{max} - C_{ADD}}{C_{max}} Q_{min} = \frac{7.75 - 1.45}{7.75} \cdot 80 = 65.0. \quad \text{Equation 11'}$$

$$Q_{MIN\text{-}total} = Q_{min,2}/((C_{max} - C_{ADD})/C_{max}) = \quad \text{Equation 12'}$$
$$65.0/((7.75 - 1.45)/7.75 = 80.0.$$

Therefore, in cases wherein the resulting DTC tuning ratio (based upon the minimum allowable Q-factor value imposed by system specifications) is higher than that required by the specifications, a modified DTC 1501 can be designed using a fixed MIM capacitor ($C_{ADD}$) coupled in parallel to the DTC 1501. The entire modified DTC 1500' (i.e., combined DTC 1501 and $C_{ADD}$ capacitor circuit) meets the necessary system specifications but advantageously occupies less IC die area. In the example given above and shown in FIGS. 15A and 15B, $C_{ADD}$=1.45 pF; Cmin,2=1.13 pF; Cmax,2=6.3 pF; and Qmin,2=65.0. The die area required to implement the DTC is reduced from 0.82 mm² to 0.55 mm² (or by approximately 33%). This aspect of the present teachings allows the DTC to be tailored to efficiently meet the design specifications and requirements imposed by system standards. By taking advantage of the design tradeoffs and considerations described above, precious die area savings can be achieved yet still allow the present DTC to meet the requirements imposed by system specifications and standards.

While the FETs described above with reference to the present DTC method and apparatus may comprise any convenient MOSFET device, in some embodiments they are implemented in accordance with improved process and integrated circuit design advancements developed by the assignee of the present application. One such advancement comprises the so-called 'HaRP™' technology enhancements developed by the assignee of the present application. The HaRP enhancements provide for new RF architectures and improved linearity in RF front end solutions. FETs made in accordance with the HaRP enhancements are described in pending applications owned by the assignee of the present application. For example, FETs made in accordance with the HaRP enhancements are described in pending U.S. patent Ser. No. 11/484,370, filed Jul. 10, 2006, entitled "Method and Apparatus for use in Improving Linearity of MOSFETs Using an Accumulated Charge Sink"; and in pending U.S. patent Ser. No. 11/520,912, filed Sep. 14, 2006, and entitled "Method and Apparatus Improving Gate Oxide Reliability by Controlling Accumulated Charge". Both of the above-cited pending patent applications (i.e., application Ser. No. 11/484,370, filed Jul. 10, 2006 and application Ser. No. 11/520,912, filed Sep. 14, 2006, are incorporated herein by reference as if set forth in full. As noted above, in some embodiments, the FETs described above with reference to the present DTC method and apparatus are implemented in accordance to the teachings of these incorporated pending applications (application Ser. Nos. 11/484,370 and 11/520,912).

More specifically, and as described in pending application Ser. No. 11/484,370, FETs made in accordance with HaRP technology enhancements comprise Accumulated Charge Control (ACC) SOI MOSFETs, wherein each ACC SOI MOSFET includes an Accumulated Charge Sink (ACS) coupled thereto which is used to remove accumulated charge from the ACC FET body when the FET operates in an accumulated charge regime. The ACS facilitates removal or otherwise controls the accumulated charge only when the ACC SOI MOSFET operates in the accumulated charge regime. Thus, the HaRP technology enhancements provide a method and apparatus for use in improving linearity characteristics of MOSFET devices using the accumulated charge sink (ACS). Via the ACS terminal, the HaRP FETs are adapted to remove, reduce, or otherwise control accumulated charge in SOI MOSFETs, thereby yielding improvements in FET performance characteristics. In one exemplary embodiment, a circuit having at least one SOI MOSFET is configured to operate in an accumulated charge regime. The ACS is operatively coupled to the body of the SOI MOSFET, and eliminates, removes or otherwise controls accumulated charge when the FET is operated in the accumulated charge regime, thereby reducing the nonlinearity of the parasitic off-state source-to-drain capacitance of the SOI MOSFET. In RF switch circuits implemented with the improved SOI MOSFET devices, harmonic and intermodulation distortion is reduced by removing or otherwise controlling the accumulated charge when the SOI MOSFET operates in an accumulated charge regime.

Figure 15C:
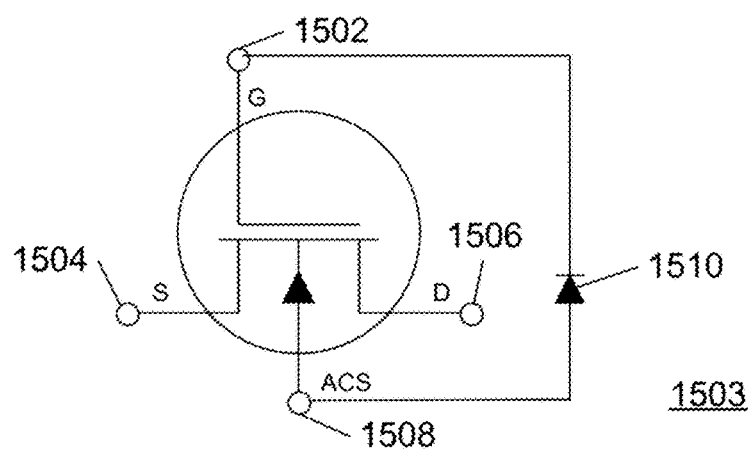
FIG. 15C shows a simplified schematic of a four terminal ACC MOSFET made in accordance with "HaRP" design techniques, wherein the ACC MOSFET is used to implement FETs comprising the FET stack in some embodiments of the DTC.

As described in the co-pending and above-incorporated application Ser. No. 11/484,370 patent application, in some embodiments the ACC MOSFET comprises as a four terminal device, wherein an accumulated charge sink (ACS) terminal is coupled to a gate terminal via a diode. One such four terminal ACC MOSFET 1503 is shown in FIG. 15C. FIG. 15C is a simplified schematic of an improved SOI NMOSFET 1503 adapted to control accumulated charge, embodied as a four terminal device, wherein the ACC MOSFET 1503 includes a gate terminal 1502, source terminal 1504, drain terminal 1506 and accumulated charge sink (ACS) terminal 1508. As shown in the embodiment of FIG. 15C, the ACS terminal 1508 is coupled to the gate terminal 1502 via a diode 1510. This embodiment may be used to prevent a positive current flow into the body of the MOSFET 1503 caused by a positive Vg-to-Vs (or, equivalently, Vgs, where Vgs=Vg-Vs) bias voltage, as may occur, for example, when the ACC MOSFET 1503 is biased into an on-state condition. When biased off, the ACS terminal voltage $V_{ACS}$ comprises the gate voltage plus a voltage drop across the diode 1510. At very low ACS terminal current levels, the voltage drop across the diode 1510 typically also is very low (e.g., <<500 mV, for example, for a typical threshold diode). The voltage drop across the diode 1510 may be reduced to approximately zero by using other diodes, such as a 0 Vf diode, for example. In one embodiment, reducing the voltage drop across the diode is achieved by increasing the diode 1510 width. Additionally, maintaining the ACS-to-source or ACS-to-drain voltage (whichever bias voltage of the two bias voltages is lower) increasingly negative, also improves the linearity of the ACC MOSFET device 1503.

In some embodiments, as described above with reference to FIGS. 6A-6B, when the FETs are turned ON, a typical value of +2.75V voltage is supplied to their gate terminals. The FETs are turned OFF by applying a typically negative voltage of −3.4V. Supplying a larger level of negative voltage improves the linearity and harmonics performance characteristics of the FETs. Typically the negative voltage applied to the FETs ranges between −1 and −3.6V. In one exemplary embodiment of the present DTC teachings, a negative voltage of −3.4V is applied.

For this reason in other embodiments of the present DTC teachings, as noted above with regard to FIGS. 6A and 6B, a negative voltage generator is included in an integrated circuit implementation of the DTC. The negative voltage generator is typically implemented as a charge pump. The charge pump provides, in one exemplary embodiment, the −3.4V voltage from the +2.75V supply voltage. In addition to the negative voltage generator, level shifters can be used to convert external control signals (e.g., between 0 and +2.75V) to −3.4V/+2.75v. The external control signals can be used to bias the FETs. In addition to the negative voltage generator and the level shifters, this embodiment can also include other blocks that provide additional support circuitry for the DTC. For example, these other blocks may include serial bus, control algorithms, impedance mismatch detection circuitry, among other functions.

The DTCs described above, and specifically the various significant bit sub-circuits (such as, for example, the LSB sub-circuit 602 of FIG. 6B which comprises the unit cell design block) are described above as comprising at least a plurality of stacked FETs coupled in series with capacitors (in most of the embodiments described above, the capacitors comprise MIM capacitors). While many applications may require or encourage implementation of the stacked switches using FETs, the present DTC teachings also contemplate use of other switching devices to implement the switching devices in series with the capacitors. For example, in some embodiments, the switching devices comprise laterally diffused metal oxide semiconductor (LDMOS) transistors. In other embodiments Micro-Electro-Mechanical Systems (MEMS) switches are used to implement the switching devices. Further, as noted above, although most of the DTCs described above implement the capacitors of the unit cell design blocks with MIM capacitors, the present DTC is not so limited. In other embodiments, the capacitors are implemented using other types of capacitance devices.

CONCLUSION

Availability of specification compliant tunable components will have a significant impact on RF architectures for multi-band multi-mode cellular phones. The present DTC methods and apparatus can be used in many different environments and applications, including, but not limited to adaptive impedance matching, antenna band and impedance tuning, Power Amplifier (PA) output match tuning, RF filter and duplexer tuning, tunable and reconfigurable filters, antennas and PAs. The specification have difficult and difficult to meet requirements—high power handling (+35 dBm), high linearity (IMD3 −105 dBm), low-loss (Q>50-100), high reliability, 3:1-8:1 tuning range, fast switching speed (5 uS), inexpensive, mass-producible. The general requirements for tunable components are very similar to the requirements for handset antenna switches, which makes UltraCMOS implemented DTCs an excellent candidate technology to implement the DTCs described above. This particular implementation relies heavily on the unique capability of stacking transistors for high power handling and linearity and being able to integrate high-Q capacitors. The UltraCMOS approach appears to be the only monolithically integrated single-die solid-state tunable capacitor in existence that meets all the specifications, with all the same benefits than UltraCMOS handset antenna switches. The DTCs described above advantageously can be produced in mass, at low-cost with high-reliability on a fully integrated device that is an alternative to MEMS and BST implementations. Proven high volume UltraCMOS switch technology can be used to implement the DTCs. This process technology allows for monolithic integration of serial or parallel bus, digital mismatch sensors, control algorithms that can also be used to support the present DTCs in some fully integrated solution embodiments. Advantageously, the DTC can be usable in impedance tuner applications, in antenna tuning, PA output match tuning, and many other useful applications.

A number of embodiments of the present invention have been described. Nevertheless, it will be understood that various modifications may be made without departing from the spirit and scope of the claimed invention.

Accordingly, it is to be understood that the invention is not to be limited by the specific illustrated embodiment, but only by the scope of the appended claims.

What is claimed is:

1. An integrated circuit device comprising:
a first node;
a second node; and
a series arrangement of one or more capacitors and three or more switches coupled between the first node and the second node;
wherein:
the three or more switches are configured to withstand a voltage greater than a voltage withstood by one switch,
the three or more switches are configured to receive a signal to enable or disable the switches and thereby adjusting the capacitance between the two nodes; and
the three or more switches are FET switches comprise SOI MOSFET switches.

2. The integrated circuit device of claim 1, wherein a capacitor of the one or more capacitors connects a top switch of the three or more switches to the first node, the top switch being the closest switch to the first node and the farthest switch from the second node.

3. The integrated circuit device of claim 2, wherein the one or more capacitors comprise MIM capacitors.

4. The integrated circuit device of claim 2, wherein the second node is coupled to ground.

5. The integrated circuit device of claim 2, wherein the one or more capacitors comprise Metal-Metal (MM) capacitors.

6. The integrated circuit device of claim 1, wherein at least one of the one or more capacitors comprises a parallel arrangement of capacitors.

7. The integrated circuit device of claim 6, wherein the capacitors of the parallel arrangement of capacitors comprise MIM capacitors.

8. The integrated circuit device of claim 6, wherein the capacitors of the parallel arrangement of capacitors comprise Metal-Metal (MM) capacitors.

9. The integrated circuit device of claim 1, wherein the one or more capacitors are integrated on an integrated circuit die wherein the integrated circuit device is implemented.

10. The integrated circuit device of claim 9, wherein the one or more capacitors are MIM capacitors.

11. The integrated circuit device of claim 9, wherein the one or more capacitors comprise Metal-Metal (MM) capacitors.

12. An integrated circuit device comprising:
a first node;
a second node; and
a series arrangement of one or more, capacitors and three or more switches coupled between the first node and the second node;
wherein:
the three or more switches are configured to withstand a voltage greater than a voltage withstood by one switch,
the three or more switches are configured to receive a signal to enable or disable the switches and thereby adjusting the capacitance between the two nodes; and
wherein the three or more switches comprise MEMS switches.

13. The integrated circuit device of claim 1, wherein the FET switches of the three or more FET switches have a ON resistance, the ON resistance being at least an order of magnitude smaller than a reactance of the capacitors of the one or more capacitors.

14. The integrated circuit device of claim 1, wherein a width of the FET switches is approximately proportional to a size of the capacitors.

15. A Digitally Tuned Capacitor (DTC) comprising a plurality of the integrated circuit devices of claim 1, wherein the plurality of the integrated circuit devices are configured in parallel.

16. The DTC of claim 15, wherein each of the one or more capacitors comprises a MIM capacitor.

17. The DTC of claim 16, wherein a ratio r=Con/Coff for an integrated circuit device is defined as a ratio of an ON capacitance value Con corresponding to an ON state to an OFF capacitance value Coff corresponding to an OFF state of the integrated circuit device, and wherein the plurality of the integrated circuit devices are configured to maintain a constant ratio across the plurality of the integrated circuit devices.

18. The DTC of claim 17, wherein the plurality of the integrated circuit devices are configured to achieve the constant ratio by selecting sizes of the switches relative to sizes of the MIM capacitors.

19. The DTC of claim 15, wherein the one or more capacitors comprise Metal-Metal (MM) capacitors.

20. The DTC of claim 15, wherein each of the plurality of the integrated circuit devices has a quality factor (Q), and wherein the plurality of the integrated circuit devices are configured to maintain a constant quality factor across the plurality of the integrated circuit devices.

21. The DTC of claim 20, wherein the DTC is configured to achieve the constant quality factor by selecting sizes of the switches relative to sizes of the capacitors.

22. The DTC of claim 20, wherein the capacitors comprise MIM capacitors.

23. The DTC of claim 20, wherein the capacitors comprise MM capacitors.

24. The DTC of claim 15, wherein the plurality of the circuit devices are configured to maintain a constant switching time across the plurality of integrated circuit devices.

25. The DTC of claim 15, wherein a switching time of the FET switches is equal to Rg*Cgate wherein Rg comprises a gate resistance of the FET switches and Cgate comprises a gate capacitance of the FET switches, and wherein the switching time is constant across all the FET switches of the DTC.

26. The DTC of claim 15, wherein the plurality of the integrated circuit devices comprises equal or different capacitance values.

27. The DTC of claim 26, wherein the plurality of the integrated circuit devices comprises switches of equal or different sizes.

28. The DTC of claim 27, wherein capacitance values and sizes of switches of the plurality of the integrated circuit devices are scaled to achieve a desired DTC function.

29. The DTC of claim 15, wherein proceeding from a lower significant bit (LSB) integrated circuit device to a most significant bit (MSB) integrated circuit device, capacitance values of the plurality of integrated circuit devices follow a binary coding scheme.

30. The DTC of claim 29, wherein proceeding from the LSB integrated circuit device to the MSB integrated circuit device, each following integrated circuit device have a capacitance value twice as large as a capacitance value of a corresponding previous integrated circuit device.

31. The DTC of claim 15, wherein the DTC is implemented in accordance with a thermometer coding scheme, wherein the plurality of integrated circuit devices have same capacitance values.

32. The DTC of claim 31, comprising a n-bit digital control word and $2^n-1$ integrated circuit devices, wherein the $2^n-1$ integrated circuit devices are controlled by the digital control word.

33. The DTC of claim 15, wherein the DTC is implemented in accordance with a combination of binary coding scheme and thermometer coding scheme.

34. The DTC of claim 15, wherein the DTC is implemented in accordance with a coding scheme.

35. The DTC of claim 15, wherein the plurality of integrated circuit devices are configured in series, wherein none of the first node and the second node is coupled to a reference potential.

36. The DTC of claim 15, wherein the plurality of integrated circuit devices are configured in shunt, wherein only one of the first node or the second node is coupled to a reference potential.

37. An electronic circuit comprising a plurality of the DTC's of claim 15, the plurality of the DTC's being integrated on a same die.

38. An electronic circuit comprising the DTC of claim 15 and at least one switch, the DTC and the at least one switch being integrated on a same die.

39. An impedance modifying circuit comprising the DTC of claim 15.

40. The impedance modifying circuit of claim 39, wherein the control signals are generated using a feedback circuit identifying and tracking operation of a mobile telephone handset.

41. The impedance modifying circuit of claim 39, wherein impedance matching of a mobile handset with a handset antenna is monitored.

42. A combination of an antenna and the DTC of claim 15, wherein the DTC is configured for adjusting frequency and impedance tuning functions.

43. A combination of a power amplifier and the DTC of claim 15, wherein the DTC is configured for output match tuning of the power amplifier.

44. A tunable matching network comprising the DTC of claim 15, the DTC being configured for impedance match tuning functions.

45. A tunable matching network comprising the DTC of claim 15, wherein the tunable matching network is integrated with a mobile handset circuits, and the DTC is configured for impedance match tuning functions of the mobile handset circuits.

46. A combination of an amplifier and the DTC of claim 15, wherein the DTC is configured to modify the amplifier impedance.

47. A combination of a resonant circuit and the DTC of claim 15, wherein the DTC is configured to adjust frequencies of a resonant circuit.

48. The combination of claim 47, wherein the resonant circuit comprises a tunable or reconfigurable filter.

49. A combination of a first circuital element; a second circuital element, and the DTC of claim 15, wherein an impedance matching of the first circuital element with the second circuital element is monitored and the control signals are adjusted accordingly.

50. The combination of claim 49, wherein the first circuital element is a mobile handset and the second circuital element is the mobile handset antenna.

51. The DTC of claim 15, wherein in at least one of the plurality of the integrated circuit devices, a desired capacitive value is obtained by more than one capacitor.

52. The DTC of claim 15, wherein the DTC has a quality factor value larger than 20.

53. The DTC of claim 15, wherein the DTC has a quality factor value larger than 50.

54. The DTC of claim 15, wherein the DTC has a capacitance step value between adjacent states of the DTC, wherein the capacitance step value is smaller than 0.5 pF.

55. The DTC of claim 15, wherein the DTC has a capacitance step value between adjacent states of the DTC, wherein the capacitance step value is smaller than 0.1 pF.

56. The DTC of claim 15, further comprising at least a fixed capacitor coupled across the first node and the second node.

57. An integrated circuit device comprising:
a first node;
a second node; and
a series arrangement of one or more capacitors and three or more switches coupled between the first node and the second node;
wherein:
the three or more switches are configured to withstand a voltage greater than a voltage withstood by one switch,
the three or more switches are configured to receive a signal to enable or disable the switches and thereby adjusting the capacitance between the two nodes; and
the three or more switches comprise FET switches coupled to a control voltage via corresponding gate resistors.

58. A DTC comprising a plurality of the integrated circuit devices of claim 57, wherein the plurality of the integrated circuit devices are configured in parallel.

59. The DTC of claim 58, wherein the plurality of the integrated circuit devices comprises gate resistors of equal or different resistances.

60. An integrated circuit device comprising:
a first node;
a second node; and
a series arrangement of one or more capacitors and three or more switches coupled between the first node and the second node;
wherein:
the three or more switches are configured to withstand a voltage greater than a voltage withstood by one switch,
the three or more switches are configured to receive a signal to enable or disable the switches and thereby adjusting the capacitance between the two nodes;
the three or more switches comprise FET switches; and
a drain-source resistor is coupled across a drain and a source of at least one of the FET switches.

61. A DTC comprising a plurality of the integrated circuit devices of claim 60, wherein the plurality of the integrated circuit devices are configured in parallel.

62. The DTC of claim 61, wherein the plurality of the integrated circuit devices comprises drain-source resistors of equal or different resistances.

63. An integrated circuit device comprising:
a first node;
a second node; and a series arrangement of one or more capacitive elements and two or more switches coupled between the first node and the second node;

wherein:
the two or more switches are configured to withstand a voltage greater than a voltage withstood by one switch,
the two or more switches are configured to receive a signal to enable or disable the switches and thereby adjusting the capacitance between the two nodes, and
the two or more switches are FET switches comprise SOI MOSFET switches.

64. An integrated circuit device comprising:
a first node;
a second node;
a series arrangement of one or more capacitors and two or more switches coupled between the first node and the second node;

wherein:
the two or more switches are configured to withstand a voltage greater than a voltage withstood by one switch;
each of the two or more switches has a control node connected to a control signal via a resistive element,
the control signal is configured to enable or disable the two or more switches and thereby adjusting the capacitance between the first node and the second node, and
the two or more switches are FET switches comprising SOI MOSFET switches.

65. The integrated circuit device of claim 64, wherein at least one of the one or more capacitors comprises a parallel arrangement of capacitors.

66. The integrated circuit device of claim 65, wherein the capacitors of the parallel arrangement of capacitors comprise MIM capacitors.

67. The integrated circuit device of claim 65, wherein the capacitors of the parallel arrangement of capacitors comprise Metal-Metal (MM) capacitors.

68. The integrated circuit device of claim 64, wherein a capacitor of the one or more capacitors connects a top switch of the two or more switches to the first node, the top switch of the two or more switches being the closest switch to the first node and the farthest switch from the second node.

69. The integrated circuit device of claim 68, wherein the one or more capacitors comprise MIM capacitors.

70. The integrated circuit device of claim 68, wherein the second node is coupled to ground.

71. The integrated circuit device of claim 68, wherein the one or more capacitors comprise Metal-Metal (MM) capacitors.

72. The integrated circuit of claim 68, wherein a width of the FET switches is approximately proportional to a size of capacitors.

73. The integrated circuit device of claim 64, wherein the one or more capacitors are integrated on an integrated circuit die wherein the integrated circuit device is implemented.

74. The integrated circuit device of claim 73, wherein the one or more capacitors are MIM capacitors.

75. The integrated circuit device of claim 73, wherein the one or more capacitors comprise Metal-Metal (MM) capacitors.

76. An integrated circuit device comprising:
a first node;
a second node;
a series arrangement of one or more capacitors and two or more switches coupled between the first node and the second node;

wherein:
the two or more switches are configured to withstand a voltage greater than a voltage withstood by one switch;
each of the two or more switches has a control node connected to a control signal via a resistive element,
the control signal is configured to enable or disable the two or more switches and thereby adjusting the capacitance between the first node and the second node, and
wherein the two or more switches comprise MEMS switches.

77. The integrated circuit device of claim 64, wherein the FET switches of the two or more FET switches have an ON resistance, the ON resistance being at least an order of magnitude smaller than a reactance of the one or more capacitors.

78. The integrated circuit device of claim 64, wherein the FET switches of the two or more FET switches are coupled to a control voltage via corresponding gate resistors.

79. A DTC comprising a plurality of the integrated circuit devices of claim 78, wherein the plurality of the integrated circuit devices are configured in parallel.

80. The DTC of claim 79, wherein the plurality of the integrated circuit devices comprises gate resistors of equal or different resistances.

81. The integrated circuit device of claim 64, wherein a drain-source resistor is coupled across a drain and a source of at least one of the FET switches of the two or more FET switches.

82. A DTC comprising a plurality of the integrated circuit devices of claim 81, wherein the plurality of the integrated circuit devices are configured in parallel.

83. The DTC of claim 82, wherein the plurality of the integrated circuit devices comprise drain-source resistors of equal or different resistances.

84. A Digitally Tuned Capacitor (DTC) comprising a plurality of the integrated circuit devices of claim 64, wherein the plurality of the integrated circuit devices are configured in parallel.

85. The DTC of claim 84, wherein each of the one or more capacitors comprises a MIM capacitor.

86. The DTC of claim 85, wherein a ratio r=Con/Coff for an integrated device is defined as a ratio of an ON capacitance value corresponding to an ON state to an OFF capacitance value Coff corresponding to an OFF state of the integrated circuit device, and wherein the plurality of the integrated circuit devices are configured to maintain a constant ratio across the plurality of the integrated circuit devices.

87. The DTC of claim 86, wherein the plurality of the integrated circuit devices are configured to achieve the constant ratio by selecting sizes of the switches relative to sizes of the MIM capacitors.

88. The DTC of claim 84, wherein the one or more capacitors comprise Metal-Metal (MM) capacitors.

89. The DTC of claim 84, wherein each of the plurality of the integrated circuit devices has a quality factor (Q), and wherein the plurality of the integrated circuit devices are configured to maintain a constant quality factor across the plurality of the integrated circuit devices.

90. The DTC of claim 89, wherein the DTC is configured to achieve the constant quality factor by selecting sizes of the switches relative to sizes of the capacitors.

91. The DTC of claim 89, wherein the one or more capacitors comprise MIM capacitors.

92. The DTC of claim 89, wherein the one or more capacitors comprise MM capacitors.

93. The DTC of claim 84, wherein the plurality of the circuit devices are configured to maintain an equal switching time across the plurality of integrated circuit devices.

94. The DTC of claim 93, wherein the two or more switches of each of the plurality of integrated circuit blocks comprise FET switches.

95. The DTC of claim 94, wherein the a switching time of the FET switches is equal to Rg*Cgate wherein Rg comprises a gate resistance of the FET switches and Cgate comprises a gate capacitance of the FET switches, and wherein the switching time is constant across all the FET switches of the DTC.

96. The DTC of claim 84, wherein the plurality of the integrated circuit devices comprise equal or different capacitance values.

97. The DTC of claim 96, wherein the plurality of the integrated circuit devices comprises switches of equal or different sizes.

98. The DTC of claim 97, wherein capacitance values and sizes of switches of the plurality of the integrated circuit devices are scaled to achieve a desired DTC function.

99. The DTC of claim 84, wherein proceeding from a lower significant bit (LSB) integrated circuit device to a most significant bit (MSB) integrated circuit device, capacitance values of the plurality of integrated circuit devices follow a binary coding scheme.

100. The DTC of claim 99, wherein proceeding from the LSB integrated circuit device to the MSB integrated circuit device, each following integrated circuit device has a capacitance value twice as large as a capacitance value of a corresponding previous integrated circuit device.

101. The DTC of claim 84, wherein the DTC is implemented in accordance with a thermometer coding scheme, wherein the plurality of integrated circuit devices have same capacitance values.

102. The DTC of claim 101, comprising a n-bit digital control word and $2^n-1$ integrated circuit devices, wherein the $2^n-1$ integrated circuit devices are controlled by the digital control word.

103. The DTC of claim 84, wherein the DTC is implemented in accordance with a combination of binary coding scheme and thermometer coding scheme.

104. The DTC of claim 84, wherein the DTC is implemented in accordance with a coding scheme.

105. The DTC of claim 84, wherein the plurality of integrated circuit devices are configured in series, wherein none of the first node and the second node is coupled to a reference potential.

106. The DTC of claim 84, wherein the plurality of integrated circuit devices are configured in a shunt configuration, wherein only one of the first node or the second node is coupled to a reference potential.

107. An electronic circuit comprising a plurality of the DTC's of claim 84, the plurality of the DTC's being integrated on a same die.

108. An electronic circuit comprising the DTC of claim 84 and at least one switch, the DTC and the at least one switch being integrated on a same die.

109. An impedance modifying circuit comprising the DTC of claim 84.

110. The impedance modifying circuit of claim 109, wherein the control signals are generated using a feedback circuit identifying and tracking operation of a mobile telephone handset.

111. The impedance modifying circuit of claim 109, wherein impedance matching of a mobile handset with a handset antenna is monitored.

112. A combination of an antenna and the DTC of claim 84, wherein the DTC is configured for adjusting frequency and impedance tuning functions.

113. A combination of a power amplifier and the DTC of claim 84, wherein the DTC is configured for output match tuning of the power amplifier.

114. A tunable matching network comprising the DTC of claim 84, wherein the DTC is configured for impedance match tuning functions.

115. A tunable matching network comprising the DTC of claim 84, wherein the tunable matching network is integrated with a mobile handset circuits, and the DTC is configured for impedance match tuning functions of the mobile handset circuits.

116. An amplifier and the DTC of claim 84, wherein the DTC is configured to modify the amplifier impedance.

117. A combination of a resonant circuit and the DTC of claim 84, wherein the DTC is configured to adjust frequencies of the resonant circuit.

118. The combination of claim 117, wherein the resonant circuit comprises a tunable or reconfigurable filter.

119. A combination of a mobile handset; the mobile handset antenna, and the DTC of claim 84, wherein an impedance matching of the mobile handset with the mobile handset antenna is monitored and the control signals are adjusted accordingly.

120. The DTC of claim 84, wherein in at least one of the plurality of the integrated circuit devices a desired capacitive value is obtained by more than one capacitor.

121. The DTC of claim 84, wherein the DTC has a quality factor value larger than 20.

122. The DTC of claim 84, wherein the DTC has a quality factor value larger than 50.

123. The DTC of claim 84, wherein the DTC has a capacitance step value between adjacent states of the DTC, wherein the capacitance step value is smaller than 0.5 pF.

124. The DTC of claim 84, wherein the DTC has a capacitance step value between adjacent states of the DTC, wherein the capacitance step value is smaller than 0.1 pF.

125. The DTC of claim 84, further comprising at least a fixed capacitor coupled across the first node and the second node.

* * * * *